(12) United States Patent
Park et al.

(10) Patent No.: US 12,507,506 B2
(45) Date of Patent: Dec. 23, 2025

(54) DISPLAY DEVICE

(71) Applicant: Samsung Display Co., LTD., Yongin-si (KR)

(72) Inventors: Hoo Keun Park, Cheongju-si (KR); Seung Geun Lee, Hwaseong-si (KR); Jin Wan Kim, Hwaseong-si (KR); Young Jin Song, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 679 days.

(21) Appl. No.: 17/881,459

(22) Filed: Aug. 4, 2022

(65) Prior Publication Data

US 2023/0178687 A1    Jun. 8, 2023

(30) Foreign Application Priority Data

Dec. 6, 2021    (KR) .......................... 10-2021-0172637

(51) Int. Cl.
*H10H 20/825*    (2025.01)
*H10H 20/812*    (2025.01)
*H10H 20/816*    (2025.01)
*H10H 20/831*    (2025.01)
*H10H 29/14*    (2025.01)

(52) U.S. Cl.
CPC ........ *H10H 20/825* (2025.01); *H10H 20/812* (2025.01); *H10H 20/8162* (2025.01); *H10H 20/8312* (2025.01); *H10H 29/142* (2025.01)

(58) Field of Classification Search
None
See application file for complete search history.

(56) References Cited

U.S. PATENT DOCUMENTS

| | | | |
|---|---|---|---|
| 2015/0187847 A1* | 7/2015 | Choi | H10K 59/876 257/40 |
| 2020/0161280 A1* | 5/2020 | Heo | H10D 86/40 |
| 2020/0212267 A1* | 7/2020 | Kwak | H10H 20/854 |
| 2021/0074769 A1* | 3/2021 | Park | H10H 20/8516 |

FOREIGN PATENT DOCUMENTS

| | | |
|---|---|---|
| KR | 10-2018-0118488 A | 10/2018 |
| KR | 10-2021-0088724 A | 7/2021 |

* cited by examiner

*Primary Examiner* — Bilkis Jahan
(74) *Attorney, Agent, or Firm* — Womble Bond Dickinson (US) LLP

(57) ABSTRACT

A display device comprises a plurality of pixel electrodes which are provided on a substrate, and a plurality of light emitting elements which are provided on the plurality of pixel electrodes, wherein each of the plurality of light emitting elements comprises a first semiconductor layer, a second semiconductor layer and an active layer provided between the first semiconductor layer and the second semiconductor layer, and one or more of the plurality of light emitting elements comprise a capping layer included in the active layer, and another one of the plurality of light emitting elements does not comprise the capping layer in the active layer, wherein the capping layer comprises AlGaN.

20 Claims, 40 Drawing Sheets

LE: LE1, LE2, LE3
MQW: MQW1, MQW2, MQW3
ALB: ALB1, ALB2

FIG. 14
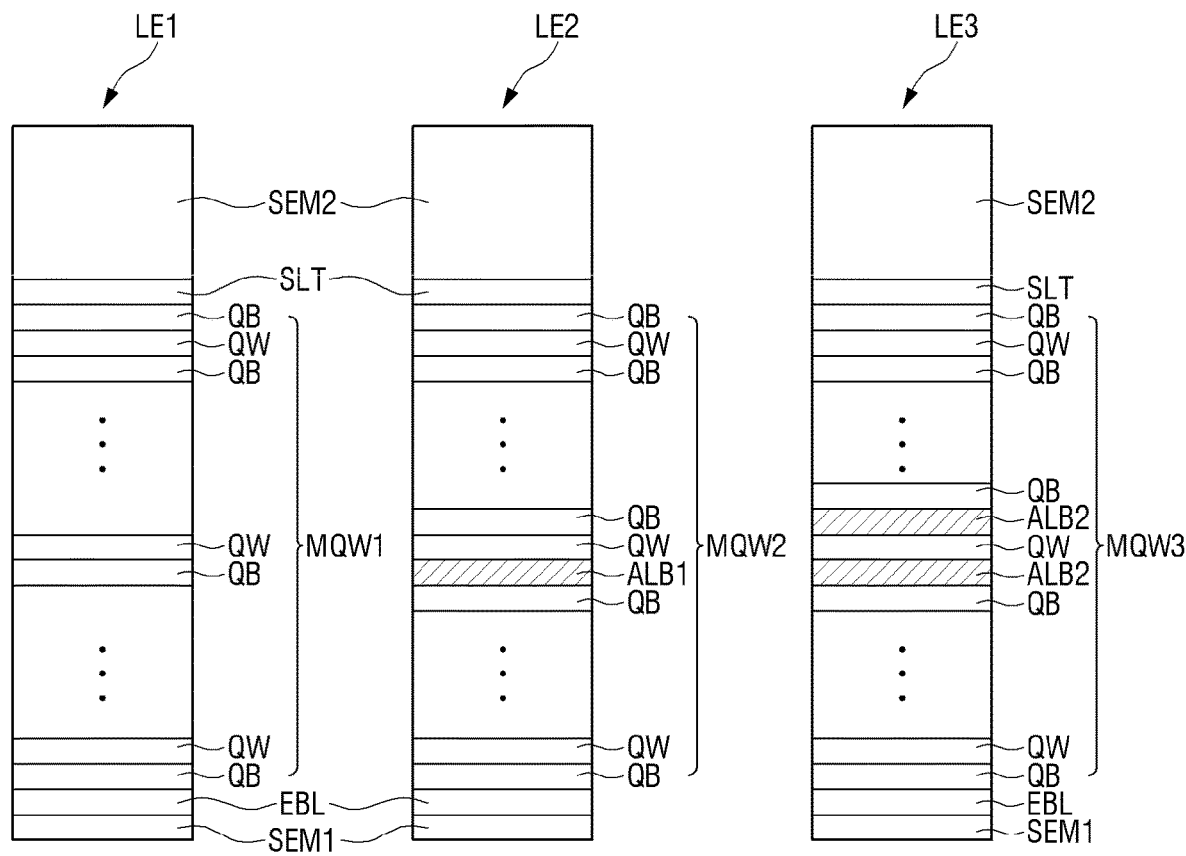
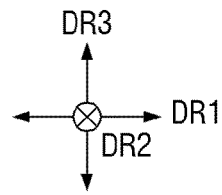
LE: LE1, LE2, LE3
MQW: MQW1, MQW2, MQW3
ALB: ALB1, ALB2

FIG. 15
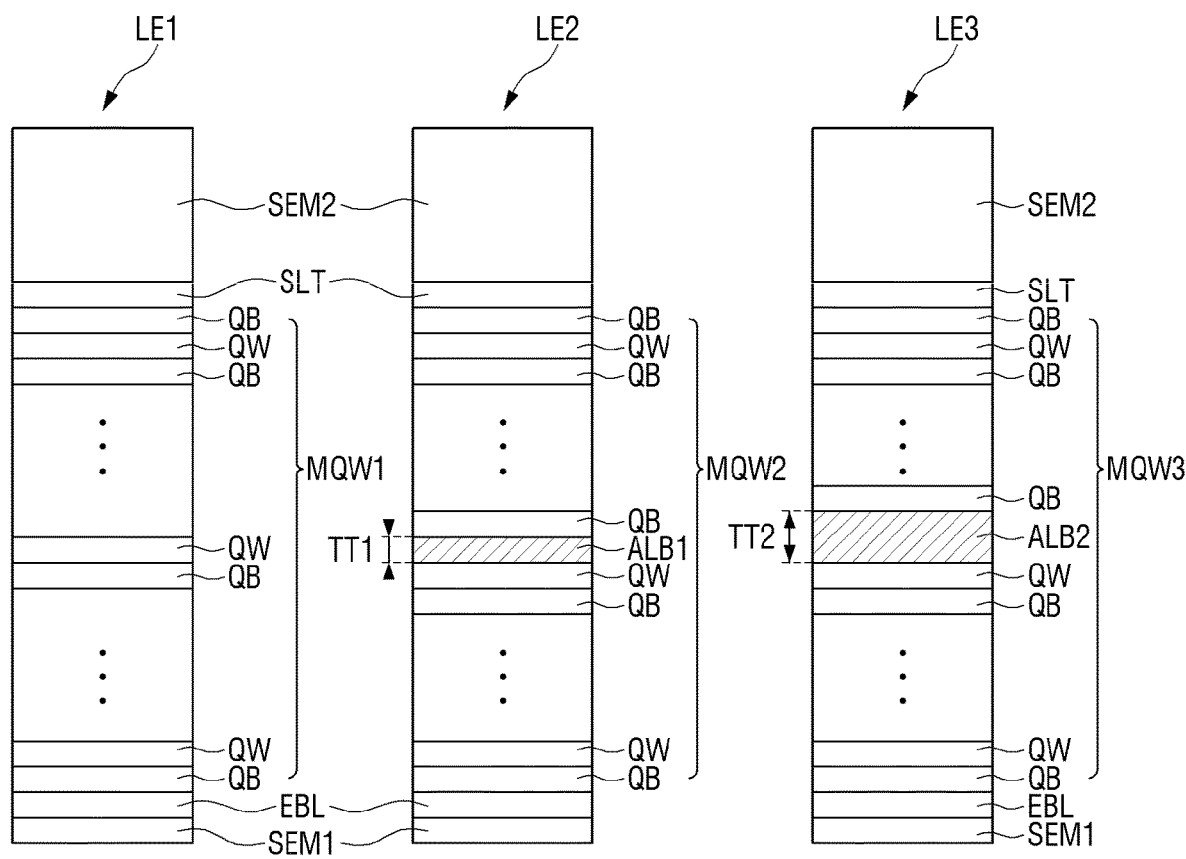
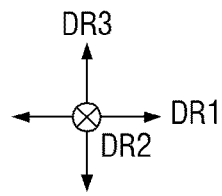

FIG. 16
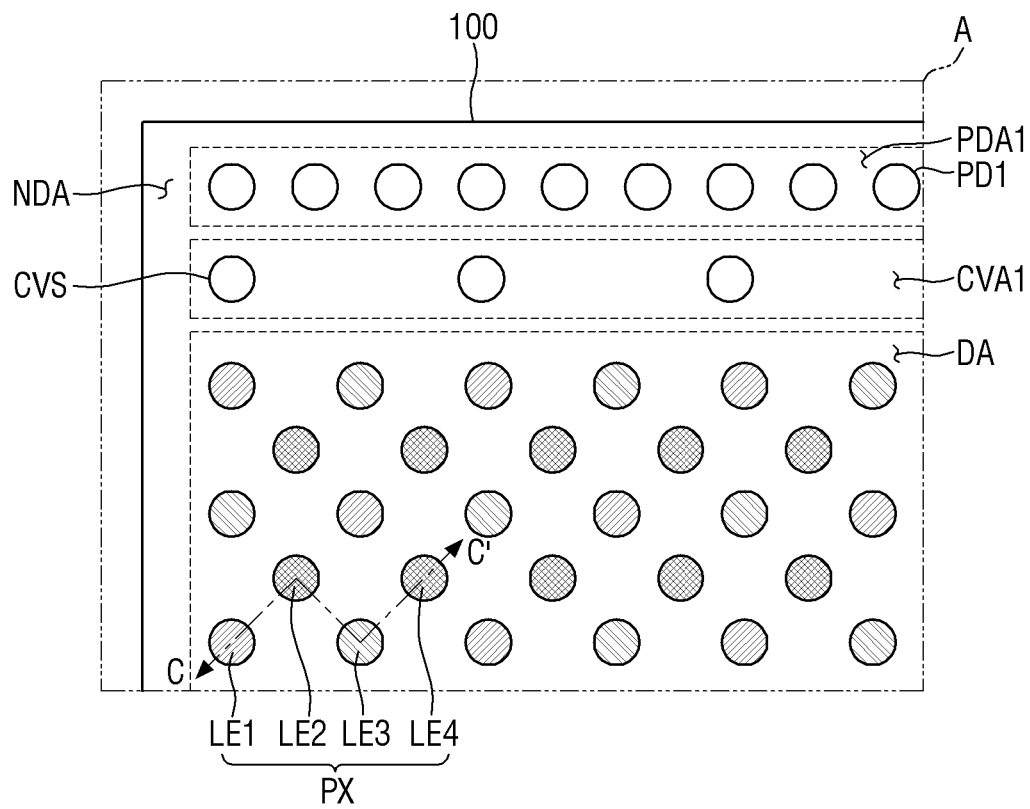
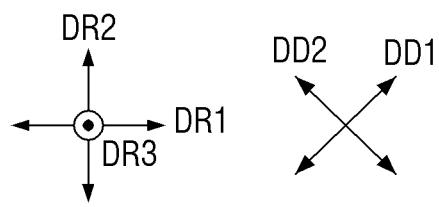

FIG. 17
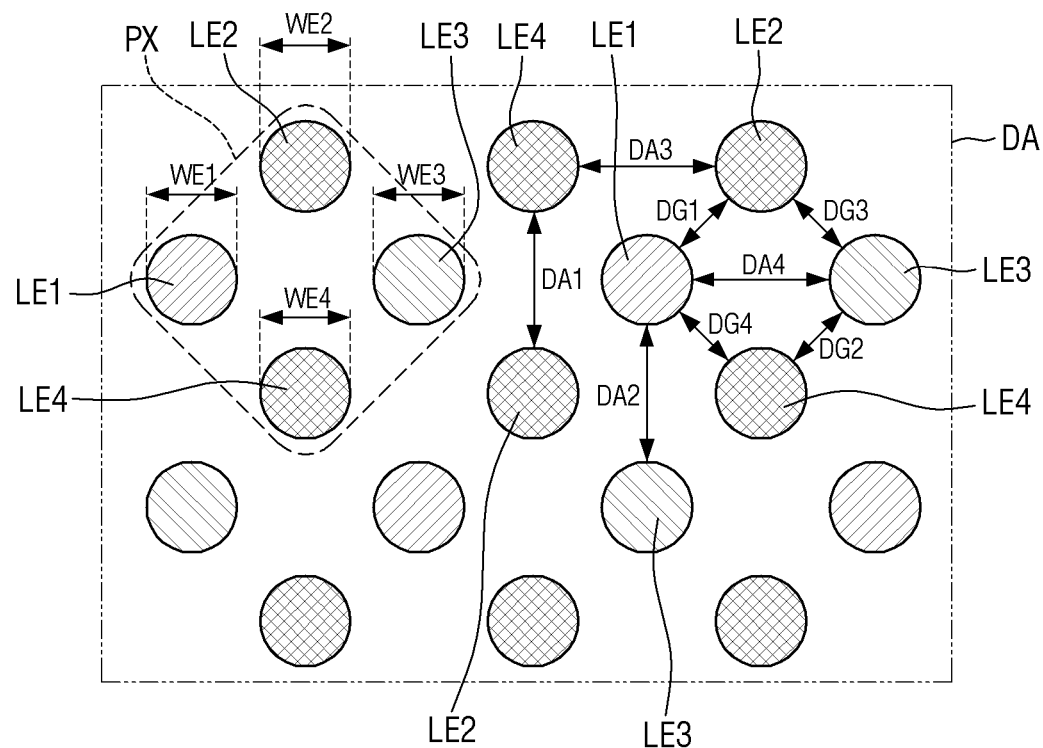
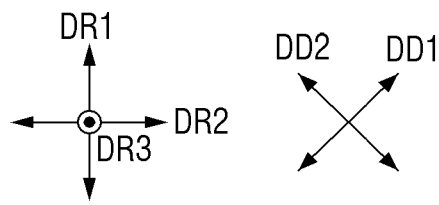

FIG. 18
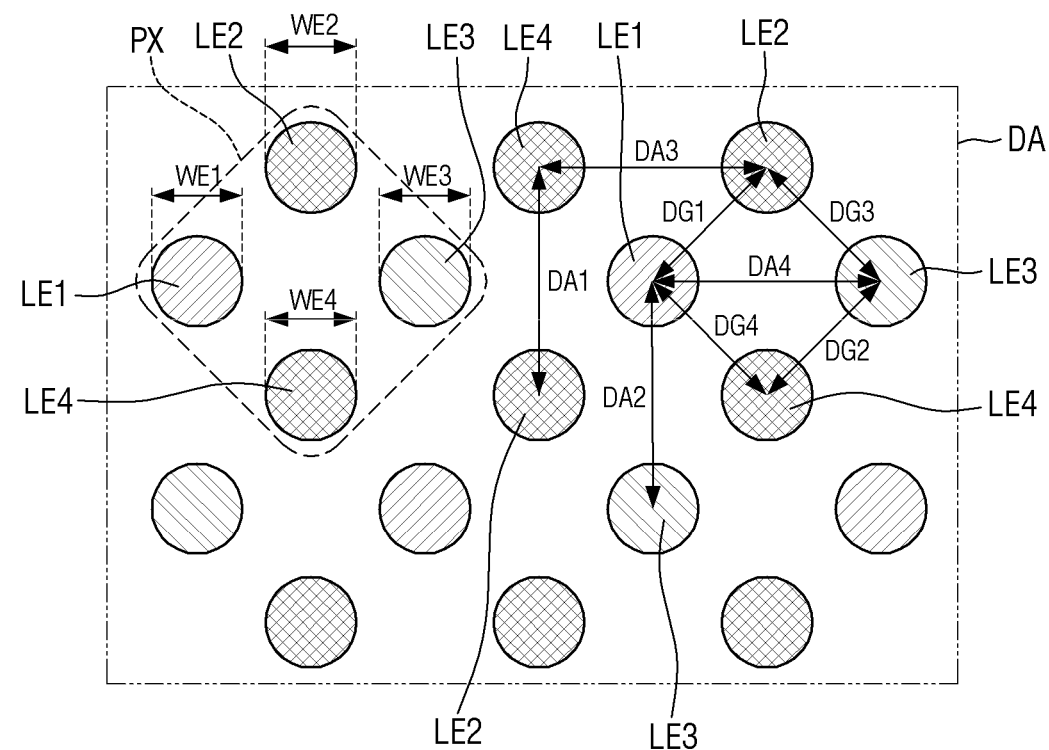
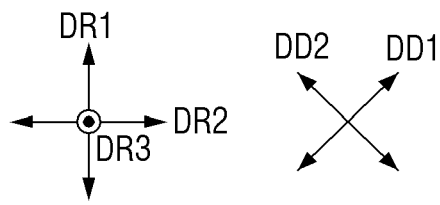

DISPLAY DEVICE

CROSS-REFERENCE TO RELATED APPLICATION

This application claims priority to and the benefit of Korean Patent Application No. 10-2021-0172637 filed on Dec. 6, 2021, in the Korean Intellectual Property Office, the entire content of which is incorporated herein by reference.

BACKGROUND

1. Field

One or more embodiments of the present disclosure relate to a display device.

2. Description of the Related Art

As the information society develops, demands (or desire) for various suitable forms of display devices for displaying images are increasing. The display devices may be flat panel displays such as liquid crystal displays, field emission displays, and/or light emitting displays. The light emitting displays may include an organic light emitting display including an organic light emitting diode element as a light emitting element, an inorganic light emitting display including an inorganic semiconductor element as a light emitting element, and an ultra-small light emitting diode display including an ultra-small light emitting diode element (or a micro-light emitting diode element) as a light emitting element.

Recently, a head-mounted display including a light emitting display has been developed. The head-mounted display is a virtual reality (VR), for example, augmented reality (AR) glasses-type (or glasses-like) monitor device For example worn in the form of glasses or a helmet and forms a focus at a short distance in front of a user's eyes. A high-resolution ultra-small light emitting diode display panel including a micro-light emitting diode element may be applied to the head-mounted display.

SUMMARY

Aspects of embodiments of the present disclosure provide a display device in which operating voltages of light emitting elements are made similar to each other to simplify a driving circuit.

Aspects of embodiments of the present disclosure also provide a display device which can increase the efficiency of each light emitting element and prevent or reduce the deformation of each light emitting element.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the present disclosure, a display device comprises a plurality of pixel electrodes on a substrate, and a plurality of light emitting elements on the plurality of pixel electrodes, wherein each of the plurality of light emitting elements comprises a first semiconductor layer, a second semiconductor layer and an active layer between the first semiconductor layer and the second semiconductor layer, and one or more of the plurality of light emitting elements comprise a capping layer in the active layer, and another one of the plurality of light emitting elements does not comprise the capping layer in the active layer, wherein the capping layer comprises AlGaN.

In one or more embodiments, the active layer comprises a well layer and a barrier layer stacked alternately with each other, and the capping layer is between the well layer and the barrier layer.

In one or more embodiments, the capping layer contacts an upper surface of the well layer and a lower surface of the barrier layer.

In one or more embodiments, the capping layer contacts a lower surface of the well layer and an upper surface of the barrier layer.

In one or more embodiments, the capping layer comprises a plurality of capping layers, and the plurality of capping layers are spaced apart from each other with the well layer between adjacent ones of the plurality of capping layers, and the adjacent ones of the plurality of capping layers each contact the well layer.

In one or more embodiments, the plurality of light emitting elements comprise a first light emitting element not comprising the capping layer and a second light emitting element and a third light emitting element, each comprising the capping layer, and wherein the first light emitting element is configured to emit blue light, the second light emitting element is configured to emit green light, and the third light emitting element is configured to emit red light.

In one or more embodiments, aluminum content of the capping layer included in the second light emitting element is smaller than aluminum content of the capping layer included in the third light emitting element.

In one or more embodiments, a number of the capping layers included in the second light emitting element is smaller than a number of the capping layers included in the third light emitting element.

In one or more embodiments, a thickness of the capping layer included in the second light emitting element is smaller than a thickness of the capping layer included in the third light emitting element.

In one or more embodiments, each of the plurality of light emitting elements further comprises an electron blocking layer between the first semiconductor layer and the active layer, and a superlattice layer between the active layer and the second semiconductor layer.

In one or more embodiments, the second semiconductor layer is a common layer continuously connected to the light emitting elements.

In one or more embodiments, each of the plurality of light emitting elements comprises a connection electrode connected to the first semiconductor layer, and the connection electrode is further connected to each of the plurality of pixel electrodes.

According to one or more embodiments of the disclosure, a display device comprises a plurality of pixel electrodes on a substrate, and a first light emitting element, a second light emitting element, and a third light emitting element on the plurality of pixel electrodes and configured to emit light of different colors, wherein each of the first light emitting element, the second light emitting element, and the third light emitting element comprises a first semiconductor layer, a second semiconductor layer, and an active layer between the first semiconductor layer and the second semiconductor layer, and each of the active layer of the second light emitting element and the active layer of the third light emitting element comprises a capping layer, and wherein the capping layer of the second light emitting element and the capping layer of the third light emitting element have different compositions.

In one or more embodiments, the capping layer comprises AlGaN, and aluminum content of the capping layer of the second light emitting element is smaller than aluminum content of the capping layer of the third light emitting element.

In one or more embodiments, the first light emitting element is configured to emit blue light, the second light emitting element is configured to emit green light, and the third light emitting element is configured to emit red light, and wherein the active layer of the first light emitting element does not comprise the capping layer.

In one or more embodiments, a number of the capping layers included in the second light emitting element is smaller than a number of the capping layers included in the third light emitting element.

According to one or more embodiments of the disclosure, a display device comprises a plurality of pixel electrodes on a substrate, and a first light emitting element, a second light emitting element, and a third light emitting element on the plurality of pixel electrodes and configured to emit light of different colors, wherein each of the first light emitting element, the second light emitting element, and the third light emitting element comprises a first semiconductor layer, a second semiconductor layer, and an active layer between the first semiconductor layer and the second semiconductor layer, and each of the active layer of the second light emitting element and the active layer of the third light emitting element comprises a capping layer, and wherein a thickness of the capping layer of the second light emitting element is different from a thickness of the capping layer of the third light emitting element.

In one or more embodiments, the capping layer comprises a semiconductor material having a chemical formula of $Al_xGa_yIn_{1-x-y}N$ (where $0 \leq x \leq 1$, $0 \leq y \leq 1$, and $0 \leq x+y \leq 1$).

In one or more embodiments, the capping layer comprises AlGaN, and the capping layer of the second light emitting element and the capping layer of the third light emitting element have the same composition.

In one or more embodiments, a number of the capping layers included in the second light emitting element is equal to a number of the capping layers included in the third light emitting element.

BRIEF DESCRIPTION OF THE DRAWINGS

These and/or other aspects will become apparent and more readily appreciated from the following description of the embodiments, taken in conjunction with the accompanying drawings in which:

FIG. 14 schematically illustrates the structure of each light emitting element according to one or more embodiments;

FIG. 15 schematically illustrates the structure of each light emitting element according to one or more embodiments;

FIGS. 16-20 are layout views of an example of area A of FIG. 1;

DETAILED DESCRIPTION

Figure 1:
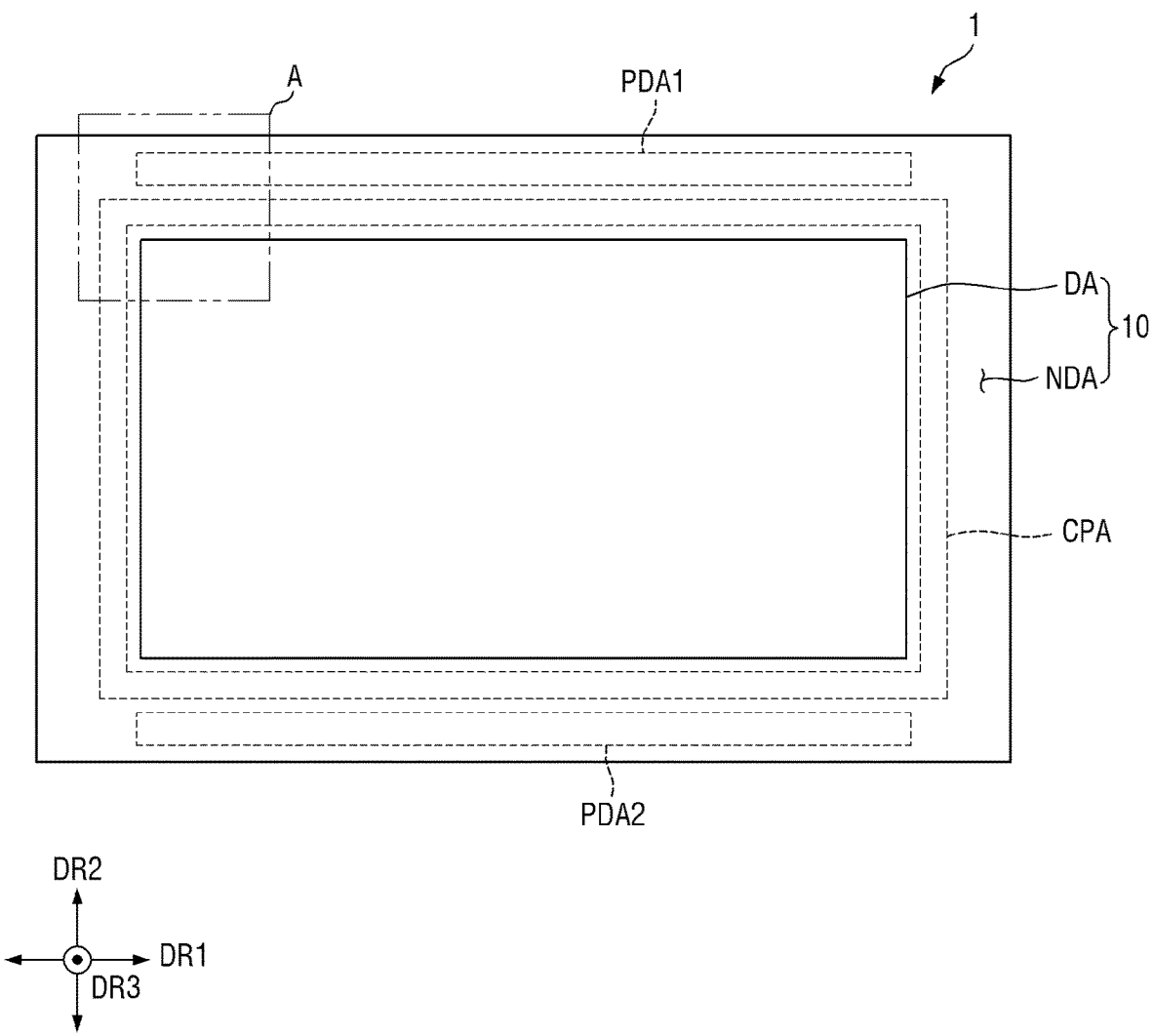
FIG. 1 is a layout view of a display device according to one or more embodiments.

The present disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will filly convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one selected from a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, For example, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the attached drawings.

Figure 2:
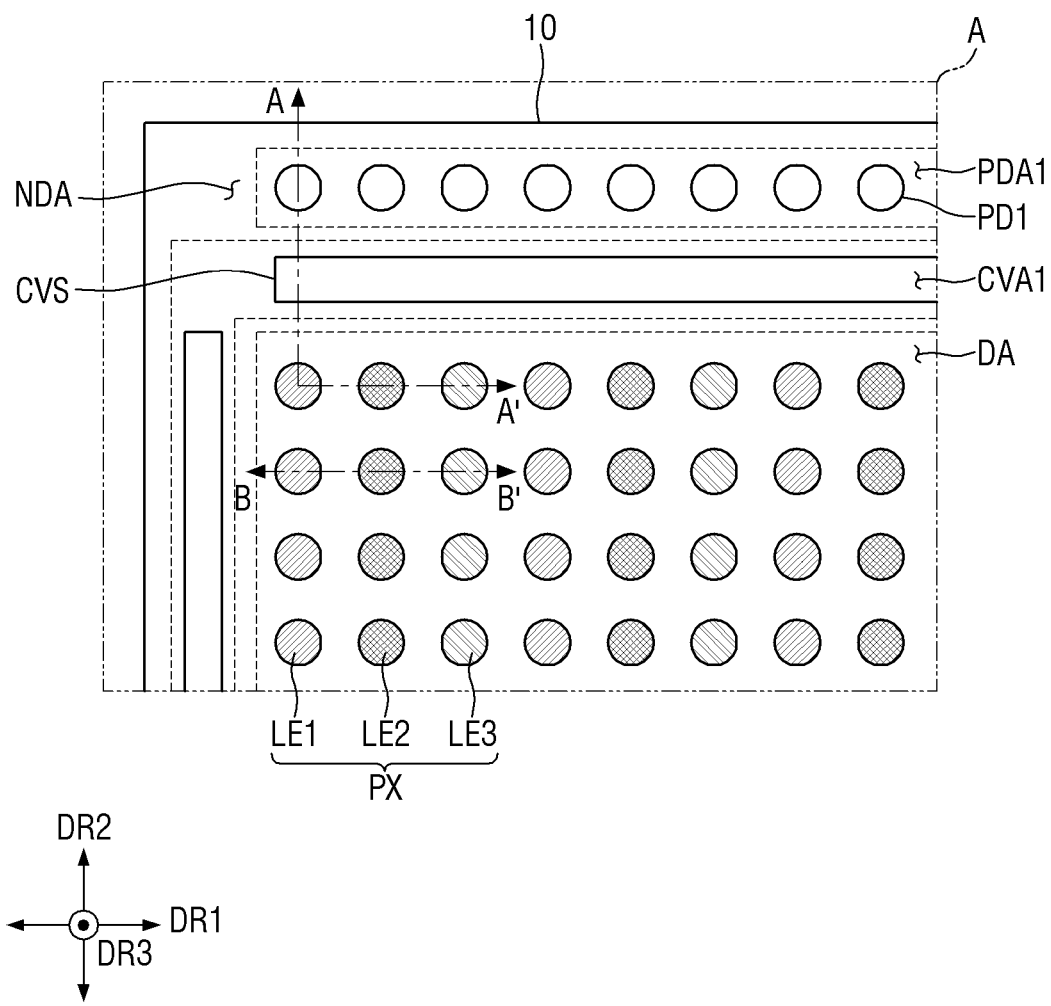
FIG. 2 is a detailed layout view of area A of FIG. 1.
Figure 3:
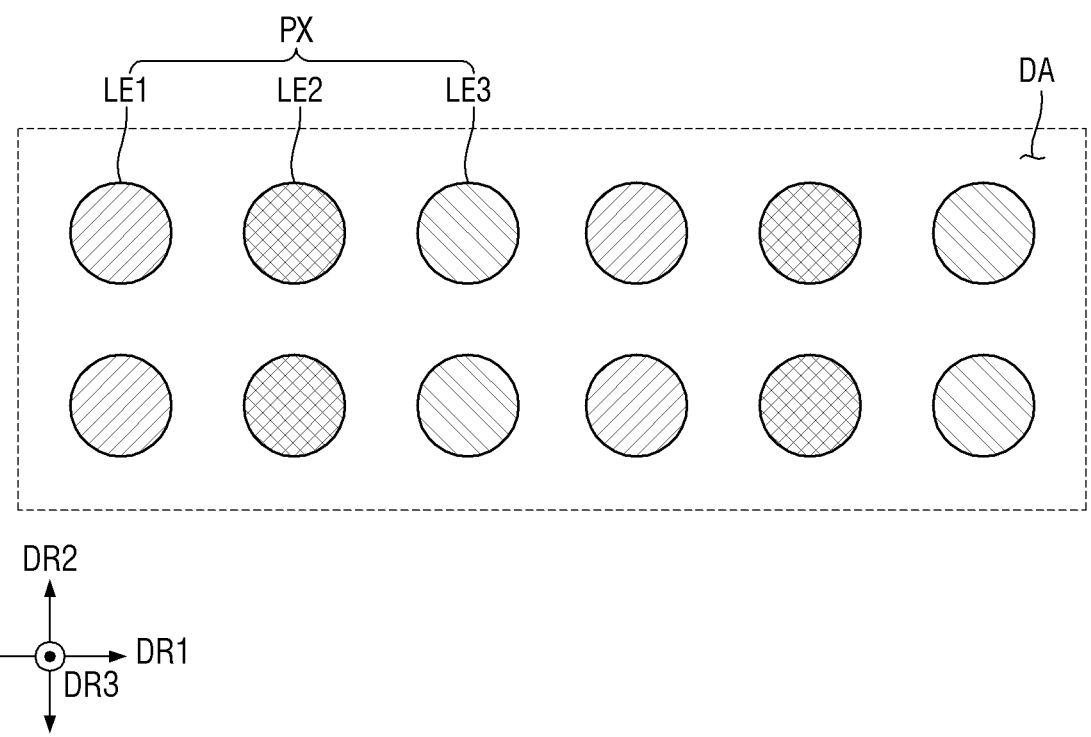
FIG. 3 is a layout view illustrating a plurality of pixels.

FIG. 1 is a layout view of a display device 1 according to one or more embodiments. FIG. 2 is a detailed layout view of area A of FIG. 1. FIG. 3 is a layout view illustrating a plurality of pixels PX.

In FIGS. 1-3, the display device 1 according to the embodiments may be described as an ultra-small light emitting diode display (or a micro-light emitting diode display) including an ultra-small light emitting diode (or a micro-light emitting diode) as a light emitting element, but embodiments of the present specification are not limited thereto.

In addition, in FIGS. 1-3, the display device 1 according to the embodiments may be described as a light emitting diode on silicon (LEDoS) display device in which light emitting diode elements are provided on a semiconductor circuit board formed using a semiconductor process. However, it should be noted that embodiments of the present specification are not limited thereto.

In FIGS. 1-3, a first direction DR1 indicates a horizontal direction of a display panel 10, a second direction DR2 indicates a vertical direction of the display panel 10, and a third direction DR3 indicates a thickness direction of the display panel 10. In this case, "left," "right," "upper," and "lower" indicate directions when the display panel 10 is seen in a plan view. For example, a "right side" indicates one side in the first direction DR1, a "left side" indicates the other side in the first direction DR1, an "upper side" indicates one side in the second direction DR2, and a "lower side" indicates the other side in the second direction DR2. In addition, "top" indicates one side in the third direction DR3, and "bottom" indicates the other side in the third direction DR3.

Referring to FIGS. 1-3, the display device 1 according to the embodiments includes the display panel 10 including a display area DA and a non-display area NDA.

The display panel 10 may have a quadrangular planar shape having long sides in the first direction DR1 and short sides in the second direction DR2. However, the planar shape of the display panel 10 is not limited thereto, and the display panel 10 may also have a polygonal, circular, oval, and/or irregular planar shape, other than the quadrangular shape.

The display area DA may be an area where an image is displayed, and the non-display area NDA may be an area where no image is displayed. The planar shape of the display area DA may follow the planar shape of the display panel 10. In FIG. 1, the planar shape of the display area DA is a quadrangular shape. The display area DA may be provided in a central area of the display panel 10. The non-display area NDA may be provided around the display area DA. The non-display area NDA may surround the display area DA.

The display area DA of the display panel 10 may include a plurality of pixels PX. Each of the pixels PX may be defined as a minimum light emitting unit that can display white light.

Each of the pixels PX may include first through third light emitting elements LE1 through LE3 emitting light. In one or more embodiments of the present specification, each of the pixels PX includes three light emitting elements LE1 through LE3, but embodiments of the present specification are not limited thereto. In addition, although each of the first through third light emitting elements LE1 through LE3 is illustrated to have a circular planar shape, embodiments of the present specification are not limited thereto.

The first light emitting element LE1 may emit first light. The first light may be light in a blue wavelength band. For example, a main peak wavelength (B-peak) of the first light may be located at about 380 to 460 nm, but embodiments of the present specification are not limited thereto.

The second light emitting element LE2 may emit second light. The second light may be light in a green wavelength band. For example, a main peak wavelength (G-peak) of the second light may be located at about 480 to 560 nm, but embodiments of the present specification are not limited thereto.

The third light emitting element LE3 may emit third light. The third light may be light in a red wavelength band. For example, a main peak wavelength (R-peak) of the third light may be located at about 600 to 750 nm, but embodiments of the present specification are not limited thereto.

The first light emitting elements LE1, the second light emitting elements LE2, and the third light emitting elements LE3 may be alternately arranged with each other in the first direction DR1. For example, the first light emitting elements LE1, the second light emitting elements LE2, and the third light emitting elements LE3 may be arranged in the order of the first light element LE1, the second light emitting element LE2, and the third light emitting element LE3 in the first direction DR1. The first light elements LE1 may be arranged with each other in the second direction DR2. The second light emitting elements LE2 may be arranged with each other in the second direction DR2. The third light emitting elements LE3 may be arranged with each other in the second direction DR2.

The non-display area NDA may include a first common voltage supply area CVA1, a second common voltage supply area CVA2, a first pad part PDA1, and a second pad part PDA2.

The first common voltage supply area CVA1 may be provided between the first pad part PDA1 and the display area DA. The second common voltage supply area CVA2 may be provided between the second pad part PDA2 and the display area DA. Each of the first common voltage supply area CVA1 and the second common voltage supply area CVA2 may include a plurality of common voltage supply units CVS connected (e.g., electrically coupled) to a common electrode CE. A common voltage may be supplied to the light emitting elements LE1 through LE3 through the common voltage supply units CVS.

The common voltage supply units CVS of the first common voltage supply area CVA1 may be electrically connected to any one of first pads PD1 of the first pad part PDA1. For example, the common voltage supply units CVS of the first common voltage supply area CVA1 may receive a common voltage from any one of the first pads PD1 of the first pad part PDA1.

The common voltage supply units CVS of the second common voltage supply area CVA2 may be electrically connected to any one of second pads PD2 of the second pad part PDA2. For example, the common voltage supply units CVS of the second common voltage supply area CVA2 may receive a common voltage from any one of the second pads PD2 of the second pad part PDA2.

In FIG. 1, a common electrode connection part CPA completely surrounds the display area DA, but embodiments of the present specification are not limited thereto. For example, the common electrode connection part CPA may also be provided on one side, both sides, or at least three sides of the display area DA.

The first pad part PDA1 may be provided on an upper side of the display panel 10. The first pad part PDA1 may include the first pads PD1 connected to an external circuit board.

The second pad part PDA2 may be provided on a lower side of the display panel 10. The second pad part PDA2 may include the second pads PD2 so as to be connected to an external circuit board. In some embodiments, the second pad part PDA2 may not be provided.

Figure 4:
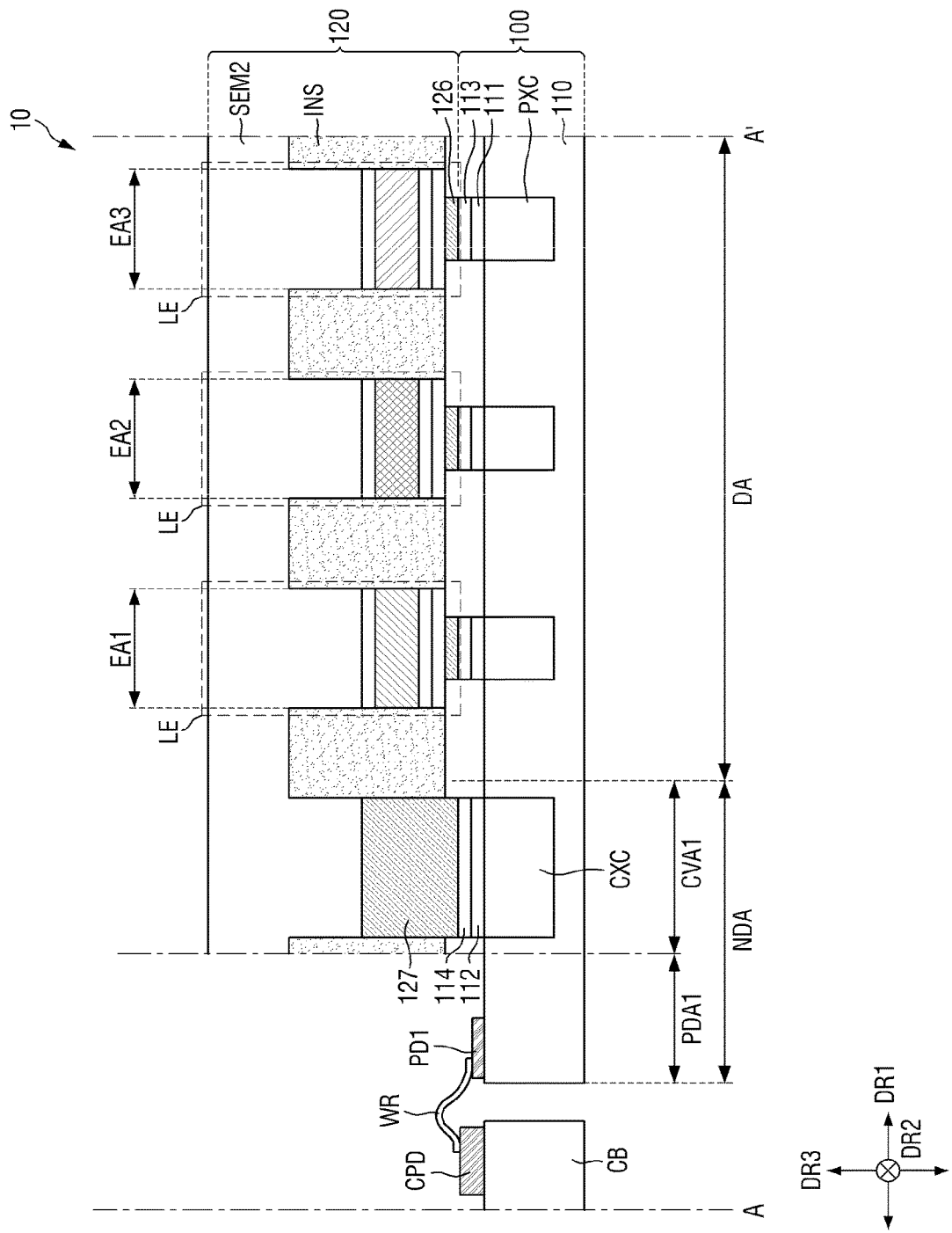
FIG. 4 is a cross-sectional view of an example of a display panel taken along line A-A' of FIG. 2.
Figure 5:
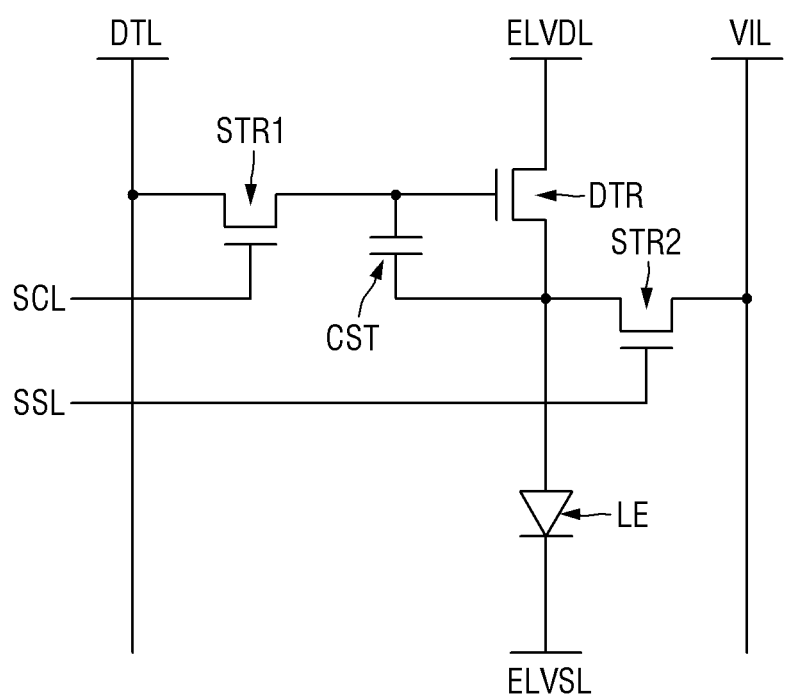
FIG. 5 is an equivalent circuit diagram of a pixel of the display device according to the one or more embodiments.
Figure 6:
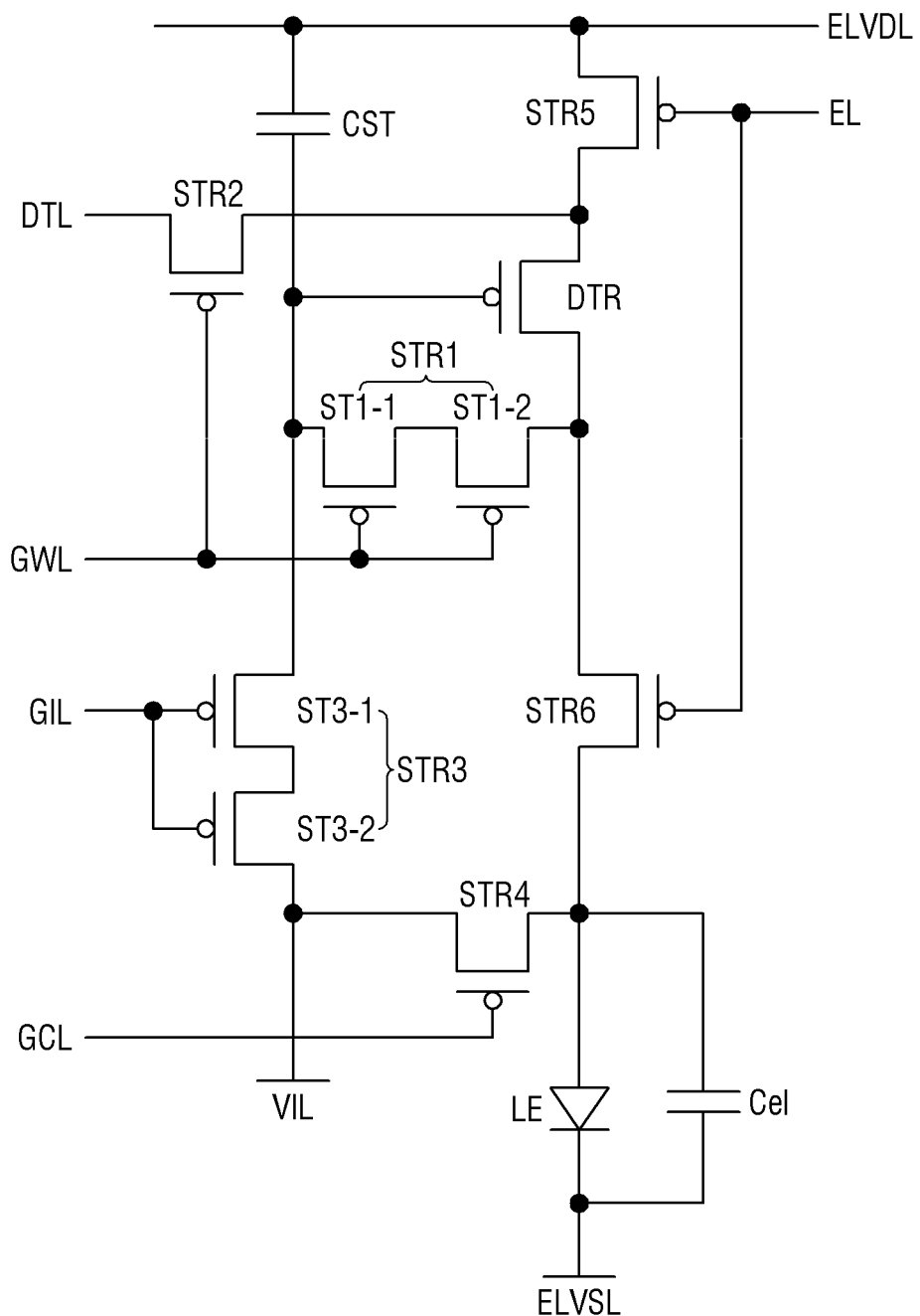
FIG. 6 is an equivalent circuit diagram of a pixel of a display device according to one or more embodiments.
Figure 7:
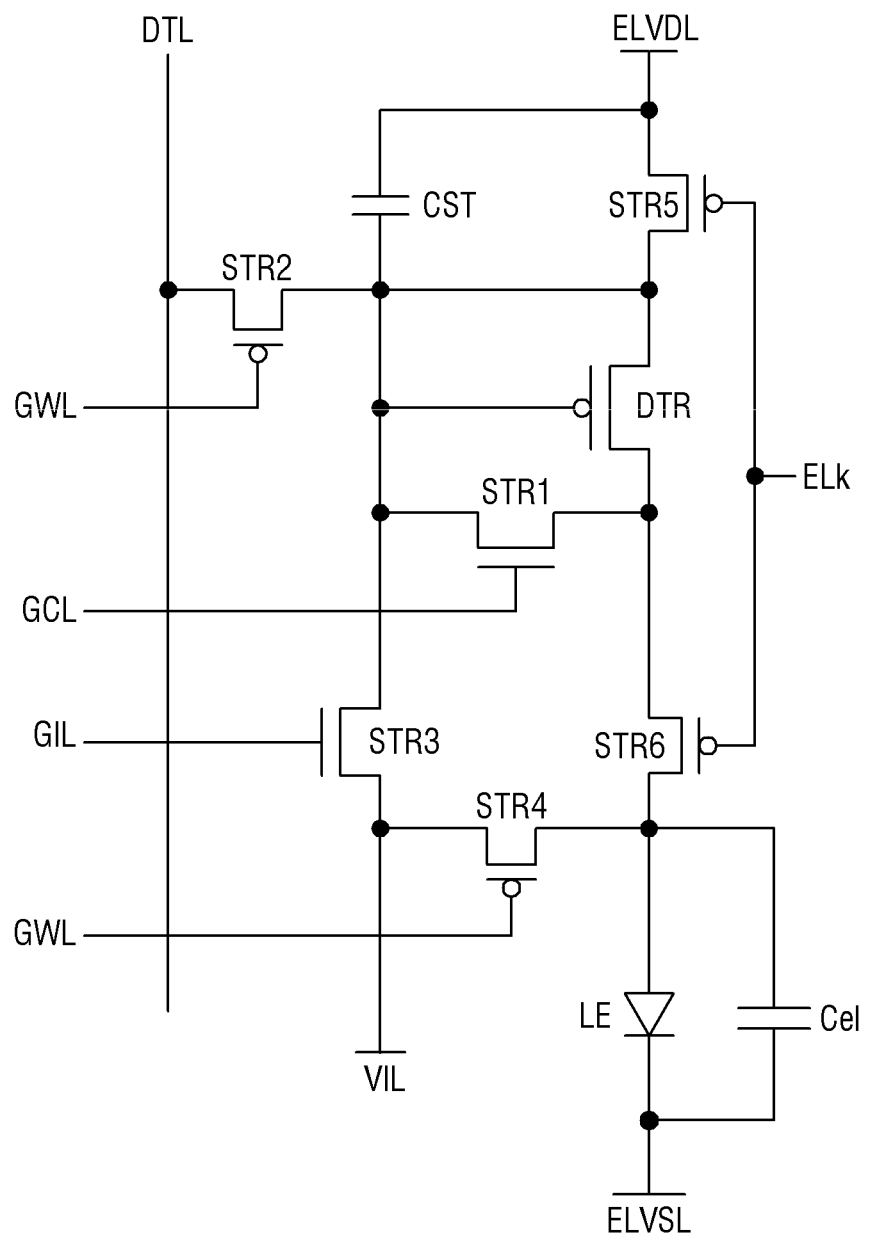
FIG. 7 is an equivalent circuit diagram of a pixel of a display device according to one or more embodiments.
Figure 8:
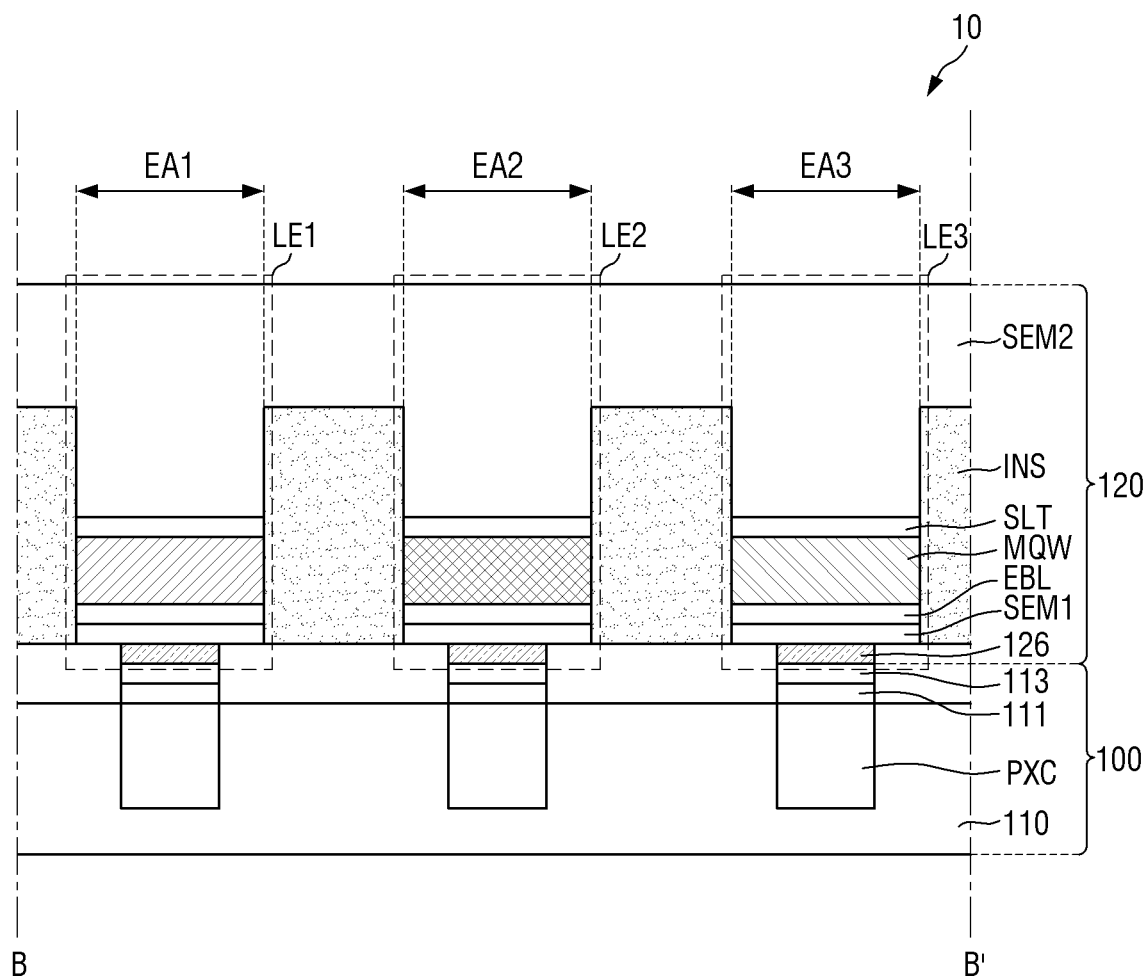
FIG. 8 is a cross-sectional view of an example of the display panel taken along line B-B' of FIG. 2.
Figure 9:
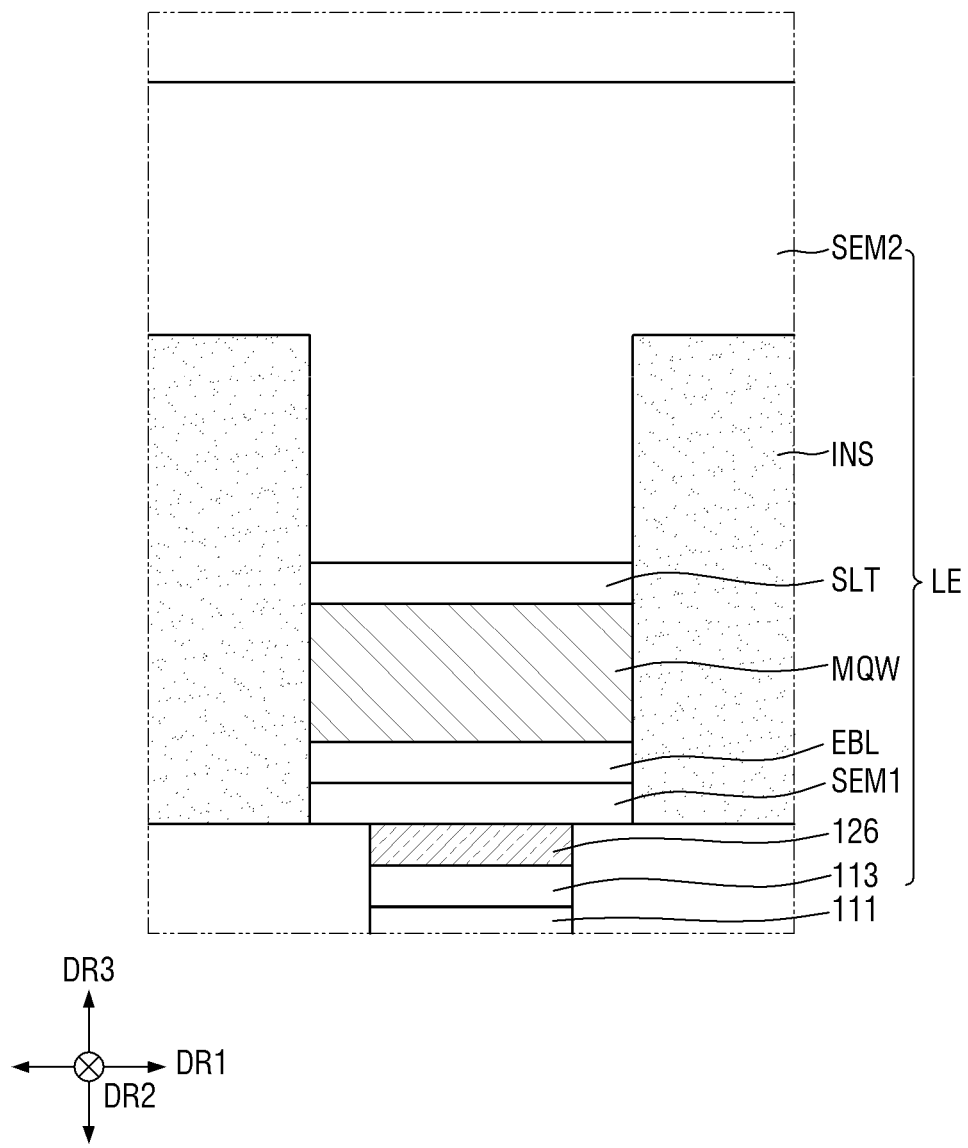
FIG. 9 is a cross-sectional view of an example of a light emitting element layer of a display panel according to one or more embodiments.

FIG. 4 is a cross-sectional view of an example of the display panel 10 taken along line A-A' of FIG. 2. FIG. 5 is an equivalent circuit diagram of a pixel of the display device according to the one or more embodiments. FIG. 6 is an equivalent circuit diagram of a pixel of a display device according to one or more embodiments. FIG. 7 is an equivalent circuit diagram of a pixel of a display device according to one or more embodiments. FIG. 8 is a cross-sectional view of an example of the display panel 10 taken along line B-B' of FIG. 2. FIG. 9 is a cross-sectional view of an example of a light emitting element layer 120 of a display panel 10 according to one or more embodiments.

Referring to FIGS. 4-9, the display panel 10 according to the embodiments may include a semiconductor circuit board 100 and the light emitting element layer 120.

The semiconductor circuit board 100 may include a first substrate 110, a plurality of pixel circuit units PXC, a common circuit unit CXC, pixel electrodes 111, a common electrode 112, the first pads PD1, contact electrodes 113, and a common contact electrode 114.

The first substrate 110 may be a silicon wafer substrate formed using a suitable semiconductor process and may be a first substrate. The pixel circuit units PXC and the common circuit unit CXC of the first substrate 110 may be formed using a suitable semiconductor process.

The pixel circuit units PXC may be provided in the display area DA. Each of the pixel circuit units PXC may be connected to a corresponding pixel electrode 111. For example, the pixel circuit units PXC and the pixel electrodes 111 may be connected one-to-one to each other. The pixel circuit units PXC may respectively overlap light emitting elements LE in the third direction DR3.

Each of the pixel circuit units PXC may include at least one transistor formed using a suitable semiconductor process. In one or more embodiments, each of the pixel circuit units PXC may further include at least one capacitor formed using a suitable semiconductor process. The pixel circuit units PXC may include, for example, a complementary metal oxide semiconductor (CMOS) circuit. Each of the pixel circuit units PXC may apply a pixel voltage or an anode voltage to a corresponding pixel electrode 111.

Referring to FIG. 5, each of pixel circuit units PXC according to one or more embodiments may include three transistors DTR, STR1 and STR2 and one storage capacitor CST.

A light emitting element LE may emit light according to a current supplied through a driving transistor DTR. The light emitting element LE may be implemented as an inorganic light emitting diode, an organic light emitting diode, a micro-light emitting diode, and/or a nano-light emitting diode.

The light emitting element LE may have a first electrode (e.g., an anode) connected (e.g., electrically coupled) to a source electrode of the driving transistor DTR and a second electrode (e.g., a cathode) connected (e.g., electrically coupled) to a second power line ELVSL to which a low potential voltage (a second power supply voltage) lower than a high potential voltage (a first power supply voltage) of a first power line ELVDL is supplied.

The driving transistor DTR adjusts a current flowing from the first power line ELVDL, to which the first power supply voltage is supplied, to the light emitting element LE according to a voltage difference between a gate electrode and the source electrode. The driving transistor DTR may have the gate electrode connected to a first electrode of a first transistor STR1, the source electrode connected to the first electrode of the light emitting element LE, and a drain electrode connected to the first power line ELVDL to which the first power supply voltage is applied.

The first transistor STR1 is turned on by a scan signal of a scan line SCL to connect a data line DTL to the gate electrode of the driving transistor DTR. The first transistor STR1 may have a gate electrode connected to the scan line SCL, the first electrode connected to the gate electrode of the driving transistor DTR, and a second electrode connected to the data line DTL.

A second transistor STR2 is turned on by a sensing signal of a sensing signal line SSL to connect an initialization voltage line VIL to the source electrode of the driving transistor DTR. The second transistor STR2 may have a gate electrode connected to the sensing signal line SSL, a first electrode connected to the initialization voltage line VIL, and a second electrode connected to the source electrode of the driving transistor DTR.

In one or more embodiments, the first electrode of each of the first and second transistors STR1 and STR2 may be a source electrode, and the second electrode may be a drain electrode. However, embodiments of the present specification are not limited thereto, and the opposite may also be the case.

The capacitor CST is formed between the gate electrode and the source electrode of the driving transistor DTR. The storage capacitor CST stores a difference voltage between a gate voltage and a source voltage of the driving transistor DTR.

The driving transistor DTR and the first and second transistors STR1 and STR2 may be formed as thin-film transistors. In some embodiments, although the driving transistor DTR and the first and second switching transistors STR1 and STR2 are described herein as N-type metal oxide semiconductor field effect transistors (MOSFETs) in FIG. 5, embodiments of the present specification are not limited thereto. For example, the driving transistor DTR and the first and second switching transistors STR1 and STR2 may also be P-type MOSFETs, or some of them may be N-type MOSFETs, and the others may be P-type MOSFETs.

Referring to FIG. 6, a light emitting element LE of a pixel circuit unit PXC according to one or more embodiments may have a first electrode connected to a first electrode of a fourth transistor STR4 and a second electrode of a sixth transistor STR6, and a second electrode connected to a second power line ELVSL. A parasitic capacitance Cel may be formed between the first electrode and the second electrode of the light emitting element LE.

Each pixel PX may include a driving transistor DTR, switch elements, and a capacitor CST. The switch elements include first through sixth transistors STR1 through STR6.

The driving transistor DTR includes a gate electrode, a first electrode, and a second electrode. The driving transistor DTR controls a drain-source current Ids (hereinafter, referred to as a "driving current") flowing between the first electrode and the second electrode according to a data voltage applied to the gate electrode.

The capacitor CST is formed between the gate electrode of the driving transistor DTR and a first power line ELVDL. The capacitor CST may have one electrode connected to the gate electrode of the driving transistor DTR and the other electrode connected to the first power line ELVDL.

When a first electrode of each of the first through sixth transistors STR1 through STR6 and the driving transistor DTR is a source electrode, a second electrode thereof may be a drain electrode. In one or more other embodiments, when the first electrode of each of the first through sixth transistors STR1 through STR6 and the driving transistor DTR is a drain electrode, the second electrode thereof may be a source electrode.

An active layer of each of the first through sixth transistors STR1 through STR6 and the driving transistor DTR may be formed of any one of polysilicon, amorphous silicon, or an oxide semiconductor. When a semiconductor layer of each of the first through sixth transistors STR1 through STR6 and the driving transistor DTR is formed of polysilicon, a process for forming the semiconductor layer may be a low-temperature polysilicon (LTPS) process.

Although the first through sixth transistors STR1 through STR6 and the driving transistor DTR are described herein as P-type MOSFETs in FIG. 6, embodiments of the present specification are not limited thereto, and they may also be formed as N-type MOSFETs. The first transistor STR1 and the third transistor STR3 may be formed two transistors respectively. For example, the first transistor STR1 may include a first sub-transistor ST1-1 and a second sub-transistor ST1-2. The third transistor STR3 may include a third sub-transistor ST3-1 and a fourth sub-transistor ST3-2.

Further, a first power supply voltage of the first power line ELVDL, a second power supply voltage of the second power line ELVSL, and a third power supply voltage of a third power line VIL (e.g., the initialization voltage line VIL) may be set in consideration of characteristics of the driving transistor DTR and characteristics of the light emitting element LE.

Referring to FIG. 7, a pixel circuit unit PXC according to one or more embodiments is different from that of the embodiment of FIG. 6 in that a driving transistor DTR, a second transistor STR2, a fourth transistor STR4, a fifth transistor STR5 and a sixth transistor STR6 are formed as P-type MOSFETs, and a first transistor STR1 and a third transistor STR3 are formed as N-type MOSFETs.

An active layer of each of the driving transistor DTR, the second transistor STR2, the fourth transistor STR4, the fifth transistor STR5 and the sixth transistor STR6 formed as P-type MOSFETs may be made of polysilicon, and an active layer of each of the first transistor STR1 and the third transistor STR3 formed as N-type MOSFETs may be made of an oxide semiconductor.

The embodiment of FIG. 7 is different from the embodiment of FIG. 6 in that a gate electrode of the second transistor STR2 and a gate electrode of the fourth transistor STR4 are connected to a write scan line GWL, and that a gate electrode of the first transistor STR1 is connected to a control scan line GCL. In FIG. 7, because the first transistor STR1 and the third transistor STR3 are formed as N-type MOSFETs, a scan signal of a gate-high voltage may be transmitted to the control scan line GCL and an initialization scan line GIL. Further, because the second transistor STR2, the fourth transistor STR4, the fifth transistor STR5, and the sixth transistor STR6 are formed as P-type MOSFETs, a scan signal of a gate-low voltage may be transmitted to the write scan line GWL and an emission line ELk.

It should be noted that the equivalent circuit diagrams of the pixels according to the embodiments of the present specification described above are not limited to those illustrated in FIGS. 5-7. The equivalent circuit diagrams of the pixels according to the embodiments of the present specification may also be formed in other suitable circuit structures that can be employed by those skilled in the art, in addition to the embodiments illustrated in FIGS. 5-7.

The common circuit unit CXC may be provided in the non-display area NDA. The common circuit unit CXC may be provided to correspond to the common contact electrode 114 and may be connected to a second semiconductor layer SEM2 commonly connected to a plurality of light emitting elements LE.

Each of the pixel electrodes 111 may be provided on a corresponding pixel circuit unit PXC. Each of the pixel electrodes 111 may be an exposed electrode exposed from the pixel circuit unit PXC. Each of the pixel electrodes 111 may be integrally formed with the pixel circuit unit PXC. Each of the pixel electrodes 111 may receive a pixel voltage or an anode voltage from the corresponding pixel circuit unit PXC. The pixel electrodes 111 may include at least any one of gold (Au), copper (Cu), tin (Sn), or silver (Ag). For example, the pixel electrodes 111 may include a 9:1 alloy, an 8:2 alloy or a 7:3 alloy of gold and tin and/or may include an alloy (SAC305) of copper, silver and tin.

The common electrode 112 may be provided in the first common voltage supply area CVA1 of the non-display area NDA. The common electrode 112 may surround the display area DA. The common electrode 112 may be connected to any one of the first pads PD1 of the first pad part PDA1 through the common circuit unit CXC formed in the non-display area NDA to receive a common voltage. The common electrode 112 may include the same (or substantially the same) material as the pixel electrodes 111. For example, the common electrode 112 and the pixel electrodes 111 may be formed by the same (or substantially the same) process.

Each of the contact electrodes 113 may be provided on a corresponding pixel electrode 111. The contact electrodes 113 may include a metal material to bond the pixel electrodes 111 to the light emitting elements LE. For example, the contact electrodes 113 may include at least any one of gold (Au), copper (Cu), aluminum (Al), or tin (Sn). In some embodiments, the contact electrodes 113 may include a first layer including any one of gold (Au), copper (Cu), aluminum (Al) or tin (Sn), and a second layer including another one of gold (Au), copper (Cu), aluminum (Al) or tin (Sn).

The common contact electrode 114 may be provided on the common electrode 112 of the non-display area NDA and may surround the display area DA. The common contact electrode 114 may be connected to any one of the first pads PD1 of the first pad part PDA1 through the common circuit unit CXC formed in the non-display area NDA to receive a common voltage. The common contact electrode 114 may include the same material as the contact electrodes 113 described above. The common contact electrode 114 may electrically connect a power line of the common circuit unit CXC and a common connection electrode 127 of the light emitting element layer 120.

Each of the first pads PD1 may be connected to a pad electrode CPD of a circuit board CB through a corresponding conductive connection member such as a wire WR. For example, the first pads PD1, the wires WR, and the pad electrodes CPD of the circuit board CB may be connected one-to-one to each other.

The circuit board CB may be a flexible printed circuit board (FPCB), a printed circuit board (PCB), a flexible printed circuit (FPC), and/or a flexible film such as a chip on film (COF).

The second pads PD2 of the second pad part PDA2 may be substantially the same as the first pads PD1 described above, and thus a redundant description thereof will not be provided.

The light emitting element layer 120 may include the light emitting elements LE, an insulating layer INS, connection electrodes 126, and the common connection electrode 127.

The light emitting element layer 120 may include first light emitting areas EA1, second light emitting areas EA2, and third light emitting areas EA3 corresponding to the light emitting elements LE, respectively. The light emitting elements LE may be provided in the first light emitting areas EA1, the second light emitting areas EA2, and the third light emitting areas EA3, respectively.

The light emitting elements LE may be provided on the pixel electrodes 111 in the first light emitting areas EA1, the second light emitting areas EA2, and the third light emitting areas EA3, respectively. The light emitting elements LE may be vertical light emitting diode elements extending in the third direction DR3. For example, a length of each of the light emitting elements LE in the third direction DR3 may be greater than a length thereof in the horizontal direction. The length in the horizontal direction refers to a length in the first direction DR1 or a length in the second direction DR2. For example, the length of each of the light emitting elements LE in the third direction DR3 may be about 1 to 5 μm.

The light emitting elements LE may be micro-light emitting diode elements. As illustrated in FIG. 9, each of the light emitting elements LE may include a connection electrode 126, a first semiconductor layer SEM1, an electron blocking layer EBL, an active layer MQW, a superlattice layer SLT, and the second semiconductor layer SEM2 in the third direction DR3. The connection electrode 126, the first semiconductor layer SEM1, the electron blocking layer EBL, the active layer MQW, the superlattice layer SLT, and the second semiconductor layer SEM2 may be sequentially stacked in the third direction DR3.

As illustrated in FIG. 9, each of the light emitting elements LE may be shaped like a cylinder, a disk, and/or a rod whose height is greater than its width. However, embodiments of the present specification are not limited thereto, and each of the light emitting elements LE may also have various suitable shapes including shapes such as a rod, a wire and/or a tube, polygonal prisms such as a cube, a rectangular parallelepiped and/or a hexagonal prism, and/or a shape extending in a direction and having a partially inclined outer surface.

The connection electrode 126 may be provided on a pixel electrode 111 and a contact electrode 113. The connection electrode 126 may adhere to the contact electrode 113 to transmit an emission signal to a corresponding light emitting element LE. The light emitting element LE may include at least one connection electrode 126. Although the light emitting element LE includes one connection electrode 126 in FIG. 9, embodiments of the present specification are not limited thereto. In some embodiments, the light emitting element LE may include a greater number of the connection electrodes 126, or the connection electrode 126 may not be provided. The following description of the light emitting element LE may apply equally even when the number of the connection electrodes 126 is changed or when the light emitting element LE further includes another structure.

The connection electrode 126 may be provided between the contact electrode 113 and the first semiconductor layer SEM1. The connection electrode 126 may be an ohmic connection electrode. However, embodiments of the present specification are not limited thereto, and the connection electrode 126 may also be a Schottky connection electrode. When the light emitting element LE is electrically connected to a contact electrode in the display panel 10 according to the embodiments, the connection electrode 126 may reduce the resistance between the light emitting element LE and the contact electrode. The connection electrode 126 may include a conductive metal. For example, the connection electrode 126 may include at least any one of gold (Au), copper (Cu), tin (Sn), titanium (Ti), aluminum (Al), or silver (Ag). For example, the connection electrode 126 may include a 9:1 alloy, an 8:2 alloy or a 7:3 alloy of gold and tin, and/or may include an alloy (SAC305) of copper, silver and tin.

The first semiconductor layer SEM1 may be provided on the connection electrode 126. The first semiconductor layer SEM1 may be a p-type semiconductor and may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer SEM1 may be any one or more of p-type doped AlGaInN, GaN, AlGaN, InGaN, AlN, or InN. The first semiconductor layer SEM1 may be doped with a p-type dopant, and the p-type dopant may be Mg, Zn, Ca, Ba, and/or the like. For example, the first semiconductor layer SEM1 may be p-GaN doped with p-type Mg. A thickness of the first semiconductor layer SEM1 may be in the range of, but not limited to, 30 to 200 nm.

The electron blocking layer EBL may be provided on the first semiconductor layer SEM1. The electron blocking layer EBL may be a layer for suppressing, preventing, or reducing the flow of too many electrons into the active layer MQW. For example, the electron blocking layer EBL may be p-AlGaN doped with p-type Mg. A thickness of the electron blocking layer EBL may be in the range of, but not limited to, 10 to 50 nm. The electron blocking layer EBL may also not be provided.

The active layer MQW may be provided on the electron blocking layer EBL. The active layer MQW may emit light through combination of electron-hole pairs according to an electrical signal received though the first semiconductor layer SEM1 and the second semiconductor layer SEM2. The active layer MQW may emit the first light, which is light in the blue wavelength band, the second light, which is light in the green wavelength band, or the third light, which is light in the red wavelength band.

The active layer MQW may include a material having a multiple quantum well structure. When the active layer MQW includes a material having a multiple quantum well structure, it may have a structure in which a plurality of well layers and a plurality of barrier layers are alternately stacked.

Light emitted from the active layer MQW is not limited to the first light. In some embodiments, the active layer MQW may emit the second light (light in the green wavelength band) or the third light (light in the red wavelength band). In an embodiment, when indium (In) is included among semiconductor materials included in the active layer MQW, the color of light emitted may vary according to the content of indium. For example, when the indium content is about 10 to 15%, light in the blue wavelength band may be emitted. When the indium content is about 20 to 25%, light in the green wavelength band may be emitted. When the indium content is about 30 to 45%, light in the red wavelength band may be emitted.

The superlattice layer SLT may be provided on the active layer MQW. The superlattice layer SLT may be a layer for relieving stress between the second semiconductor layer SEM2 and the active layer MQW. For example, the superlattice layer SLT may be formed of InGaN and/or GaN. A thickness of the superlattice layer SLT may be about 50 to 200 nm. However, the superlattice layer SLT may also be not be provided.

The second semiconductor layer SEM2 may be provided on the superlattice layer SLT. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer SEM2 may be any one or more of n-type doped AlGaInN, GaN, AlGaN, InGaN, AlN, or InN. The second semiconductor layer SEM2 may be doped with an n-type dopant, and the n-type dopant may be Si, Ge, Sn, and/or the like. For example, the second semiconductor layer SEM2 may be n-GaN doped with n-type Si. A thickness of the second semiconductor layer SEM2 may be in the range of, but not limited to, 2 to 4 μm.

As illustrated in FIG. 4, the second semiconductor layer SEM2 may be a common layer commonly connected to the light emitting elements LE. At least a part of the second semiconductor layer SEM2 may be provided and patterned on each of the light emitting elements LE in the third direction DR3, and other part(s) may continuously extend in the first direction DR1 to lie (e.g., be positioned) commonly on the light emitting elements LE. The second semiconductor layer SEM2 may allow a common voltage received through the common connection electrode 127 to be commonly applied to the light emitting elements LE. The second semiconductor layer SEM2 may extend from the display area DA to the non-display area NDA.

The common connection electrode 127 may be provided in the first common voltage supply area CVA1 of the non-display area NDA. The common connection electrode 127 may be provided on (or below) a surface of the second semiconductor layer SEM2. The common connection electrode 127 may serve to transmit a common voltage signal from the common contact electrode 114 to the light emitting elements LE. The common connection electrode 127 may be made of the same material as the connection electrodes 126. In order to be connected to the common contact electrode 114, the common connection electrode 127 may be formed to be thick in the third direction DR3.

The light emitting elements LE described above may receive pixel voltages or anode voltages of the pixel electrodes 111 through the connection electrodes 126 and may receive a common voltage through the second semiconductor layer SEM2. Each of the light emitting elements LE may emit light with a set or predetermined luminance according to a voltage difference between the pixel voltage and the common voltage.

The insulating layer INS may define each of the light emitting elements LE, and define each of the light emitting areas EA1 through EA3. The insulating layer INS may surround the light emitting elements LE and may directly contact side surfaces of the light emitting elements LE. Accordingly, the light emitting elements LE may not be exposed to external foreign substances, for example, dust and/or air in a manufacturing process of the display device 1. In addition, because each of the light emitting elements LE is defined by the insulating layer INS, it can be individualized without an etching process of the light emitting element LE (e.g., individual light emitting elements LE may be manufactured without etching of the light emitting elements LE).

The insulating layer INS may include an inorganic insulating material such as silicon oxide ($SiO_x$), silicon nitride ($SiN_x$), silicon oxynitride ($SiO_xN_y$), aluminum oxide ($Al_xO_y$), or aluminum nitride (AlN). A thickness of the insulating layer INS may be, but is not limited to, about 0.1 to 10 μm.

Figure 10:
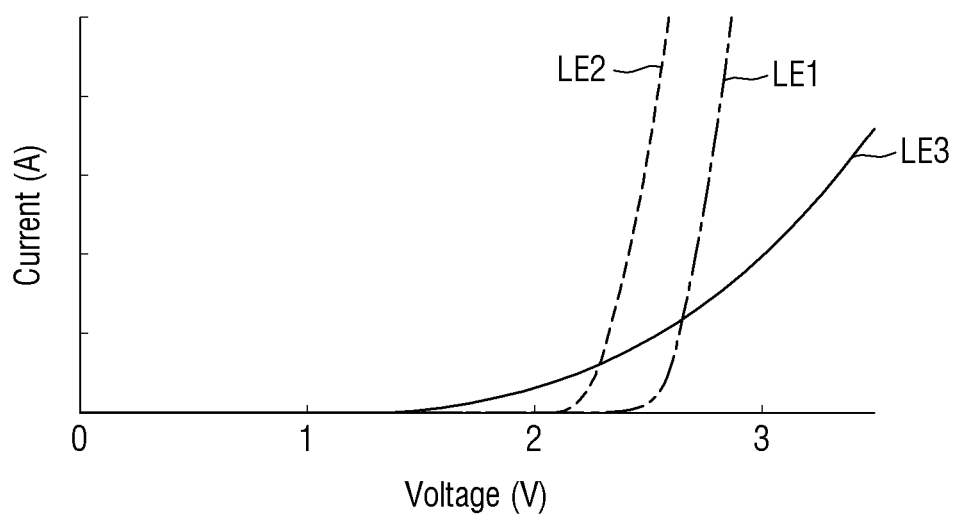
FIG. 10 is a graph illustrating the current with respect to the driving voltage of each light emitting element.

FIG. 10 is a graph illustrating the current with respect to the driving voltage of each light emitting element.

FIG. 10 is a graph illustrating the driving voltage of each light emitting element and shows only a scale without showing specific current values.

Referring to FIG. 10, the driving voltage of a first light emitting element LE1 emitting the first (blue) light may be about 2.7 eV, the driving voltage of a second light emitting element LE2 (e.g., emitting the second (green) light) may be about 2.3 eV, and the driving voltage of a third light emitting element LE3 (e.g., emitting the third (red) light) may be about 1.97 eV. This difference in driving voltage between the light emitting elements LE may result from a difference in energy band gap between the light emitting elements LE. For example, the driving voltage of the first light emitting element LE1 emitting blue light may be the greatest, and the driving voltage of the third light emitting element LE3 emitting red light may be the smallest. When the driving voltages of the light emitting elements LE are different as described above, the circuit of a pixel circuit unit for driving each of the light emitting elements LE may be very complicated or difficult to compensate for this difference.

Hereinafter, embodiments of the present disclosure disclose a display device in which the driving voltages of the light emitting elements LE are made as similar as possible to simplify circuit configuration and facilitate driving of the display device.

Figure 11:
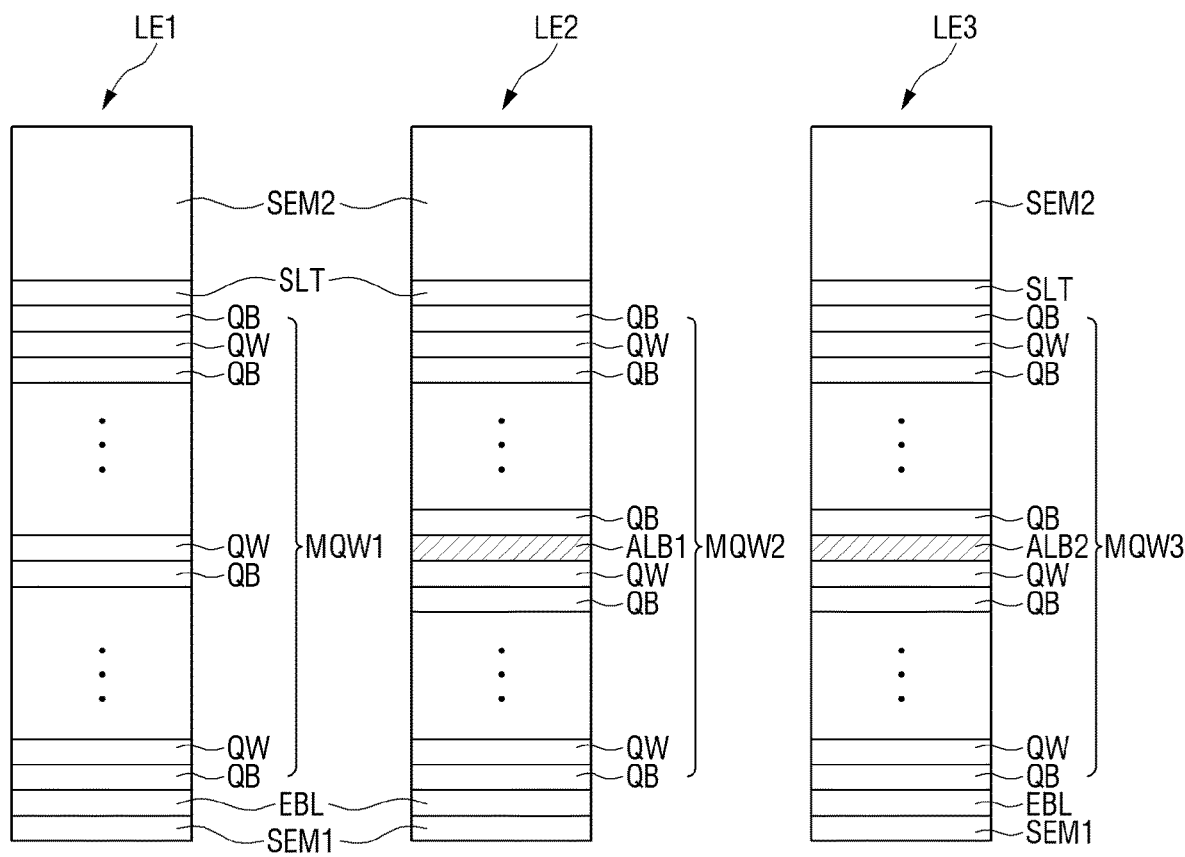
FIG. 11 schematically illustrates an example of the structure of each light emitting element according to one or more embodiments.
Figure 12:
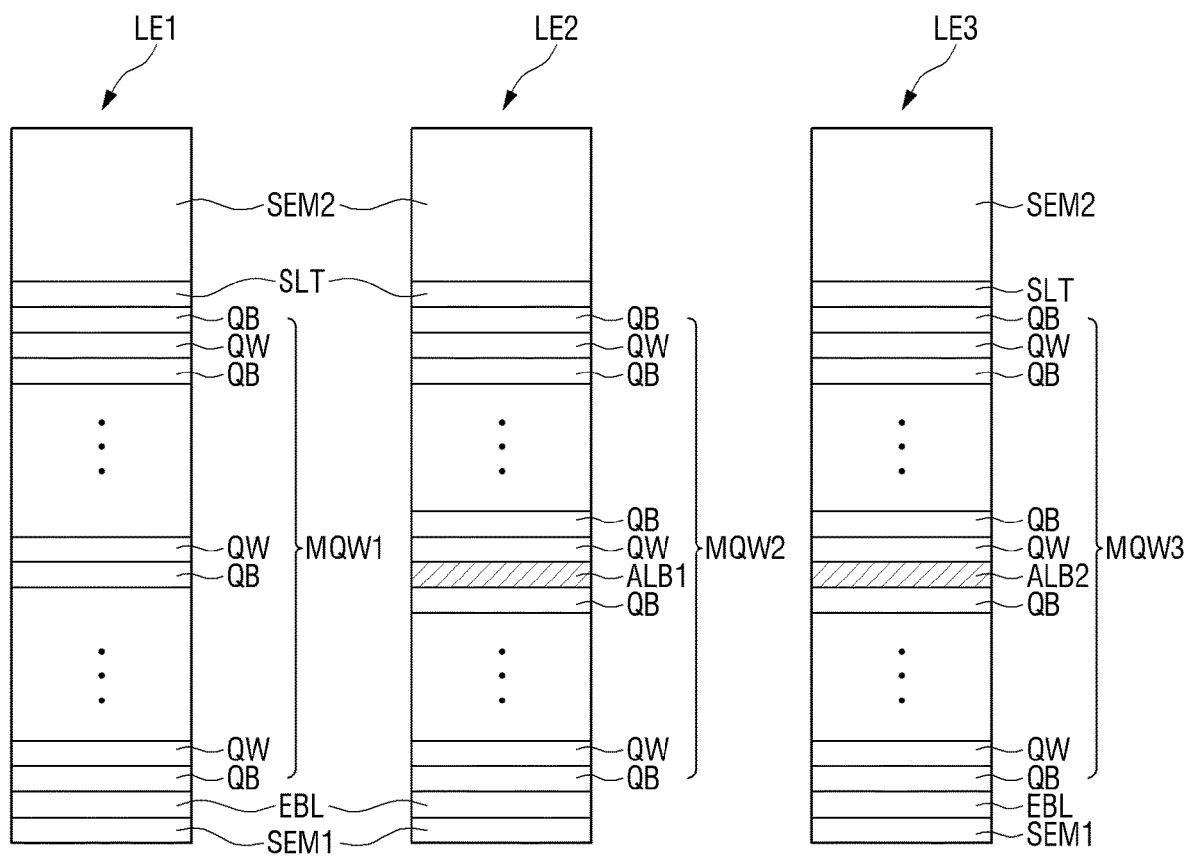
FIG. 12 schematically illustrates an example of the structure of each light emitting element according to the one or more embodiments.
Figure 13:
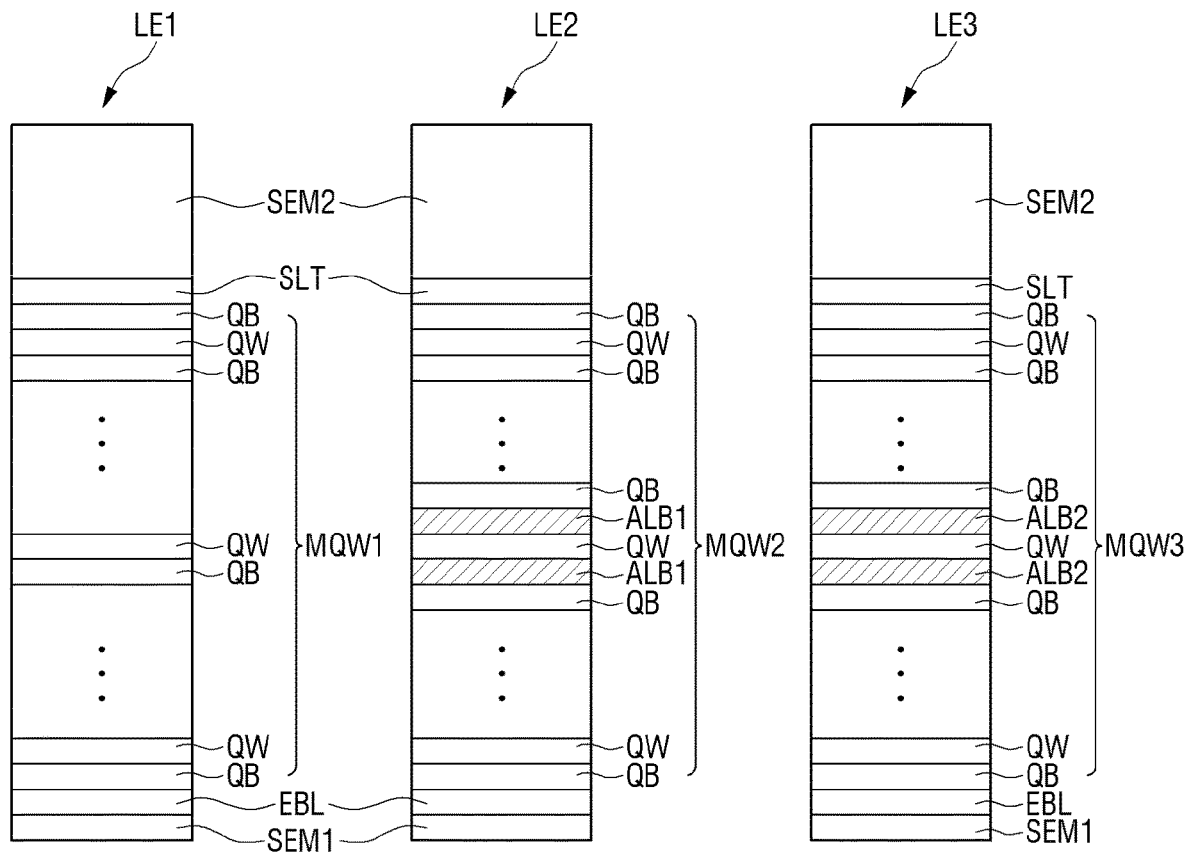
FIG. 13 schematically illustrates an example of the structure of each light emitting element according to the one or more embodiments.

FIG. 11 schematically illustrates an example of the structure of each light emitting element LE according to one or more embodiments. FIG. 12 schematically illustrates an example of the structure of each light emitting element LE according to the one or more embodiments. FIG. 13 schematically illustrates an example of the structure of each light emitting element LE according to the one or more embodiments.

FIGS. 11 through 13 are intended to illustrate, in more detail, the structure of each light emitting element LE described above with reference to FIG. 8. FIGS. 11 through 13 are the same as FIG. 8 except for the light emitting elements LE. The following description will be given with reference to FIGS. 11 through 13 in conjunction with FIG. 8.

Referring to FIG. 11, each light emitting element LE may include a first semiconductor layer SEM1, an electron blocking layer EBL, a superlattice layer SLT, and a second semiconductor layer SEM2 sequentially stacked in the third direction DR3. Each light emitting element LE may include an active layer MQW provided between the electron blocking layer EBL and the superlattice layer SLT.

In one or more embodiments, a first light emitting element LE1 may include a first active layer MQW1, a second light emitting element LE2 may include a second active layer MQW2, and a third light emitting element LE3 may include a third active layer MQW3.

Each active layer MQW may have a multiple quantum well structure. The multiple quantum well structure may be a structure in which a semiconductor material having a large energy band gap and a semiconductor material having a small energy band gap are alternately stacked, or may include different group 3 to 5 semiconductor materials depending on the wavelength band of light to be emitted.

Each active layer MQW may have a structure in which a plurality of well layers QW and a plurality of barrier layers QB are alternately stacked. For example, a barrier layer QB may be stacked on the electron blocking layer EBL and a well layer QW may be stacked on the barrier layer QB, and these may be alternately stacked in the third direction DR3. In addition, each active layer MQW may be configured such that a barrier layer QB is provided under the superlattice layer SLT. For example, a barrier layer QB may be provided at the bottom and top of each active layer MQW.

The well layers QW may include a semiconductor material having a chemical formula of $Al_xGa_yIn_{1-x-y}N$ ($0 \leq x \leq 1$, $0 \leq y \leq 1$, $0 \leq x+y \leq 1$). For example, the well layers QW may be any one or more of AlGaInN, GaN, AlGaN, InGaN, AlN, or InN. A thickness of each of the well layers QW may be in the range of, but not limited to, 1 to 5 nm.

The barrier layers QB may include a semiconductor material having a chemical formula of $Al_xGa_yIn_{1-x-y}N$ ($0 \leq x \leq 1$, $0 \leq y \leq 1$, $0 \leq x+y \leq 1$). For example, the barrier layers QB may be any one or more of AlGaInN, GaN, AlGaN, InGaN, AlN, or InN. A thickness of each of the barrier layers QB may be in the range of, but not limited to, 3 to 10 nm.

In one or more embodiments, the second active layer MQW2 of the second light emitting element LE2 may include a first capping layer ALB1, and the third active layer MQW3 of the third light emitting element LE3 may include a second capping layer ALB2.

The capping layers ALB may be provided in the second active layer MQW2 of the second light emitting element LE2 and the third active layer MQW3 of the third light emitting element LE3, respectively. For example, the first capping layer ALB1 may be provided between a well layer QW and a barrier layer QB of the second active layer MQW2 and may directly contact a surface of the well layer QW (e.g., an upper surface) and a surface of the barrier layer QB (e.g., a lower surface) facing each other. In addition, the second capping layer ALB2 may be provided between a well layer QW and a barrier layer QB of the third active layer MQW3 and may directly contact a surface (e.g., an upper surface) of the well layer QW and a surface (e.g., a lower surface) of the barrier layer QB facing each other.

Each of the capping layers ALB may include a semiconductor material having a chemical formula of $Al_xGa_yIn_{1-x-y}N$ ($0 \leq x \leq 1$, $0 \leq y \leq 1$, $0 \leq x+y \leq 1$). For example, the capping layers ALB may be AlGaN. A thickness of each of the capping layers ALB may be in the range of, but not limited to, 2 to 5 nm.

Each of the capping layers ALB may be provided between a well layer QW and a barrier layer QB to increase the driving voltage of a light emitting element. Each of the capping layers ALB may have a high energy band gap. Accordingly, a potential barrier through which electrons and holes move may increase, thereby increasing the driving voltage of the light emitting element.

In the current embodiment, the capping layers ALB are respectively formed in the active layers MQW2 and MQW3 of the second light emitting element LE2 and the third light emitting element LE3 whose driving voltages are relatively lower than the driving voltage of the first light emitting element LE1. Therefore, the driving voltages of the second light emitting element LE2 and the third light emitting element LE3 may be increased to be similar to the driving voltage of the first light emitting element LE1.

In addition, each capping layer ALB may be provided on a well layer QW to prevent or reduce the diffusion of indium (In) of the well layer QW out of the well layer QW in a high-temperature process for growing a barrier layer QB, thereby preventing or reducing a decrease in luminous efficiency of a light emitting element. For example, the capping layers ALB may be respectively formed in the second active layer MQW2 of the second light emitting element LE2 and the third active layer MQW3 of the third light emitting element LE3 to prevent or reduce a decrease in luminous efficiency of the second light emitting element LE2 and the third light emitting element LE3.

In addition, because each capping layer ALB preventing or reducing the diffusion of indium of the well layer QW enables the barrier layer QB to grow at a high temperature, film formation characteristics of the barrier layer QB can be improved.

In addition, each capping layer ALB may compensate compressive stress applied to the well layer QW with its tensile stress, to compensate for deformation of the light emitting element.

The capping layer ALB included in each of the second light emitting element LE2 and the third light emitting element LE3 may also be provided at a different position.

Referring to FIG. 12, a first capping layer ALB1 of a second light emitting element LE2 may be provided between a well layer QW and a barrier layer QB of a second active layer MQW2, and may directly contact a surface (e.g., a lower surface) of the well layer QW and a surface (e.g., an upper surface) of the barrier layer QB facing each other. In addition, a second capping layer ALB2 of a third light emitting element LE3 may be provided between a well layer QW and a barrier layer QB of a third active layer MQW3 and may directly contact a surface (e.g., a lower surface) of the well layer QW and a surface (e.g., an upper surface) of the barrier layer QB facing each other.

In the current embodiments, each of the first capping layer ALB1 and the second capping layer ALB2 may be provided between a well layer QW and a barrier layer QB to increase a potential barrier through which electrons and holes move, thereby increasing driving voltage of the second light emitting element LE2 and the third light emitting element LE3. In addition, each of the first capping layer ALB1 and the second capping layer ALB2 may compensate compressive stress applied to the well layer QW with its tensile stress, to compensate for deformation of the second light emitting element LE2 and the third light emitting element LE3.

Referring to FIG. 13, first capping layers ALB1 of a second light emitting element LE2 may be respectively provided on (e.g., above) and under (e.g., below) a well layer QW of a second active layer MQW2. For example, any one of the first capping layers ALB1 may directly contact an upper surface of the well layer QW, and the other may directly contact a lower surface of the well layer QW. In addition, second capping layers ALB2 of a third light emitting element LE3 may be respectively provided on (e.g., above) and under (e.g., below) a well layer QW. For example, any one of the second capping layers ALB2 may directly contact an upper surface of the well layer QW, and the other may directly contact a lower surface of the well layer QW.

In the embodiments of FIGS. 11-13, the first capping layer ALB1 and the second capping layer ALB2 may have different compositions. For example, the first capping layer ALB1 and the second capping layer ALB2 may have different aluminum (Al) contents.

Each of the capping layers ALB1 and ALB2 may include a semiconductor material having a chemical formula of $Al_xGa_yIn_{1-x-y}N$ ($0 \leq x \leq 1$, $0 \leq y \leq 1$, $0 \leq x+y \leq 1$). In the first capping layer ALB1, an x coefficient value—which is the content of aluminum—may be 0 to 1. In the second capping layer ALB2, an x coefficient value—which is the content of aluminum—may be 0.5 to 1. Here, the x value, which is the aluminum content of the first capping layer ALB1, may be smaller than the x value, which is the aluminum content of the second capping layer ALB2.

As the content of aluminum in each capping layer ALB increases, an energy band gap of the capping layer ALB may increase. For example, as the content of aluminum in each capping layer ALB increases, the driving voltage of a light emitting element may increase. As described in FIG. 10, a difference between the driving voltage of the first light emitting element LE1 and the driving voltage of the second light emitting element LE2 is smaller than a difference between the driving voltage of the first light emitting element LE1 and the driving voltage of the third light emitting element LE3. In the current embodiment, the content of aluminum in the first capping layer ALB1 may be smaller than the content of aluminum in the second capping layer ALB2 of the third light emitting element LE3. Accordingly, the respective driving voltages of the first light emitting element LE1, the second light emitting element LE2, and the third light emitting element LE3 may be made similar, which makes it possible to simplify the circuit configuration for driving each light emitting element LE.

FIG. 14 schematically illustrates the structure of each light emitting element LE according to one or more embodiments.

Referring to FIG. 14, the current embodiment is different from the embodiments of FIGS. 11-13 in that the number of first capping layers ALB1 of a second light emitting element LE2 is different from the number of second capping layers ALB2 of a third light emitting element LE3. Therefore, a description of the same elements as those of FIGS. 11 through 13 will not be provided, and differences will be mainly described below.

In the current embodiment, the number of the first capping layers ALB1 of the second light emitting element LE2 may be smaller than the number of the second capping layers ALB2 of the third light emitting element LE3.

For example, the first capping layer ALB1 of the second light emitting element LE2 may be provided between a well layer QW and a barrier layer QB of a second active layer MQW2 and may directly contact a lower surface of the well layer QW and an upper surface of the barrier layer QB. The second capping layers ALB2 of the third light emitting element LE3 may be provided between a well layer QW and two oppositely positioned (relative to the well layer QW)

barrier layers QB of a third active layer MQW3, and may directly contact upper and lower surfaces of the well layer QW.

In an embodiment, the second active layer MQW2 of the second light emitting element LE2 may include one first capping layer ALB1, and the third active layer MQW3 of the third light emitting element LE3 may include two second capping layers ALB2. However, embodiments of the present specification are not limited thereto, and the number of the first capping layers ALB1 and the number of the second capping layers ALB2 may each also be more than one, as long as the number of the first capping layers ALB1 is smaller than the number of the second capping layers ALB2.

Although the first capping layer ALB1 directly contacts the lower surface of the well layer QW in FIG. 14, embodiments of the present specification are not limited thereto, and the first capping layer ALB1 may also directly contact an upper surface of the well layer QW.

As described above, as the content of aluminum in each capping layer ALB increases, an energy band gap of the capping layer ALB may increase, thereby increasing a potential barrier. In the embodiments of FIGS. 11-13, when the number of the first capping layers ALB1 and the number of the second capping layers ALB2 are equal, the first capping layer ALB1 and the second capping layer ALB2 are formed to have different compositions.

In the current embodiment, the first capping layer ALB1 and the second capping layer ALB2 may be formed in different numbers to increase potential barriers of the first capping layer ALB1 and the second capping layer ALB2 differently.

For example, the number of the capping layers ALB included may be different between the second light emitting element LE2 and the third light emitting element LE3 to adjust the degree of the potential barrier. For example, the number of the first capping layers ALB1 of the second active layer MQW2 may be smaller than the number of the second capping layers ALB2 of the third active layer MQW3 so that an increase in the driving voltage of the second light emitting element LE2 is smaller than an increase in the driving voltage of the third light emitting element LE3. Accordingly, the respective driving voltages of a first light emitting element LE1, the second light emitting element LE2, and the third light emitting element LE3 may be made similar, which makes it possible to simplify the circuit configuration for driving each light emitting element LE.

FIG. 15 schematically illustrates the structure of each light emitting element LE according to one or more embodiments.

Referring to FIG. 15, the current embodiment is different from the embodiments of FIGS. 11-13 in that a thickness of a first capping layer ALB1 of a second light emitting element LE2 is different from a thickness of a second capping layer ALB2 of a third light emitting element LE3. Therefore, a description of the same elements as those of FIGS. 11-13 will not be provided, and differences will be mainly described below.

In the current embodiment, a thickness TT1 of the first capping layer ALB1 of the second light emitting element LE2 may be smaller than a thickness TT2 of the second capping layer ALB2 of the third light emitting element LE3.

In an embodiment, a second active layer MQW2 of the second light emitting element LE2 and a third active layer MQW3 of the third light emitting element LE3 may include equal numbers of the first capping layers ALB1 and the second capping layers ALB2. For example, the second active layer MQW2 may include one first capping layer ALB1, and the third active layer MQW3 may also include one second capping layer ALB2. In this case, the thickness TT1 of the first capping layer ALB1 may be smaller than the thickness TT2 of the second capping layer ALB2.

As described above, as the content of aluminum in each capping layer ALB increases, an energy band gap of the capping layer ALB may increase, thereby increasing a potential barrier. In the current embodiment, the thickness of the capping layer ALB may be different between the second light emitting element LE2 and the third light emitting element LE3 to adjust the degree of the potential barrier. For example, the thickness TT1 of the first capping layer ALB1 of the second active layer MQW2 may be smaller than the thickness of the second capping layer ALB2 of the third active layer MQW3 so that an increase in the driving voltage of the second light emitting element LE2 is smaller than an increase in the driving voltage of the third light emitting element LE3. Accordingly, the respective driving voltages of a first light emitting element LE1, the second light emitting element LE2, and the third light emitting element LE3 may be made similar, which makes it possible to simplify the circuit configuration for driving each light emitting element LE.

Although each capping layer ALB is provided substantially in the middle of an active layer MQW in each of FIGS. 11-15, embodiments of the present specification are not limited thereto. Each capping layer ALB may also be provided adjacent to an electron blocking layer ELB or adjacent to a superlattice layer SLT.

Figure 21:
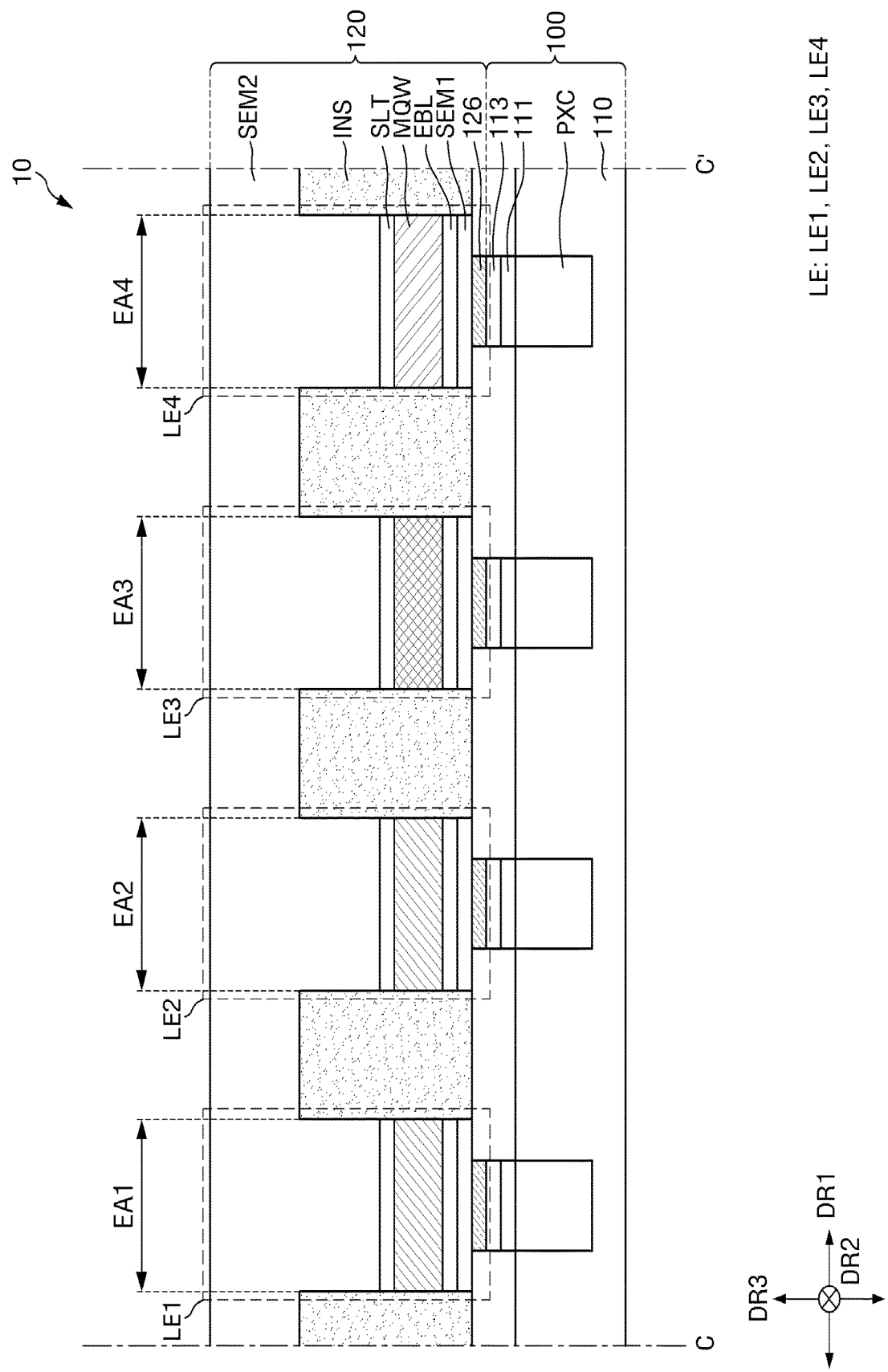
FIG. 21 is a cross-sectional view of an example of a display panel taken along line C-C' of FIG. 16.
Figure 22:
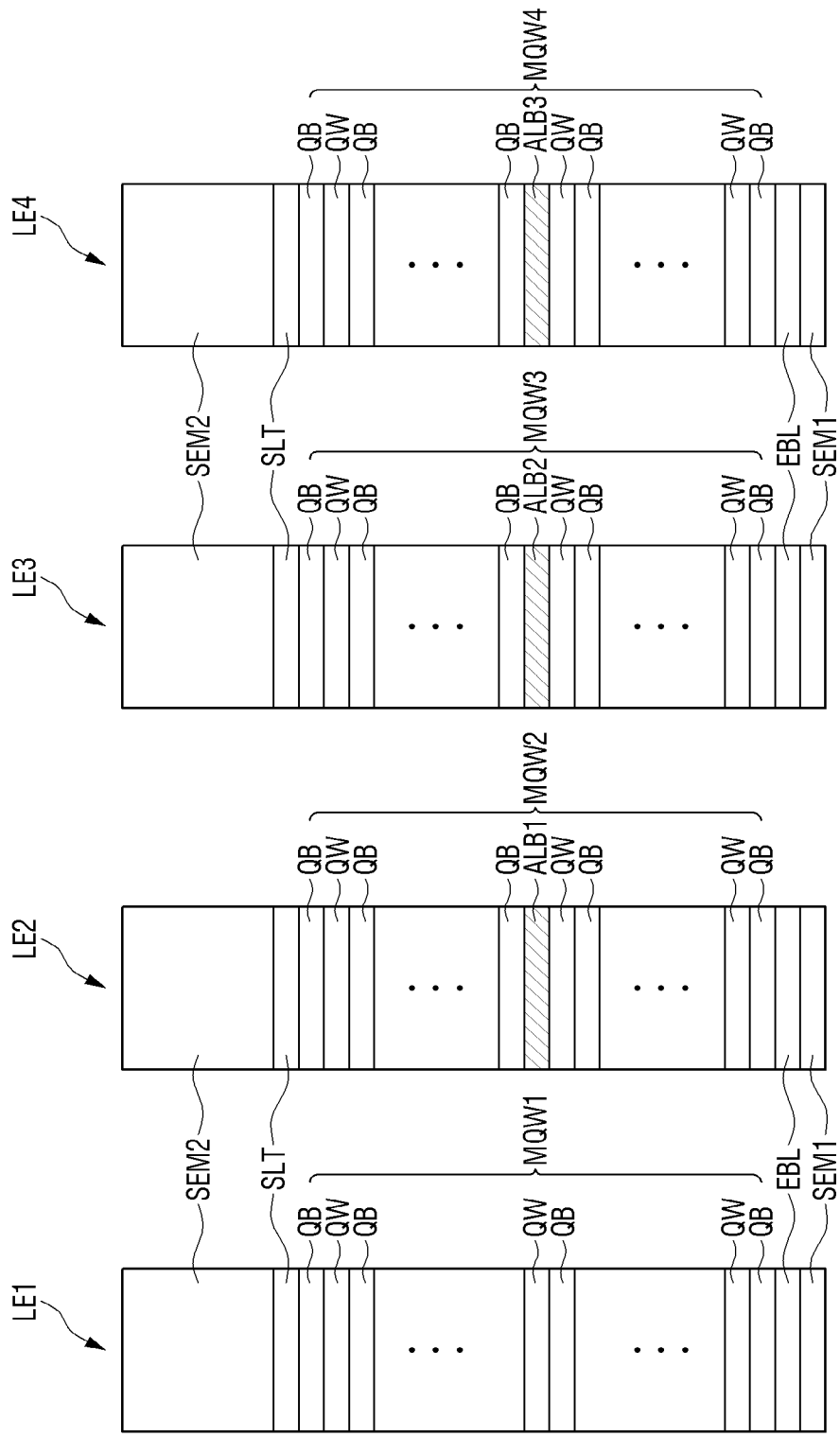
FIG. 22 illustrates the structure of each light emitting element in more detail.

FIGS. 16-20 are layout views of an example of area A of FIG. 1. FIG. 21 is a cross-sectional view of an example of a display panel taken along line C-C' of FIG. 16. FIG. 22 illustrates the structure of each light emitting element LE in more detail.

Referring to FIGS. 16-22, the current embodiment is different from the above-described embodiment of FIGS. 2 and 3 in that a fourth light emitting element LE4 emitting (e.g., configured to emit) the same second light as a second light emitting element LE2 is further included, and that light emitting areas EA1 through EA4 are provided in a Pentile®/PENTILE® structure or pattern (PENTILE® is a registered trademark owned by Samsung Display Co., Ltd.). In FIGS. 16-22, descriptions redundant with those provided in the above-described embodiment of FIGS. 2 and 3 will not be provided again.

Referring to FIGS. 16 and 21, each of a plurality of pixels PX may include a first light emitting element LE1 emitting (e.g., configured to emit) first light, the second light emitting element LE2 emitting (e.g., configured to emit) the second light, a third light emitting element LE3 emitting (e.g., configured to emit) third light, and the fourth light emitting element LE4 emitting (e.g., configured to emit) the second light.

In a display area DA, the first light emitting elements LE1 and the third light emitting elements LE3 may be alternately provided with each other in the first direction DR1. The second light emitting elements LE2 and the fourth light emitting elements LE4 may be alternately provided with each other in the first direction DR1. The first light emitting elements LE1, the second light emitting elements LE2, the third light emitting elements LE3, and the fourth light emitting elements LE4 may be alternately provided in a first diagonal direction DD1 and a second diagonal direction DD2. The first diagonal direction DD1 may be a diagonal direction between the first direction DR1 and the second direction DR2, and the second diagonal direction DD2 may be a direction orthogonal to the first diagonal direction DD1.

In each of the pixels PX, the first light emitting element LE1 and the third light emitting element LE3 may be provided in the first direction DR1, and the second light emitting element LE2 and the fourth light emitting element LE4 may be provided in the first direction DR1. In each of the pixels PX, the first light emitting element LE1 and the second light emitting element LE2 may be provided in the first diagonal direction DD1, the second light emitting element LE2 and the third light emitting element LE3 may be provided in the second diagonal direction DD2, and the third light emitting element LE3 and the fourth light emitting element LE4 may be provided in the first diagonal direction DD1.

The fourth light emitting element LE4 may be substantially the same as the second light emitting element LE2. For example, the fourth light emitting element LE4 may emit the second light and may have the same structure as the second light emitting element LE2.

The first light emitting element LE1 may be provided in a first light emitting area EA1, the second light emitting element LE2 may be provided in a second light emitting area EA2, the third light emitting element LE3 may be provided in a third light emitting area EA3, and the fourth light emitting element LE4 may be provided in a fourth light emitting area EA4.

The area of the first light emitting area EA1, the area of the second light emitting area EA2, the area of the third light emitting area EA3, and the area of the fourth light emitting area EA4 may be substantially the same, but embodiments of the present specification are not limited thereto. For example, the area of the first light emitting area EA1, the area of the second light emitting area EA2 and the area of the third light emitting area EA3 may be different, and the area of the second light emitting area EA2 and the area of the fourth light emitting area EA4 may be the same.

In one or more embodiments, a distance between the first light emitting area EA1 and the second light emitting area EA2 neighboring each other, a distance between the second light emitting area EA2 and the third light emitting area EA3 neighboring each other, a distance between the first light emitting area EA1 and the fourth light emitting area EA4 neighboring each other, and a distance between the third light emitting area EA3 and the fourth light emitting area EA4 neighboring each other may be substantially the same, but embodiments of the present specification are not limited thereto. For example, the distance between the first light emitting area EA1 and the second light emitting area EA2 neighboring each other and the distance between the second light emitting area EA2 and the third light emitting area EA3 neighboring each other may be different, and the distance between the first light emitting area EA1 and the fourth light emitting area EA4 neighboring each other and the distance between the third light emitting area EA3 and the fourth light emitting area EA4 neighboring each other may be different. In this case, the distance between the first light emitting area EA1 and the second light emitting area EA2 neighboring each other and the distance between the first light emitting area EA1 and the fourth light emitting area EA4 neighboring each other may be substantially the same, and the distance between the second light emitting area EA2 and the third light emitting area EA3 neighboring each other and the distance between the third light emitting area EA3 and the fourth light emitting area EA4 neighboring each other may be substantially the same.

Referring to FIG. 17, each of the pixels PX may include four light emitting elements LE1 through LE4. The light emitting elements LE1 through LE4 may be spaced apart from each other in the first direction DR1 and the second direction DR2, but light emitting elements LE closest to each other may be spaced apart from each other in the diagonal direction DD1 or DD2 between the first direction DR1 and the second direction DR2.

In one or more embodiments, the first light emitting element LE1, the second light emitting element LE2, the third light emitting element LE3, and the fourth light emitting element LE4 may have the same diameter. For example, a first diameter WE1 of the first light emitting element LE1, a second diameter WE2 of the second light emitting element LE2, a third diameter WE3 of the third light emitting element LE3, and a fourth diameter WE4 of the fourth light emitting element LE4 may be the same. However, embodiments of the present specification are not limited thereto. In some embodiments, the light emitting elements LE1 through LE4 may have different diameters.

A distance DA1 or DA3 between the second light emitting element LE2 and the fourth light emitting element LE4 adjacent to each other may be the same as a distance DA2 or DA4 between the first light emitting element LE1 and the third light emitting element LE3 adjacent to each other. For example, a first distance DA1 between the second light emitting element LE2 and the fourth light emitting element LE4 adjacent to each other in the first direction DR1 may be the same as a second distance DA2 between the first light emitting element LE1 and the third light emitting element LE3 adjacent to each other in the first direction DR1. A third distance DA3 between the second light emitting element LE2 and the fourth light emitting element LE4 adjacent to each other in the second direction DR2 may be the same as a fourth distance DA4 between the first light emitting element LE1 and the third light emitting element LE3 adjacent to each other in the second direction DR2. A first diagonal distance DG1 between the first light emitting element LE1 and the second light emitting element LE2 adjacent to each other in the first diagonal direction DD1 may be the same as a second diagonal distance DG2 between the third light emitting element LE3 and the fourth light emitting element LE4 adjacent to each other in the first diagonal direction DD1. A third diagonal distance DG3 between the second light emitting element LE2 and the third light emitting element LE3 adjacent to each other in the second diagonal direction DD2 may be the same as a fourth diagonal distance DG4 between the first light emitting element LE1 and the fourth light emitting element LE4 adjacent to each other in the second diagonal direction DD2. However, embodiments of the present specification are not limited thereto. The distances between the light emitting elements LE adjacent to each other may also be different from each other depending on the arrangement and diameter of the light emitting elements LE.

Although the distances DA1 through DA4 and DG1 through DG4 between the first through fourth light emitting elements LE1 through LE4 are defined based on the outside periphery of each of the light emitting elements LE1 through LE4 in FIG. 17, embodiments of the present specification are not limited thereto. The distances DA1 through DA4 and DG1 through DG4 between the first through fourth light emitting elements LE1 through LE4 may also be defined based on the center of each of the light emitting elements LE1 through LE4.

Referring to FIG. 18, a distance DA1 or DA3 between the center of the second light emitting element LE2 and the center of the fourth light emitting element LE4 adjacent to each other may be the same as a distance DA2 or DA4 between the center of the first light emitting element LE1 and the center of the third light emitting element LE3 adjacent to each other. For example, a first distance DA1 between the center of the second light emitting element LE2 and the center of the fourth light emitting element LE4 adjacent to each other in the first direction DR1 may be the same as a second distance DA2 between the center of the first light emitting element LE1 and the center of the third light emitting element LE3 adjacent to each other in the first direction DR1. A third distance DA3 between the center of the second light emitting element LE2 and the center of the fourth light emitting element LE4 adjacent to each other in the second direction DR2 may be the same as a fourth distance DA4 between the center of the first light emitting element LE1 and the center of the third light emitting element LE3 adjacent to each other in the second direction DR2. In addition, a first diagonal distance DG1 between the center of the first light emitting element LE1 and the center of the second light emitting element LE2 adjacent to each other in the first diagonal direction DD1 may be the same as a second diagonal distance DG2 between the center of the third light emitting element LE3 and the center of the fourth light emitting element LE4 adjacent to each other in the first diagonal direction DD1. A third diagonal distance DG3 between the center of the second light emitting element LE2 and the center of the third light emitting element LE3 adjacent to each other in the second diagonal direction DD2 may be the same as a fourth diagonal distance DG4 between the center of the first light emitting element LE1 and the center of the fourth light emitting element LE4 adjacent to each other in the second diagonal direction DD2.

Although the distances DA1 through DA4 and DG1 through DG4 between the centers of the first through fourth light emitting elements LE1 through LE4 are the same in the current embodiment, embodiments of the present specification are not limited thereto. The distances DA1 through DA4 and DG1 through DG4 between the centers of the first through fourth light emitting elements LE1 through LE4 may also be changed as described above with reference to the embodiment of FIG. 17.

Figure 19:
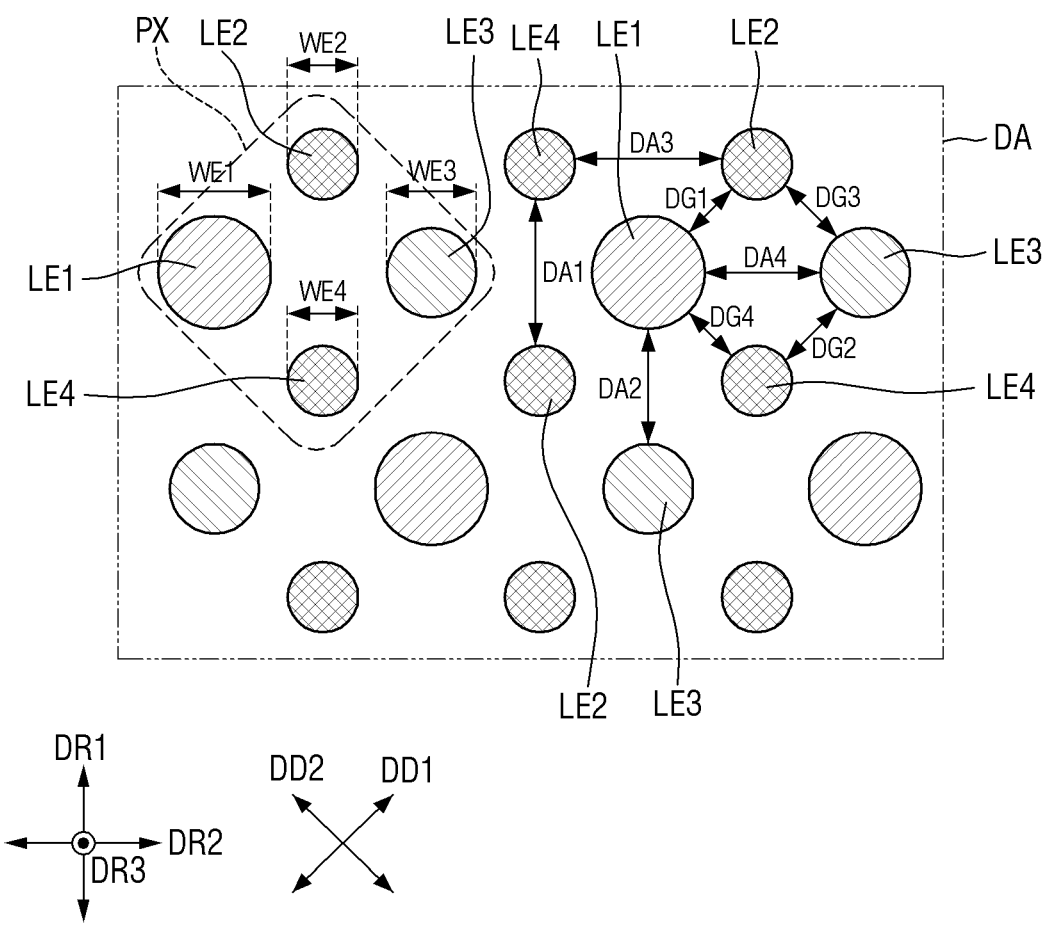
Figure 20:
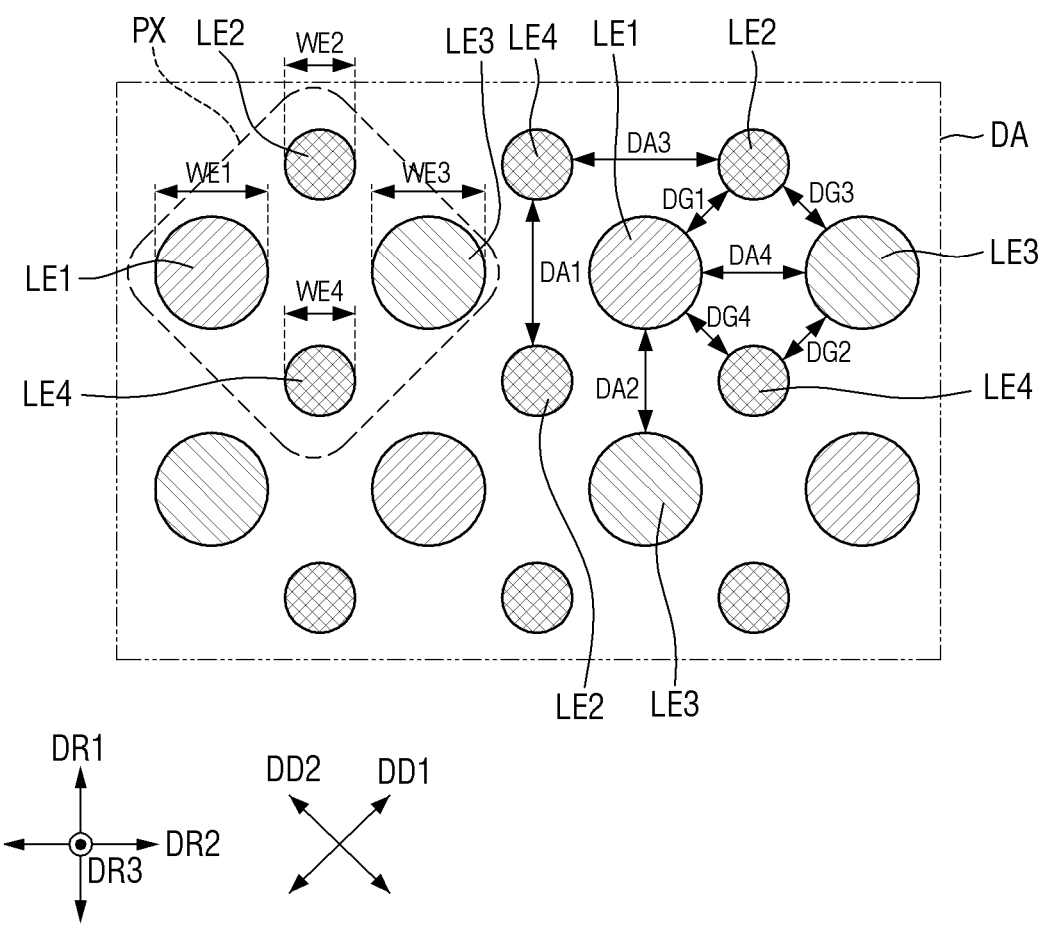

Referring to FIGS. 19 and 20, in display devices according to embodiments, the light emitting elements LE1 through LE4 may have different sizes. In the embodiment of FIG. 19, the first diameter WE1 of the first light emitting element LE1 may be greater than each of the diameters WE2, WE3 and WE4 of the second light emitting element LE2, the third light emitting element LE3 and the fourth light emitting element LE4, and the third diameter WE3 of the third light emitting element LE3 may be greater than the diameters WE2 and WE4 of the second light emitting element LE2 and the fourth light emitting element LE4. The second diameter WE2 of the second light emitting element LE2 may be the same as the fourth diameter WE4 of the fourth light emitting element LE4. The embodiment of FIG. 20 is different from the embodiment of FIG. 19 in that the first diameter WE1 of the first light emitting element LE1 is the same as the third diameter WE3 of the third light emitting element LE3.

In one or more embodiments, the distances between the light emitting elements LE adjacent to each other may be partially different from each other. For example, the first distance DA1 between the second light emitting element LE2 and the fourth light emitting element LE4 adjacent to each other in the first direction DR1 may be greater than the second distance DA2 between the first light emitting element LE1 and the third light emitting element LE3 adjacent to each other in the first direction DR1. The third distance DA3 between the second light emitting element LE2 and the fourth light emitting element LE4 adjacent to each other in the second direction DR2 may be greater than the fourth distance DA4 between the first light emitting element LE1 and the third light emitting element LE3 adjacent to each other in the second direction DR2. In addition, the first diagonal distance DG1 between the first light emitting element LE1 and the second light emitting element LE2 adjacent to each other in the first diagonal direction DD1 may be different from the second diagonal distance DG2 between the third light emitting element LE3 and the fourth light emitting element LE4 adjacent to each other in the first diagonal direction DD1. The third diagonal distance DG3 between the second light emitting element LE2 and the third light emitting element LE3 adjacent to each other in the second diagonal direction DD2 may be different from the fourth diagonal distance DG4 between the first light emitting element LE1 and the fourth light emitting element LE4 adjacent to each other in the second diagonal direction DD2.

In one or more embodiments in which the first diameter WE1 of the first light emitting element LE1 is greater than the third diameter WE3 of the third light emitting element LE3, the first diagonal distance DG1 may be smaller than the second diagonal distance DG2, and the third diagonal distance DG3 may be greater than the fourth diagonal distance DG4. However, embodiments of the present specification are not limited thereto. The distances between the light emitting elements LE adjacent to each other may also be different depending on the arrangement and diameter of the light emitting elements LE. For example, in one or more embodiments in which the first diameter WE1 of the first light emitting element LE1 is the same as the third diameter WE3 of the third light emitting element LE3, the first diagonal distance DG1 may be the same as the second diagonal distance DG2, and the third diagonal distance DG3 may be the same as the fourth diagonal distance DG4.

In addition, although the distances DA1 through DA4 and DG1 through DG4 between the light emitting elements LE1 through LE4 are defined based on the outside periphery of each of the light emitting elements LE1 through LE4 in FIGS. 19 and 20, embodiments of the present specification are not limited thereto. The description of the distances DA1 through DA4 and DG1 through DG4 between the light emitting elements LE1 through LE4 provided in FIGS. 19 and 20 may also apply equally even when the distances DA1 through DA4 and DG1 through DG4 between the light emitting elements LE1 through LE4 are compared based on the center of each of the light emitting elements LE1 through LE4 as in the embodiment of FIG. 18. In one or more embodiments in which the light emitting elements LE1 through LE4 have different diameters, the distances DA1 through DA4 and DG1 through DG4 between the light emitting elements LE1 through LE4 based on the outside periphery of each of the light emitting elements LE1 through LE4 may be different in magnitude of relationship from the distances DA1 through DA4 and DG1 through DG4 between the light emitting elements LE1 through LE4 based on the center of each of the light emitting elements LE1 through LE4.

In one or more embodiments, the first light emitting area EA1 may emit the first light, the second light emitting area EA2 and the fourth light emitting area EA4 may emit the second light, and the third light emitting area EA3 may emit the third light, but embodiments of the present specification are not limited thereto. For example, the first light emitting area EA1 may emit the first light, the second light emitting area EA2 and the fourth light emitting area EA4 may emit the third light, and the third light emitting area EA3 may emit the second light. In some embodiments, the first light emitting area EA1 may emit the second light, the second light emitting area EA2 and the fourth light emitting area EA4 may emit the first light, and the third light emitting area EA3 may emit the third light.

The first light emitting area EA1, the second light emitting area EA2, the third light emitting area EA3, and the fourth light emitting area EA4 may have a circular planar shape, but embodiments of the present specification are not limited thereto. For example, the first light emitting area EA1, the second light emitting area EA2, the third light emitting area EA3, and the fourth light emitting area EA4 may also have a polygonal shape such as a triangle, a square, a pentagon, a hexagon or an octagon, an oval shape, and/or an irregular shape.

Referring to FIG. 22, the fourth light emitting element LE4 may include a fourth active layer MQW4, and the fourth active layer MQW4 may include a third capping layer ALB3. The structure of the fourth light emitting element LE4 may be the same as the structure of the second light emitting element LE2 described above with reference to FIGS. 11 through 15. For example, the third capping layer ALB3 of the fourth light emitting element LE4 may be provided between a well layer QW and a barrier layer QB. The aluminum content of the third capping layer ALB3 may be the same as the aluminum content of a first capping layer ALB1 of the second light emitting element LE2 and may be smaller than the aluminum content of a second capping layer ALB2 of the third light emitting element LE3. However, embodiments of the present specification are not limited thereto, and all configurations of the first capping layer ALB1 of the second element LE2 described above with reference to FIGS. 11-15 are applicable.

A process of manufacturing a display device 1 according to one or more embodiments will now be described with reference to other drawings.

Figure 23:
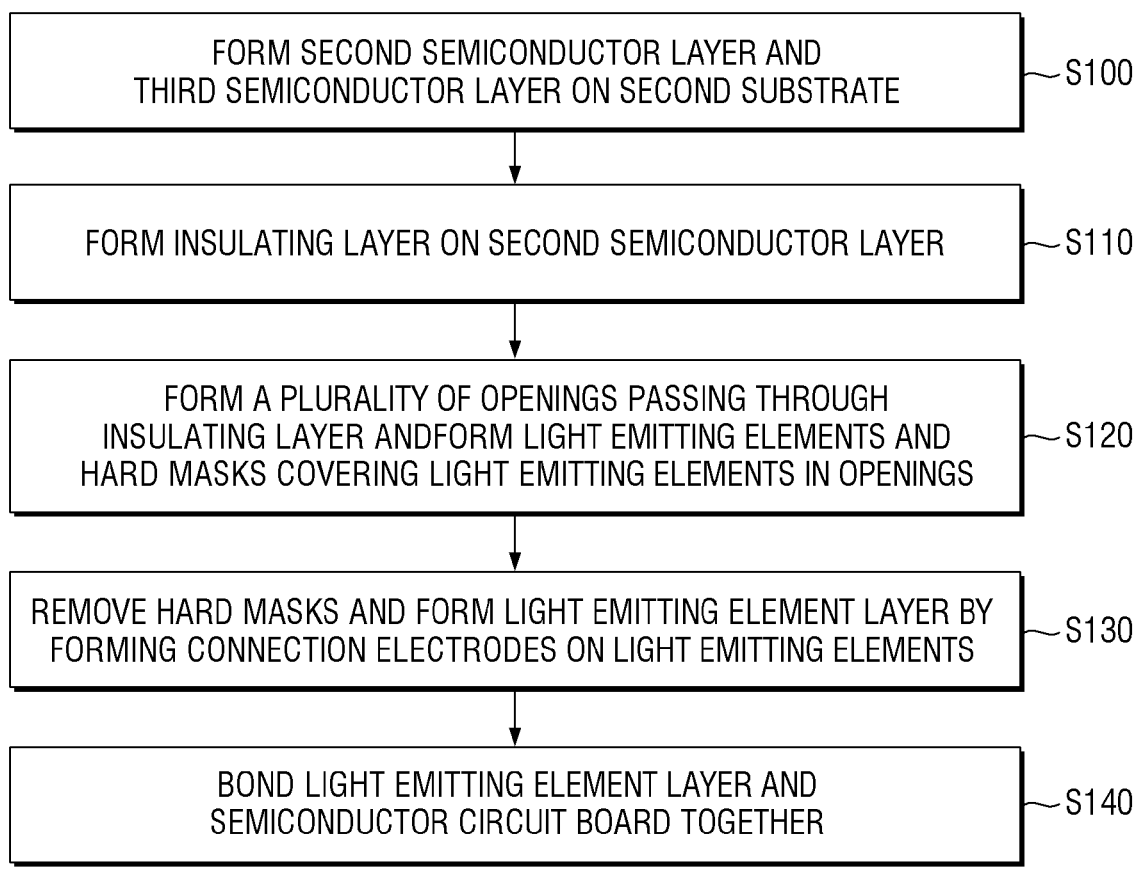
FIG. 23 is a flowchart illustrating a method of manufacturing a display device according to one or more embodiments.
Figure 24:
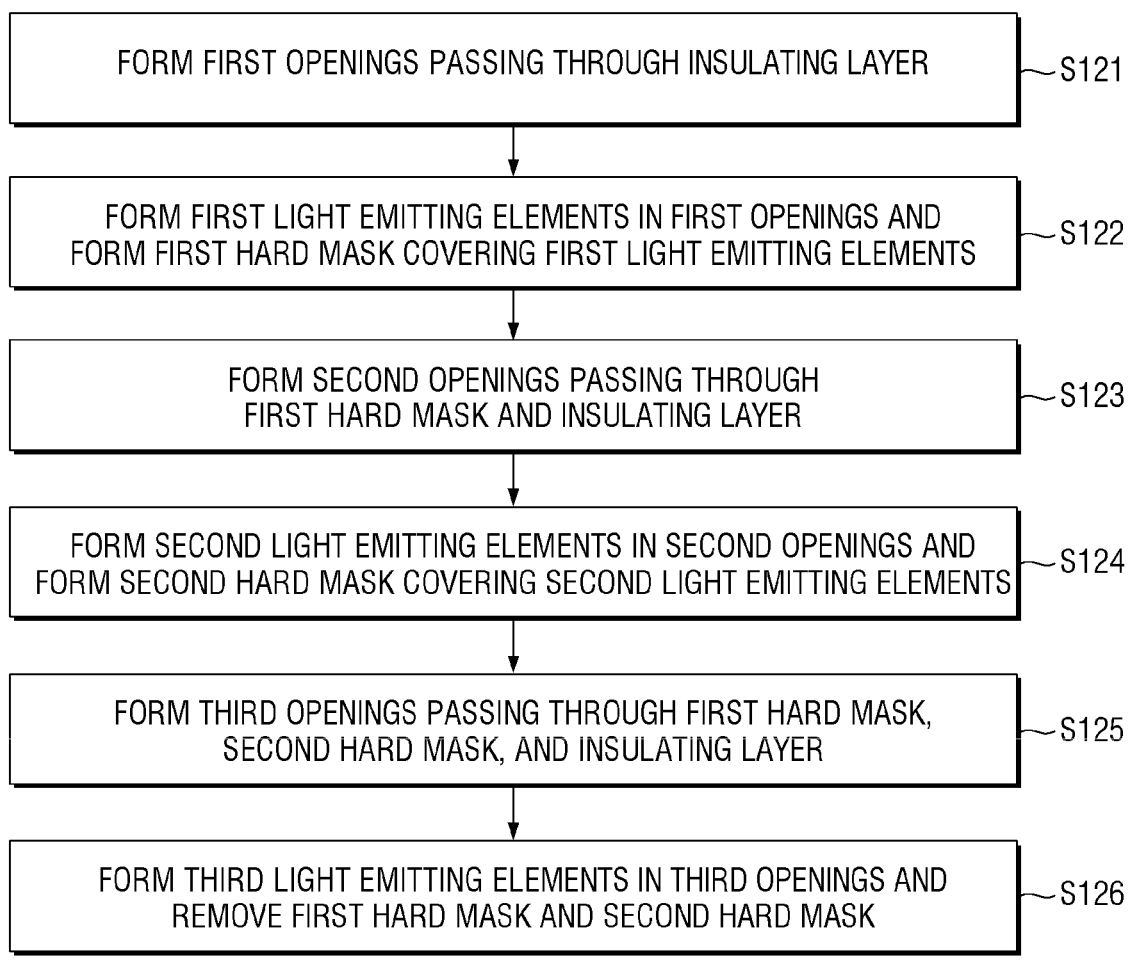
FIG. 24 is a flowchart illustrating an example of a manufacturing method of operation S120 of FIG. 23.

FIG. 23 is a flowchart illustrating a method of manufacturing a display device according to one or more embodiments. FIG. 24 is a flowchart illustrating an example of a manufacturing method of operation S120 of FIG. 23. FIGS. 25-36 are cross-sectional views illustrating the method of manufacturing the display device according to the one or more embodiments.

FIGS. 25-36 are cross-sectional views respectively illustrating structures according to the formation order of each layer of a display panel 10 of a display device 1. FIGS. 25-36 mainly illustrate a process of manufacturing a light emitting element layer 120 and may each correspond to the cross-sectional view of FIG. 8. A method of manufacturing the display panel 10 illustrated in FIGS. 25-36 will now be described in conjunction with FIGS. 23 and 24.

Figure 25:
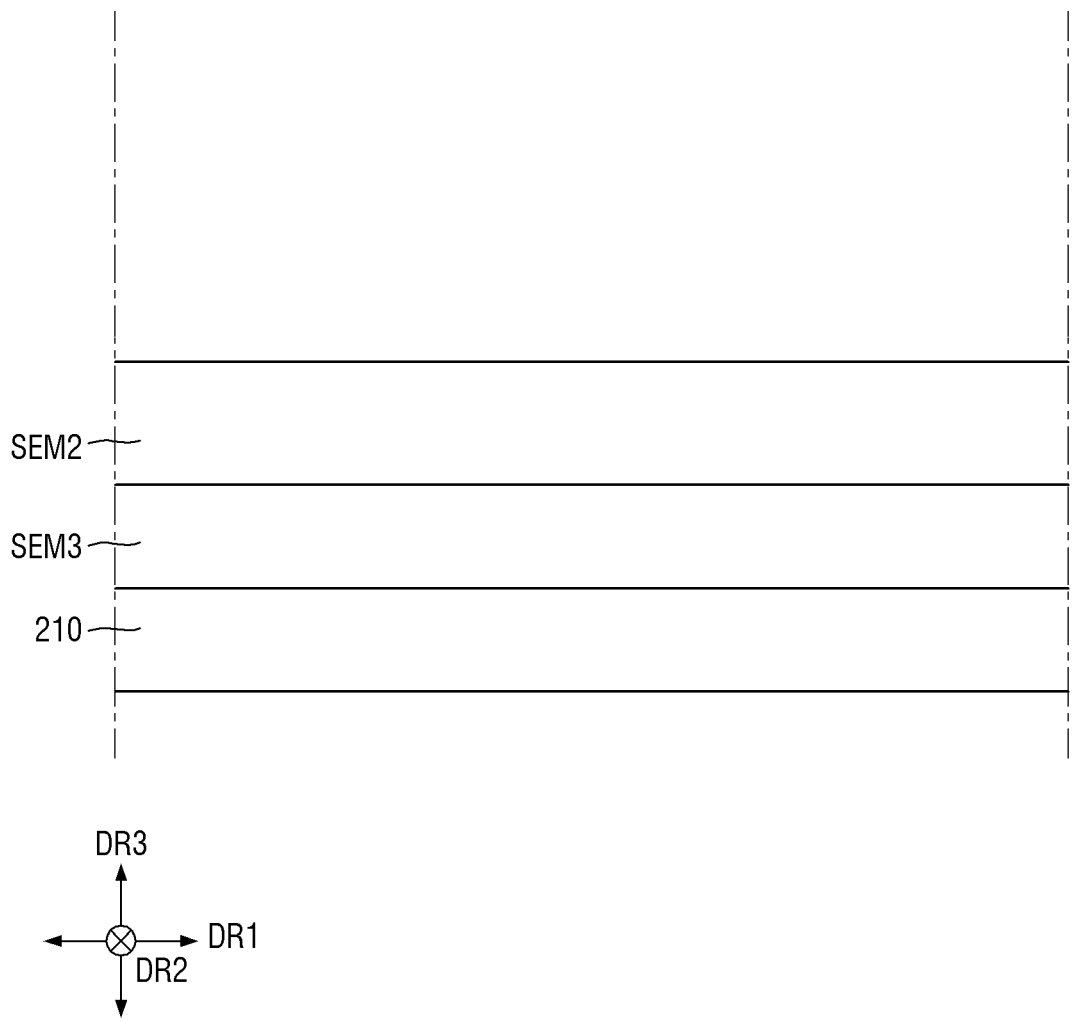
FIGS. 25-36 are cross-sectional views illustrating the method of manufacturing the display device according to the one or more embodiments.

Referring to FIG. 25, a second semiconductor layer SEM2 and a third semiconductor layer SEM3 are formed on a second substrate 210 (operation S100 of FIG. 23).

First, the second substrate 210 is prepared. The second substrate 210 may be a sapphire substrate ($Al_2O_3$) or a silicon wafer including silicon. However, embodiments of the present specification are not limited thereto. In the embodiments, a case where the second substrate 210 is a sapphire substrate will be described as an example.

The second semiconductor layer SEM2 and the third semiconductor layer SEM3 are formed on the second substrate 210. The second semiconductor layer SEM2 and the third semiconductor layer SEM3 may be grown by an epitaxial method and may be formed by growing seed crystals. Here, the semiconductor layers SEM2 and SEM3 may be formed by electron beam deposition, physical vapor deposition (PVD), chemical vapor deposition (CVD), plasma laser deposition (PLD), dual-type thermal evaporation, sputtering, and/or metal organic chemical vapor deposition (MOCVD). For example, the semiconductor layers SEM2 and SEM3 may be formed by MOCVD, but embodiments of the present specification are not limited thereto.

A precursor material for forming the second semiconductor layer SEM2 and the third semiconductor layer SEM3 is not particularly limited within a range of suitable materials that can be selected to form a target material. For example, the precursor material may be a metal precursor including an alkyl group such as a methyl group and/or an ethyl group. For example, the precursor material may be, but is not limited to, a compound such as trimethyl gallium ($Ga(CH_3)_3$), trimethyl aluminum ($Al(CH_3)_3$), and/or triethyl phosphate ($(C_2H_5)_3PO_4$).

The third semiconductor layer SEM3 is formed on the second substrate 210. Although a single third semiconductor layer SEM3 is stacked in the drawing, embodiments of the present specification are not limited thereto, and a plurality of layers may also be formed. The third semiconductor layer SEM3 may be provided to reduce a difference in lattice constant between the second semiconductor layer SEM2 and the second substrate 210. For example, the third semiconductor layer SEM3 may include an undoped semiconductor and may be a material not doped to an n-type or p-type conductivity. In an embodiment, the third semiconductor layer SEM3 may be, but is not limited to, at least any one of undoped InAlGaN, GaN, AlGaN, InGaN, AlN, or InN.

Figure 26:
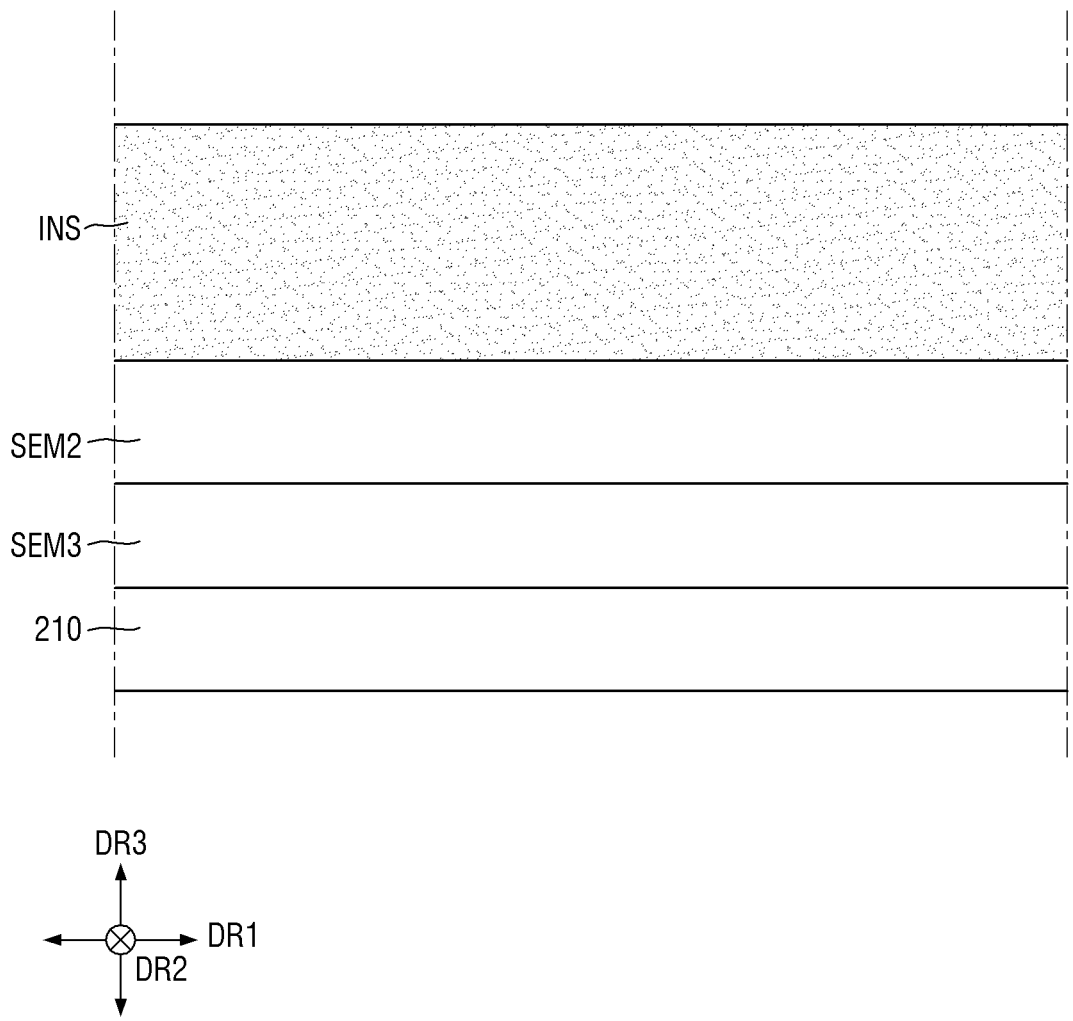

Next, referring to FIG. 26, an insulating layer INS is formed on the second semiconductor layer SEM2 (operation S110 of FIG. 23).

The insulating layer INS may be entirely formed on the second semiconductor layer SEM2. The insulating layer INS may include an insulating material such as silicon oxide ($SiO_x$), silicon nitride ($SiN_x$), and/or silicon oxynitride ($SiO_xN_y$), and may function as a mask in a process for forming light emitting elements LE.

Figure 27:
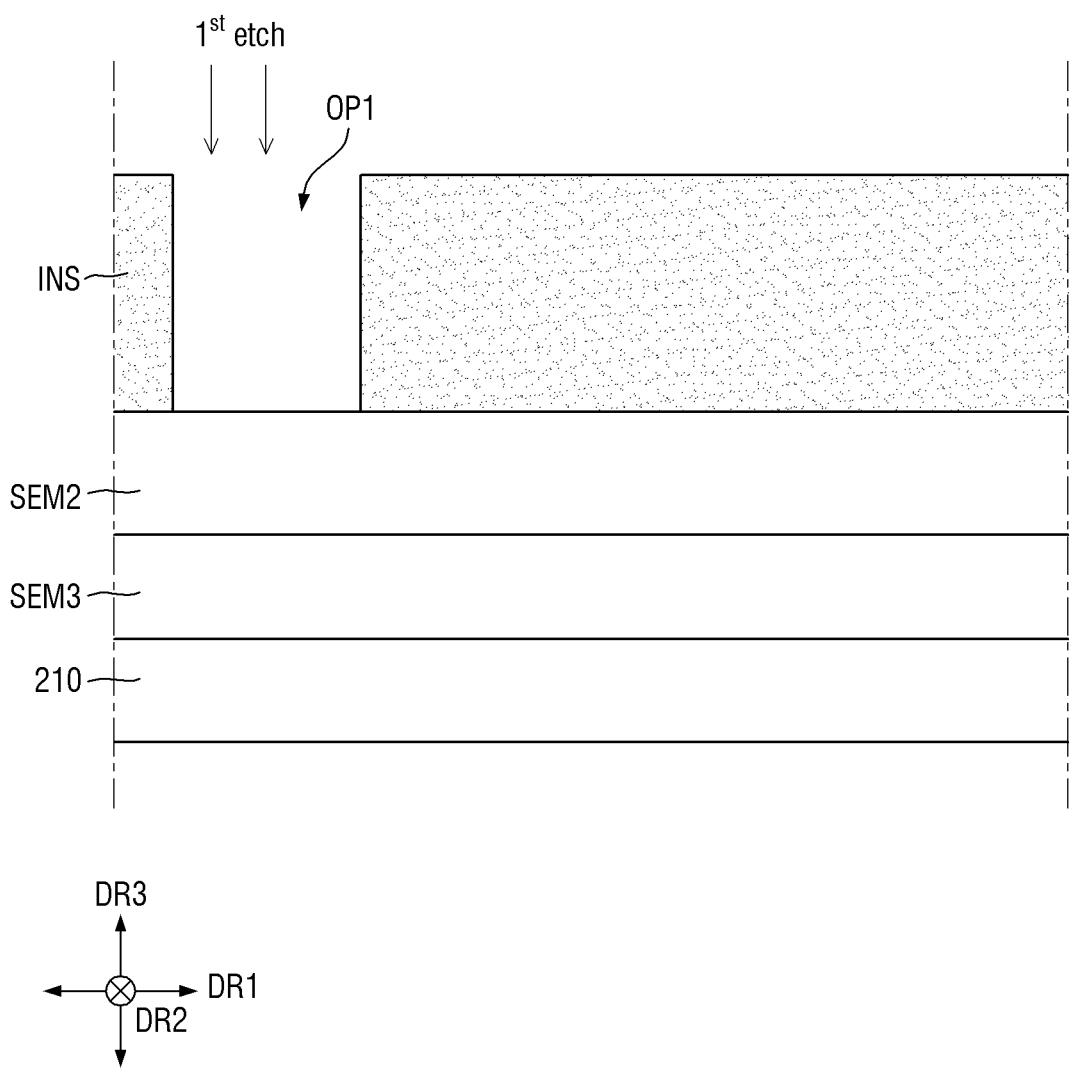

Next, referring to FIG. 27, a plurality of openings passing through the insulating layer INS are formed to form the light emitting elements LE, and hard masks HK1 and HK2 covering the light emitting elements LE in the openings are formed (operation S120 of FIG. 23).

For example, a plurality of first openings OP1 exposing the second semiconductor layer SEM2 are formed by etching the insulating layer INS (a first etching process, operation S121 of FIG. 24). The first openings OP1 are formed to be spaced apart from each other. First light emitting elements LE1 are formed in the first openings OP1. A width W1 of each of the first openings OP1 may be greater than those of other openings formed in a subsequent process.

Figure 28:
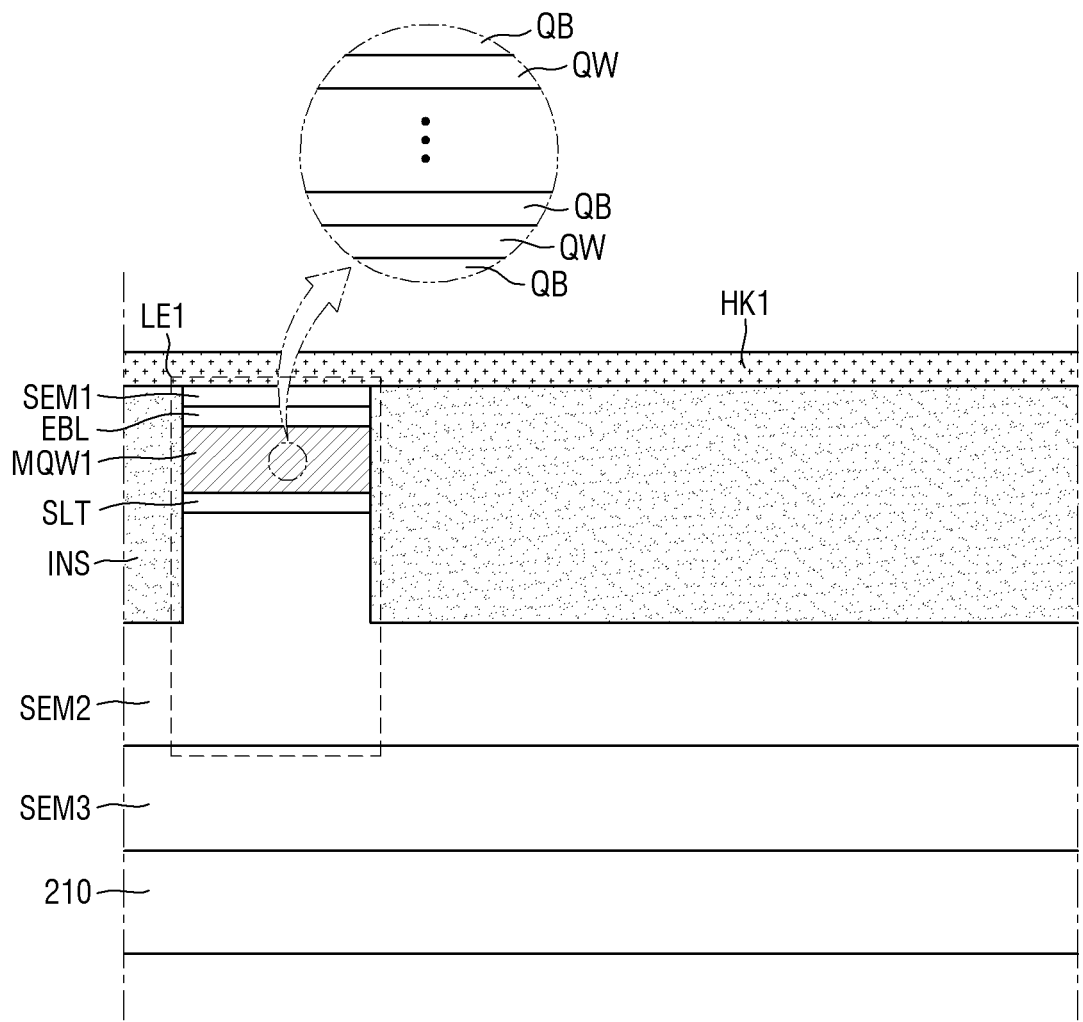

Next, referring to FIG. 28, the first light emitting elements LE1 are formed in the first openings OP1, and a first hard mask HK1 covering the first light emitting elements LE1 is formed (operation S122 of FIG. 24).

The process of forming the first light emitting elements LE1 may be performed through an epitaxial growth method like the process of forming the second semiconductor layer SEM2 and the third semiconductor layer SEM3. When an upper surface of the second semiconductor layer SEM2 is exposed by the first openings OP1, semiconductor crystals are grown by injecting a precursor material onto the second semiconductor layer SEM2. The second semiconductor layer SEM2 may be continuously grown by the precursor material.

Next, a superlattice layer SLT, a first active layer MQW1, an electron blocking layer EBL, and a first semiconductor layer SEM1 are sequentially grown to form each of the first light emitting elements LE1. The first light emitting elements LE1, each having the first active layer MQW1, are formed in the current process, and light emitting elements LE2 and LE3 including second and third active layers MQW2 and MQW3 may be formed in subsequent repeated processes. The first active layer MQW1 of each of the first light emitting elements LE1 may be formed by alternately repeating a plurality of well layers QW and a plurality of barrier layers QB.

Next, the first hard mask HK1 covering the first light emitting elements LE1 is formed. The first hard mask HK1 may include an insulating material such as silicon oxide ($SiO_x$), silicon nitride ($SiN_x$) and/or silicon oxynitride ($SiO_xN_y$), and may include the same material as the insulating layer INS described above. However, embodiments of the present specification are not limited thereto. The first hard mask HK1 may be a protective layer and/or a barrier layer that protects the first light emitting elements LE1.

Figure 29:
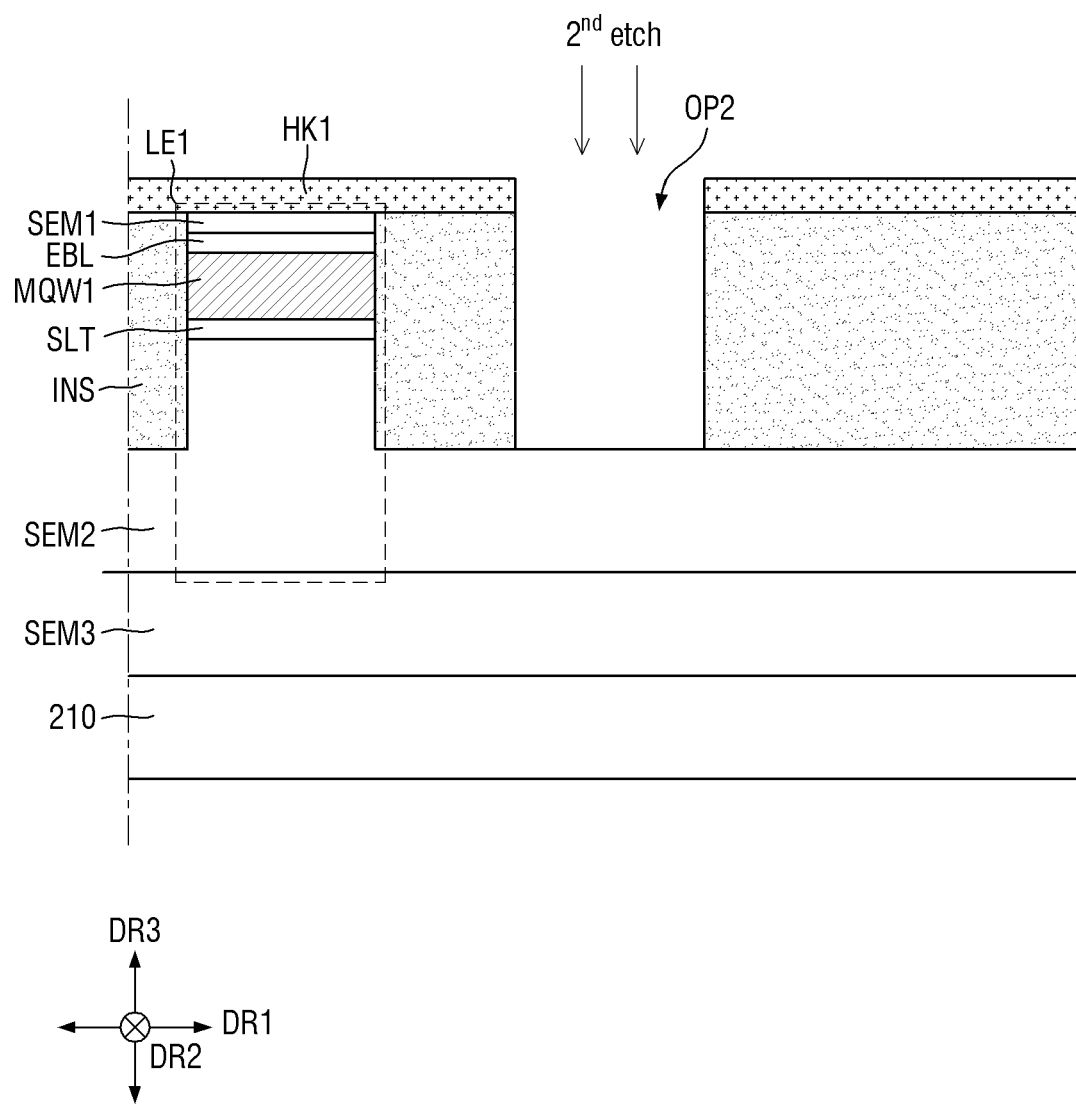

Next, referring to FIG. 29, a plurality of second openings OP2 passing through the first hard mask HK1 and the insulating layer INS are formed (operation S123 of FIG. 24).

For example, the second openings OP2 exposing the second semiconductor layer SEM2 are formed by etching the first hard mask HK1 and the insulating layer INS (a second etching process). The second openings OP2 are provided adjacent to the first openings OP1 and are spaced apart from each other.

Figure 30:
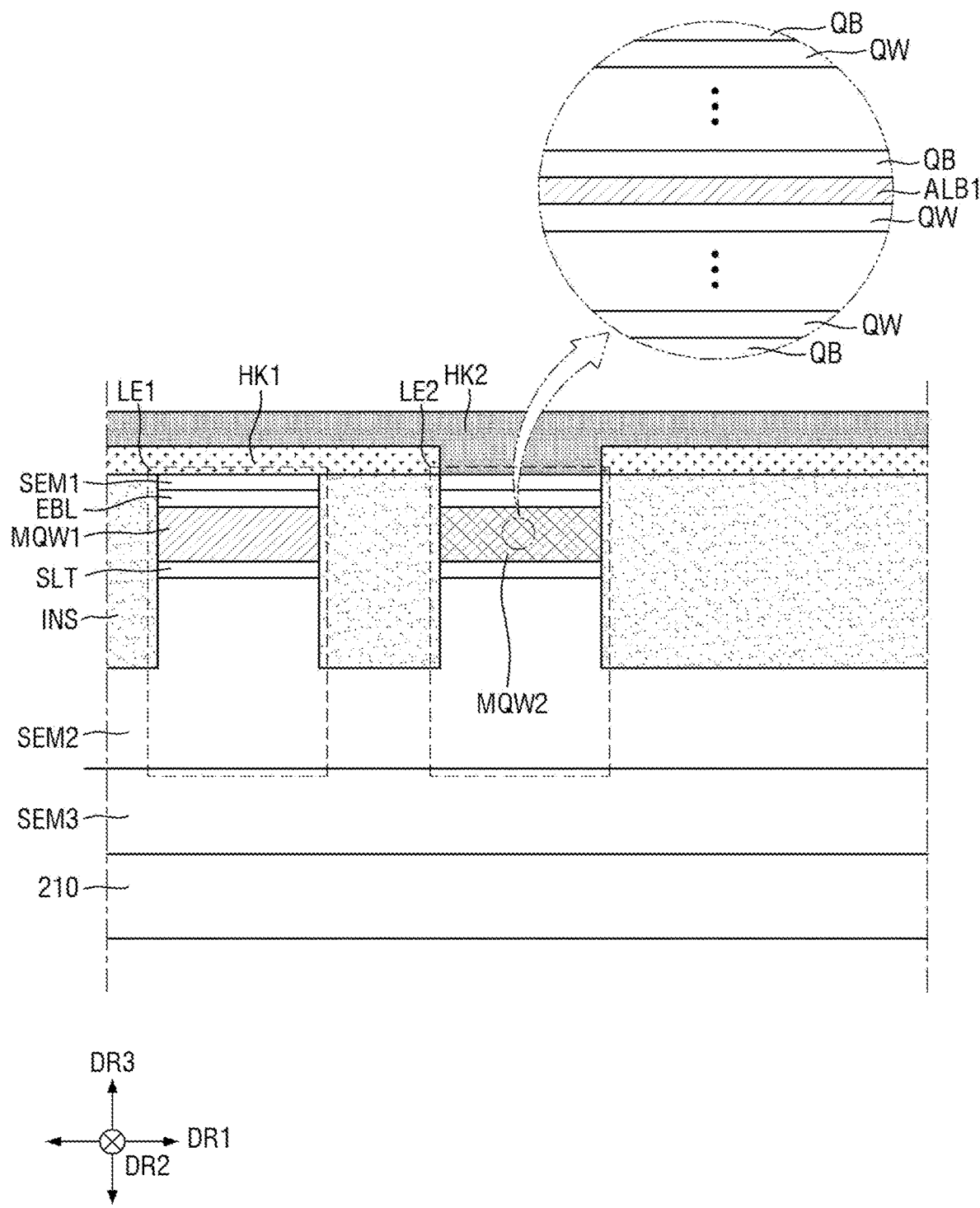

Next, referring to FIG. 30, second light emitting elements LE2 are formed in the second openings OP2, and a second hard mask HK2 covering the second light emitting elements LE2 is formed (operation S124 of FIG. 24).

To form the second light emitting elements LE2, semiconductor crystals are grown by injecting a precursor material onto the upper surface of the second semiconductor layer SEM2 exposed by the second openings OP2. The second semiconductor layer SEM2 may be continuously grown by the precursor material. Then, a superlattice layer SLT, a second active layer MQW2, an electron blocking layer EBL, and a first semiconductor layer SEM1 are sequentially grown to form each of the second light emitting elements LE2. The second active layer MQW2 may be formed to have a different structure from the first active layer MQW1 of each of the first light emitting elements LE1 described above. For example, the second active layer MQW2 may further include a first capping layer ALB1 formed between a well layer QW and a barrier layer QB.

Next, the second hard mask HK2 covering the second light emitting elements LE2 and the first hard mask HK1 is formed. The second hard mask HK2 may include an insulating material such as silicon oxide ($SiO_x$), silicon nitride ($SiN_x$) and/or silicon oxynitride ($SiO_xN_y$), and may include the same material as the first hard mask HK1 described above.

Figure 31:
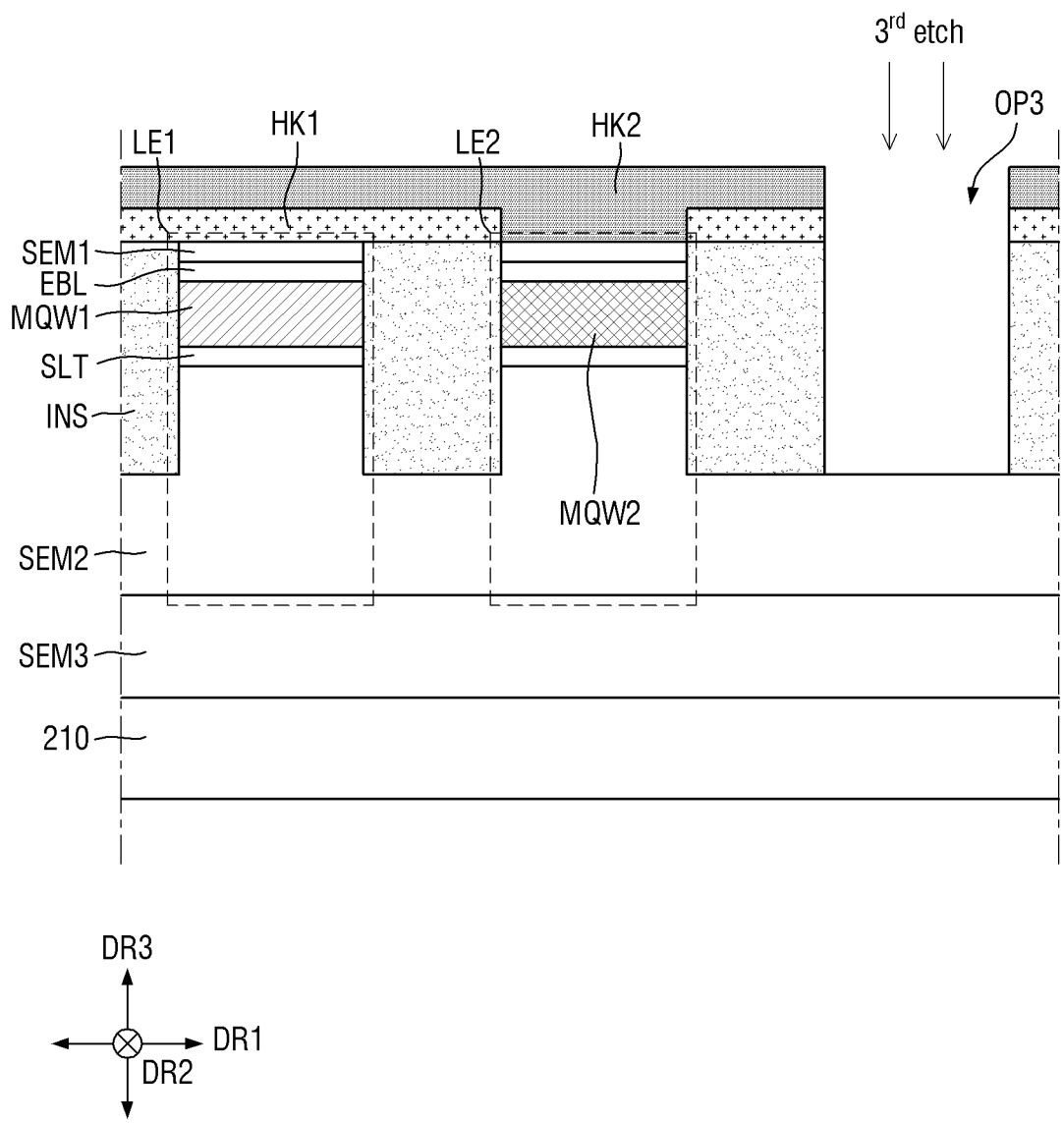

Next, referring to FIG. 31, a plurality of third openings OP3 passing through the first hard mask HK1, the second hard mask HK2 and the insulating layer INS are formed (operation S125 of FIG. 24).

For example, the third openings OP3 exposing the second semiconductor layer SEM2 are formed by etching the first hard mask HK1, the second hard mask HK2 and the insulating layer INS (a third etching process). The third openings OP3 are provided adjacent to the first openings OP1 and the second openings OP2 and are spaced apart from each other.

Figure 32:
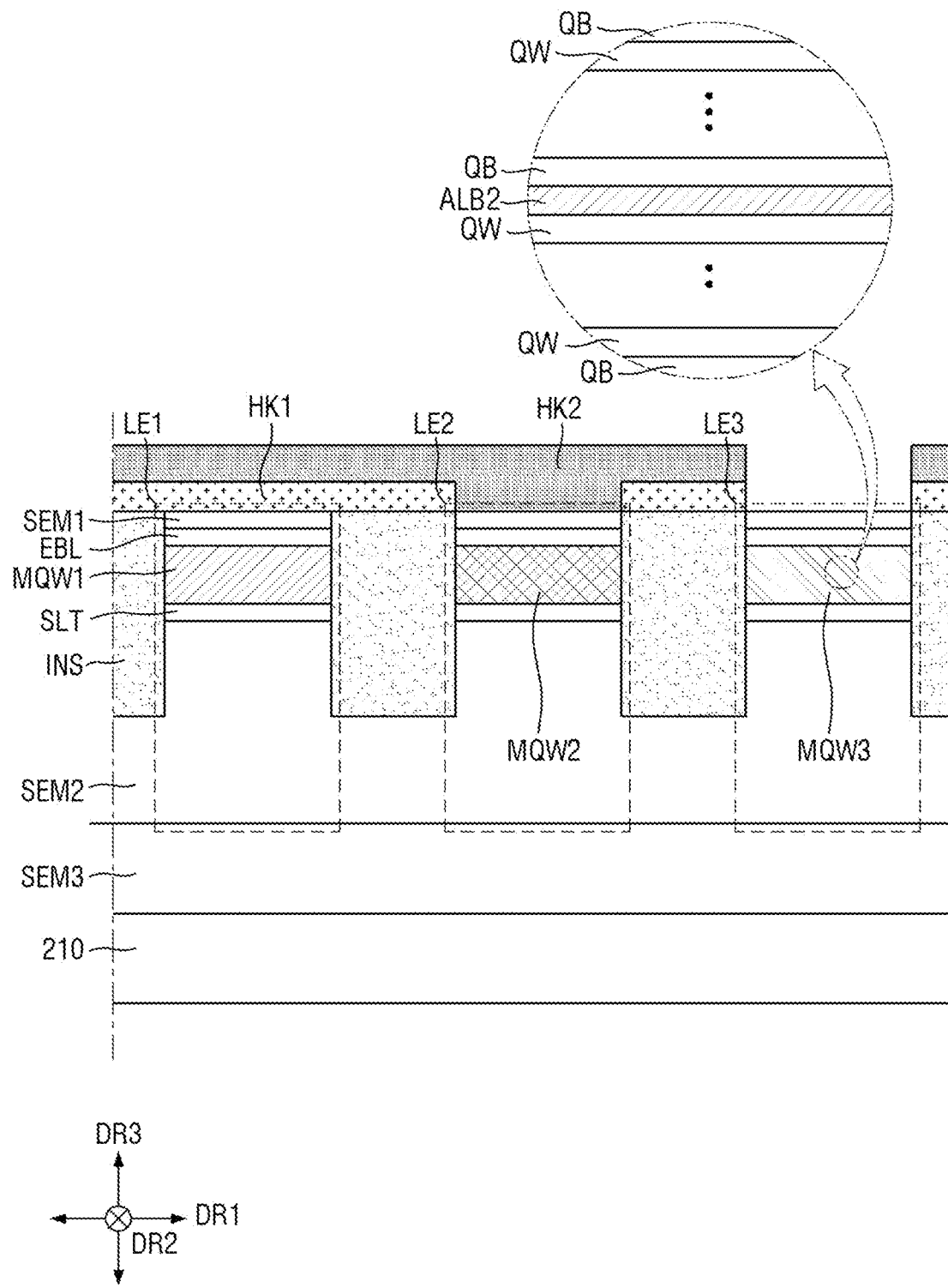

Next, referring to FIG. 32, third light emitting elements LE3 are formed in the third openings OP3, and the first hard mask HK1 and the second hard mask HK2 are removed (operation S126 of FIG. 24).

To form the third light emitting elements LE3, semiconductor crystals are grown by injecting a precursor material onto the upper surface of the second semiconductor layer SEM2 exposed by the third openings OP3. The second semiconductor layer SEM2 may be continuously grown by the precursor material. Then, a superlattice layer SLT, a third active layer MQW3, an electron blocking layer EBL, and a first semiconductor layer SEM1 are sequentially grown to form each of the third light emitting elements LE3. The third active layer MQW3 may be formed to have a different structure from the first active layer MQW1 of each of the first light emitting elements LE1 described above. For example, the third active layer MQW3 may further include a second capping layer ALB2 formed between a well layer QW and a barrier layer QB. The second capping layer ALB2 may be formed to have a different composition from the first capping layer ALB1 of each of the second light emitting elements LE2. For example, the aluminum content of the second capping layer ALB2 may be greater than the aluminum content of the first capping layer ALB1.

Next, the first hard mask HK1 and the second hard mask HK2 are removed. As the first hard mask HK1 and the second hard mask HK2 are removed, a surface of the first semiconductor layer SEM1 of each of the light emitting elements LE1 through LE3 may be exposed outside the insulating layer INS. For example, the surface (e.g., upper surface) of the first semiconductor layer SEM1 of each of the light emitting elements LE1 through LE3 may be aligned with a surface (e.g., upper surface) of the insulating layer INS.

The process of removing the first hard mask HK1 and the second hard mask HK2 may be performed through an etching process. The etching process may be dry etching, wet etching, reactive ion etching (RIE), deep reactive ion etching (DRIE), inductively coupled plasma reactive ion etching (ICP-RIE), and/or the like.

Figure 33:
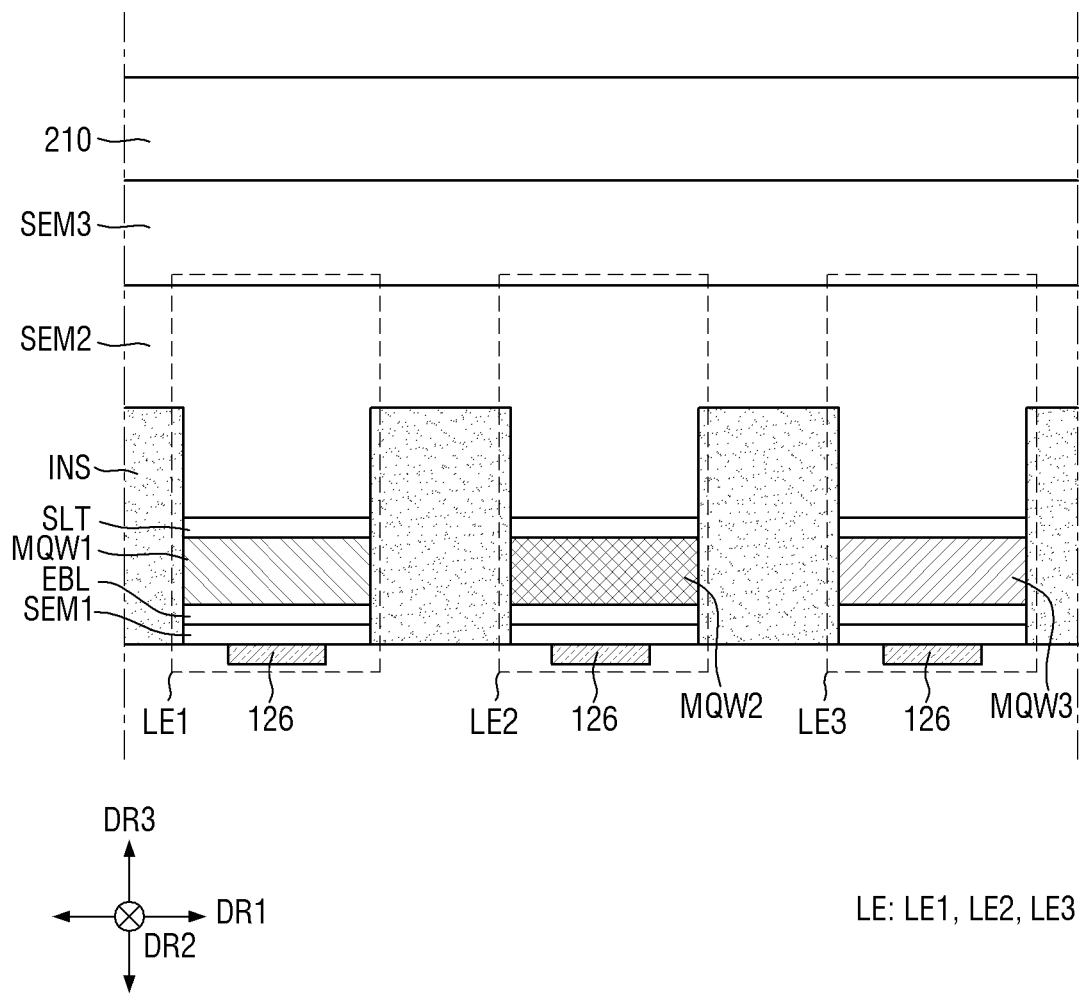

Next, referring to FIG. 33, the light emitting element layer 120 is formed by forming connection electrodes 126 on the light emitting elements LE1 through LE3, respectively (operation S130 of FIG. 23).

The connection electrodes 126 may be directly formed on the first semiconductor layers SEM1 of the light emitting elements LE1 through LE3 through a photo process (e.g., a photolithography process). Through the above process, the light emitting element layer 120 provided on the second substrate 210 may be manufactured.

Figure 34:
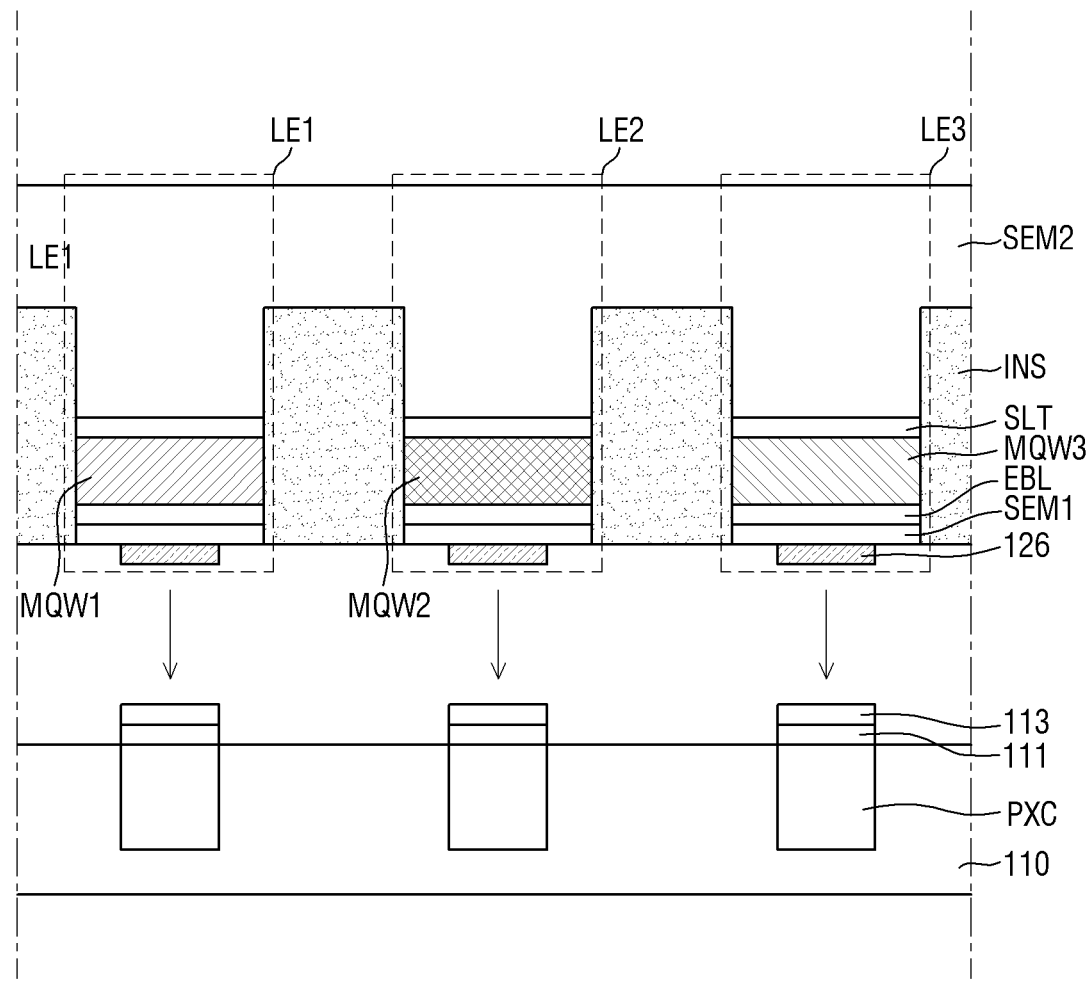

Next, referring to FIG. 34, the light emitting element layer 120 and a semiconductor circuit board 100 are bonded together (operation S140 of FIG. 23).

First, the semiconductor circuit board 100 is prepared. The semiconductor circuit board 100 may include a plurality of pixel circuit units PXC, pixel electrodes 111, and contact electrodes 113 on a first substrate 110.

For example, the pixel electrodes 111 are formed on the first substrate 110 in which the pixel circuit units PXC are formed. Then, a contact electrode material layer is stacked on the pixel electrodes 111 and etched to form the contact electrodes 113. The contact electrode material layer may include gold (Au), copper (Cu), aluminum (Al), and/or tin (Sn).

Next, after the light emitting element layer 120 is aligned on the semiconductor circuit board 100, the semiconductor circuit board 100 and the light emitting element layer 120 are bonded together.

For example, the contact electrodes 113 of the semiconductor circuit board 100 and the connection electrodes 126 of the light emitting element layer 120 are brought into contact with each other. Then, the contact electrodes 113 and the connection electrodes 126 are fusion bonded with set or predetermined heat to bond the semiconductor circuit board 100 and the light emitting element layer 120 together.

Figure 35:
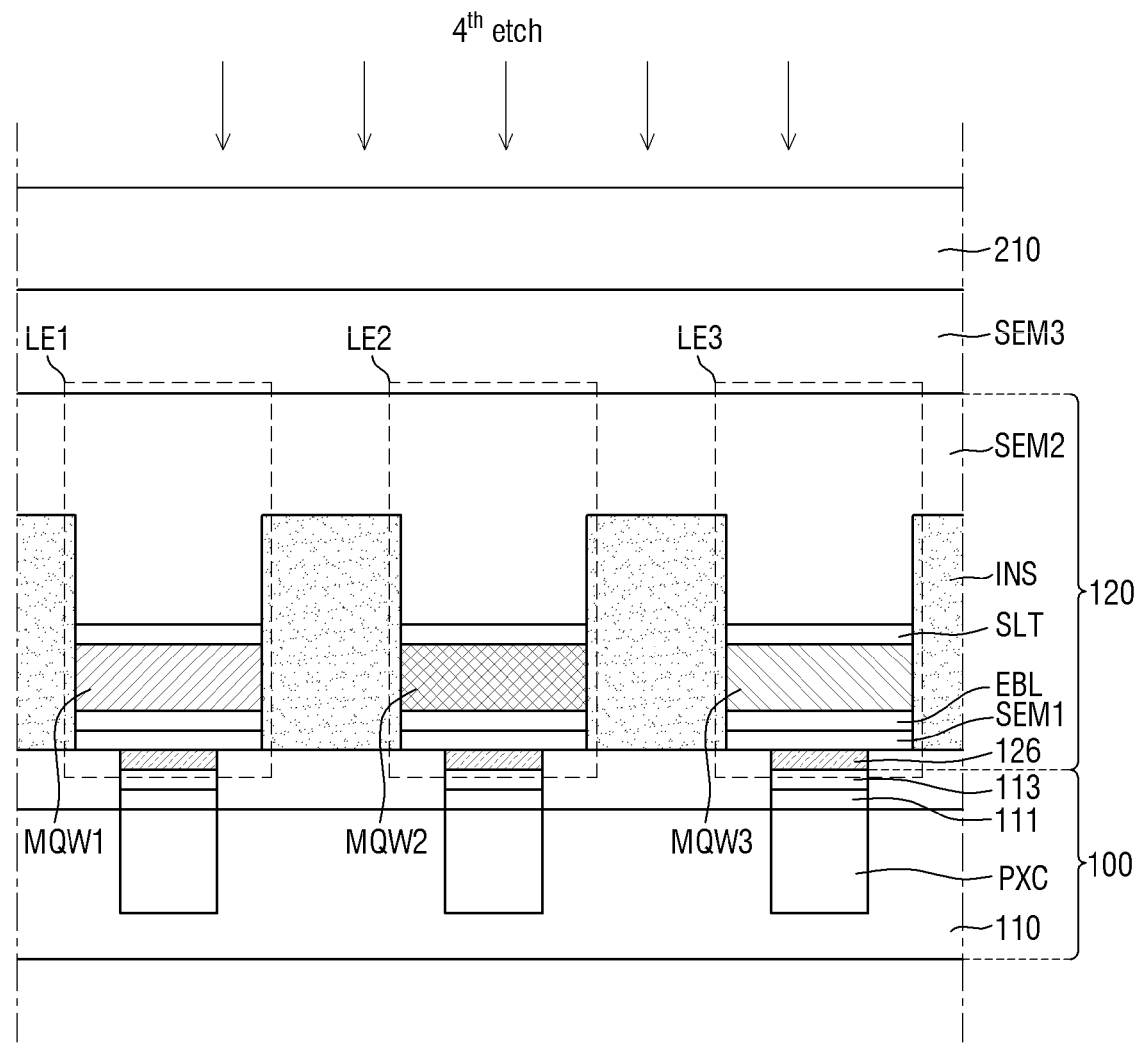
Figure 36:
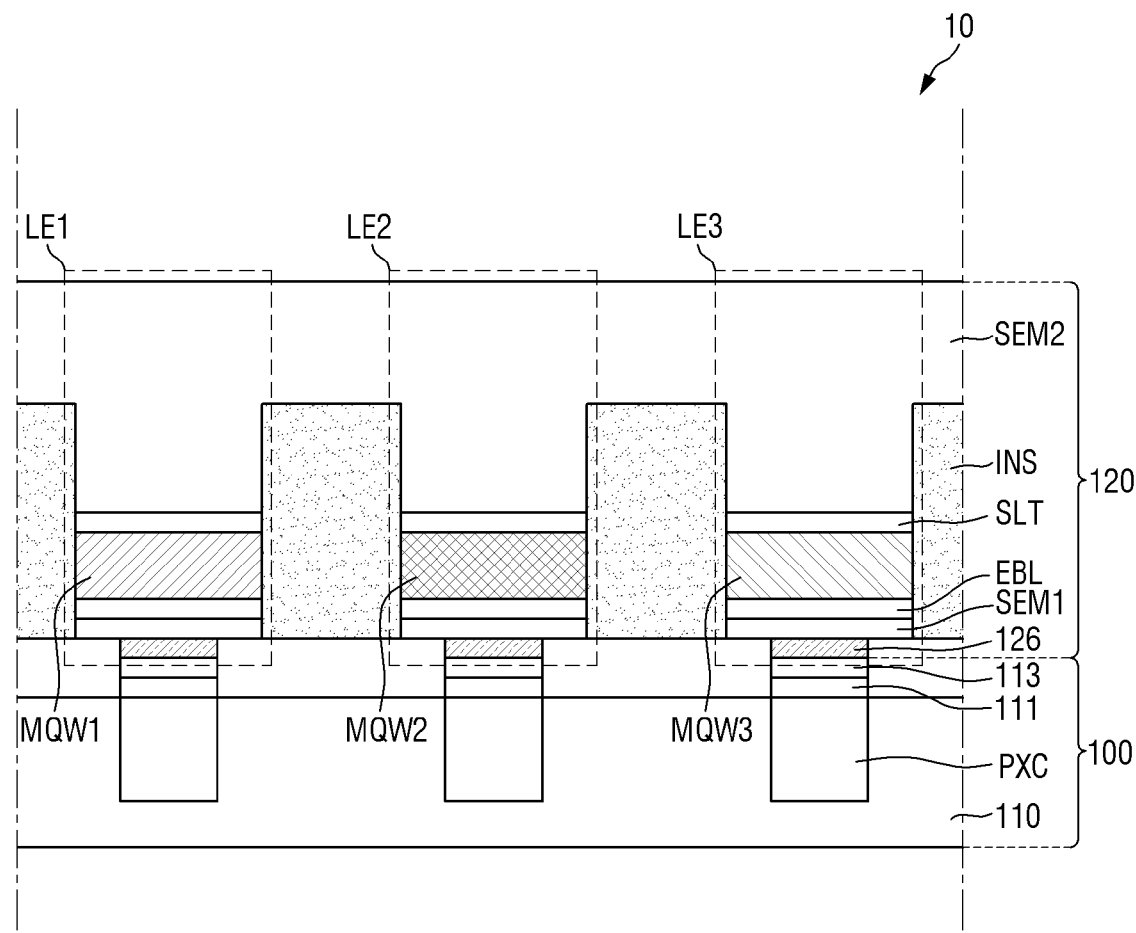

Next, referring to FIGS. 35 and 36, the second substrate 210 and the third semiconductor layer SEM3 of the light emitting element layer 120 are removed by etching (a fourth etching process) to manufacture the display device according to the current embodiments. The second substrate 210 and the third semiconductor layer SEM3 may be removed by chemical mechanical polishing (CMP) and/or one of the above-described etching methods.

As described above, in a display device 1 according to embodiments, a capping layer ALB is formed in an active layer MQW of each of second light emitting elements LE2 and third light emitting elements LE3 whose driving voltages are relatively lower than the driving voltage of first light emitting elements LE1. Therefore, the driving voltages of the second light emitting elements LE2 and the third light emitting elements LE3 may be increased to be similar to the driving voltage of the first light emitting elements LE1. Accordingly, the circuit configuration for driving each light emitting element LE can be simplified.

In addition, in the display device 1 according to the embodiments, each capping layer ALB may be provided on a well layer QW to prevent or reduce the diffusion of indium of the well layer QW out of the well layer QW in a high-temperature process for growing a barrier layer QB, thereby preventing or reducing a decrease in luminous efficiency of the light emitting elements LE. In addition, because each capping layer ALB preventing or reducing the diffusion of indium of the well layer QW enables the barrier layer QB to grow at a high temperature, film formation characteristics of the barrier layer QB can be improved.

In the display device 1 according to the embodiments, each capping layer ALB may compensate compressive stress applied to the well layer QW with its tensile stress, to compensate for deformation of the light emitting elements LE.

Figure 37:
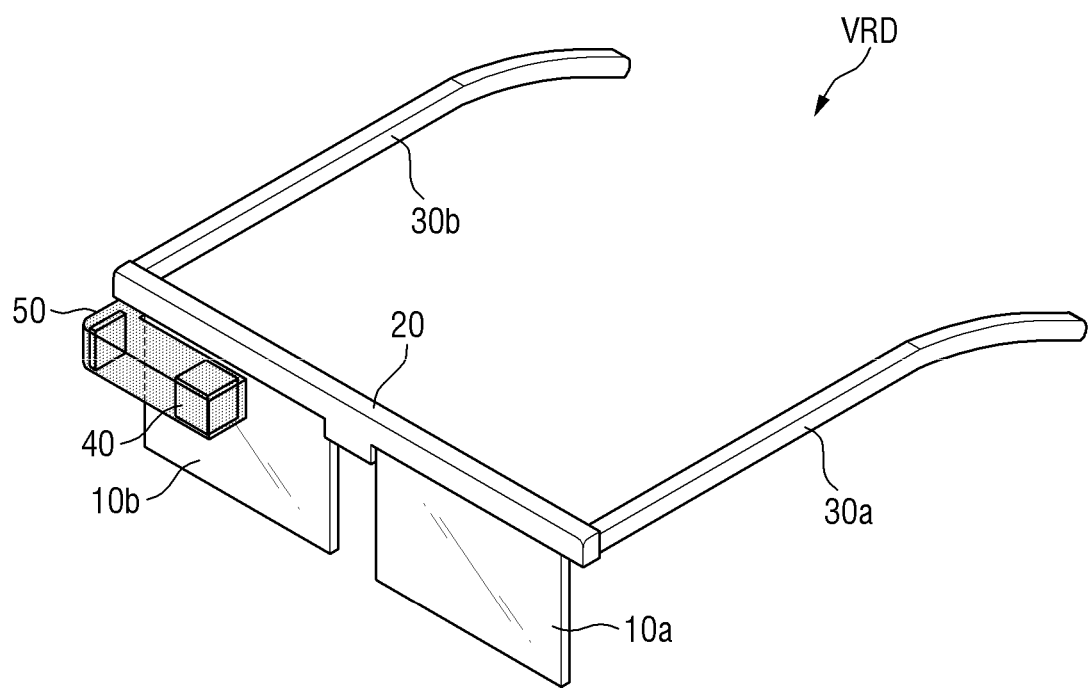
FIG. 37 is an example view of a virtual reality (VR) device including a display device according to one or more embodiments.

FIG. 37 is an example view of a virtual reality (VR) device including a display device according to one or more embodiments. FIG. 37 illustrates a VR device VRD to which a display device 1 according to one or more embodiments is applied.

Referring to FIG. 37, the VR device VRD according to one or more embodiments may be a device in the form of glasses. The VR device VRD according to the embodiment may include the display device 1, a left lens 10a, a right lens 10b, a support frame 20, eyeglass frame legs 30a and 30b, a reflective member 40, and a display device accommodating unit 50.

In FIG. 37, the VR device VRD including the eyeglass frame legs 30a and 30b is illustrated as an example. However, the VR device VRD according to the embodiment may also be applied to a head-mounted display including a head-mounted band, which can be mounted on the head, instead of the eyeglass frame legs 30a and 30b. The VR device VRD according to the embodiment is not limited to the structure illustrated in FIG. 37 and can be applied in various forms in various other electronic devices.

The display device accommodating unit 50 may include the display device 1 and the reflective member 40. An image displayed on the display device 1 may be reflected by the reflective member 40 and provided to a user's right eye through the right lens 10b. Accordingly, the user may view a VR image displayed on the display device 1 through the right eye.

Although the display device accommodating unit 50 is provided at a right end of the support frame 20 in FIG. 37, embodiments of the present specification are not limited thereto. For example, the display device accommodating unit 50 may also be provided at a left end of the support frame 20. In this case, an image displayed on the display device 1 may be reflected by the reflective member 40 and provided to the user's left eye through the left lens 10a. Accordingly, the user may view a VR image displayed on the display device 1 through the left eye. In some embodiments, the display device accommodating unit 50 may be provided at both the right end and the left end of the support frame 20. In this case, the user may view a VR image displayed on the display device 1 through both the left eye and the right eye.

Figure 38:
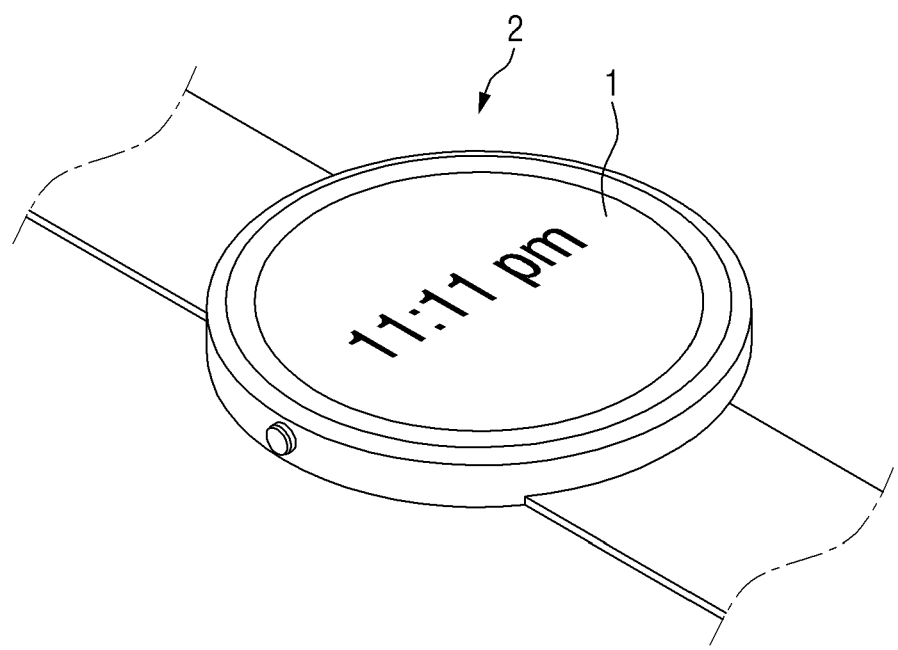
FIG. 38 is an example view of a smart device including a display device according to one or more embodiments.

FIG. 38 is an example view of a smart device including a display device according to one or more embodiments.

Referring to FIG. 38, a display device 1 according to one or more embodiments may be applied to a smart watch 2 which is one of smart devices.

Figure 39:
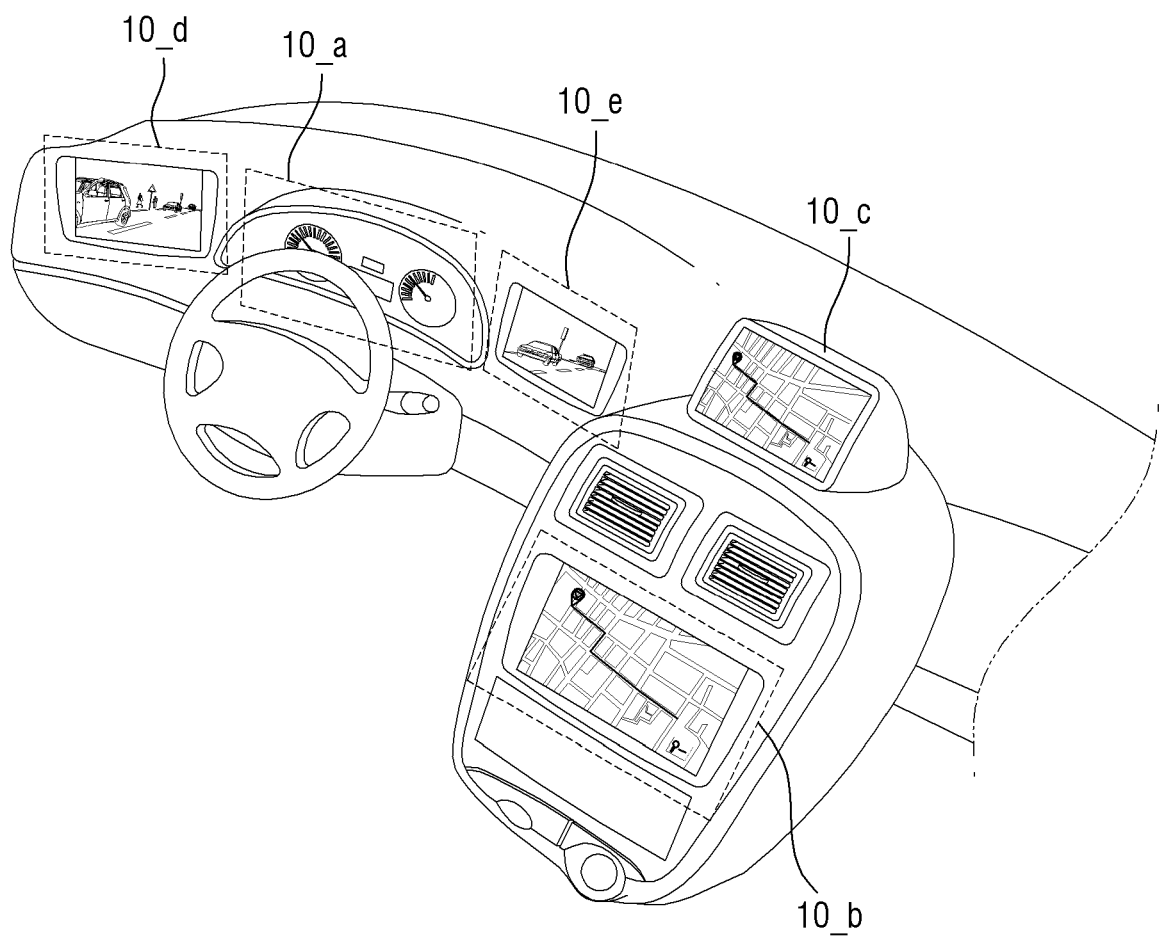
FIG. 39 is an example view of a vehicle including display devices according to one or more embodiments.

FIG. 39 is an example view of a vehicle including display devices according to one or more embodiments. FIG. 39 illustrates a vehicle to which display devices according to one or more embodiments are applied.

Referring to FIG. 39, display devices 10_a through 10_c according to one or more embodiments may be applied to a dashboard of the vehicle, a center fascia of the vehicle, and/or a center information display (CID) provided on the dashboard of the vehicle. In addition, display devices 10_d and 10_e according to one or more embodiments may be applied to room mirror displays that replace side mirrors of the vehicle.

Figure 40:
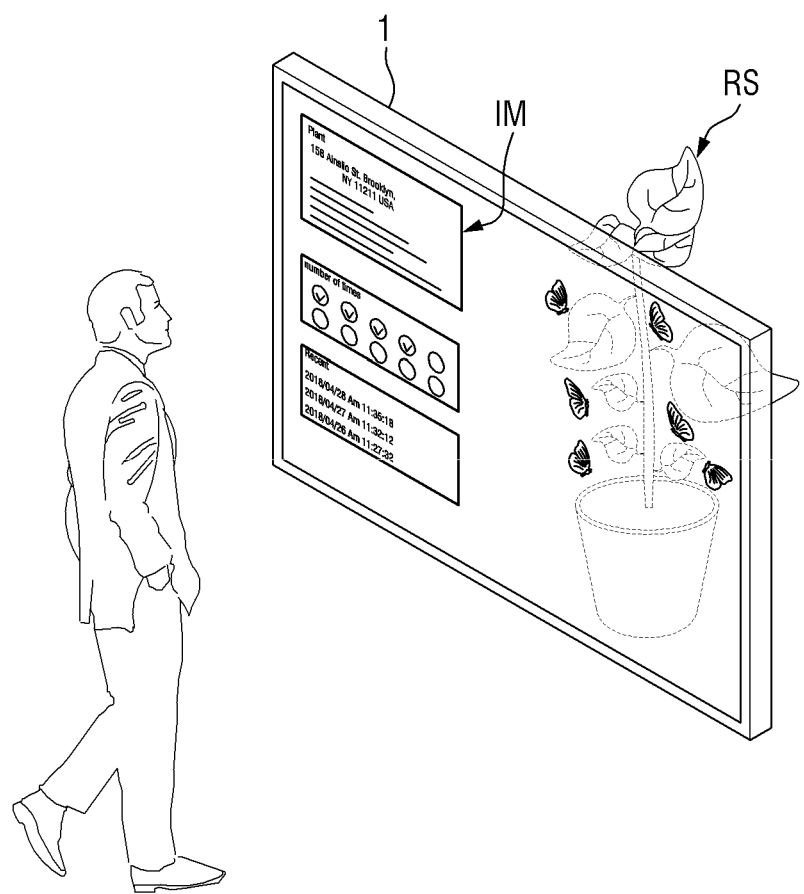
FIG. 40 is an example view of a transparent display device including a display device according to one or more embodiments.

FIG. 40 is an example view of a transparent display device including a display device 1 according to one or more embodiments.

Referring to FIG. 40, the display device 1 according to the embodiment may be applied to a transparent display device. The transparent display device may transmit light while displaying an image IM. A user located in front of the transparent display device may not only view the image IM displayed on the display device 1 but also view an object RS or the background located behind the transparent display device. When the display device 1 is applied to a transparent display device, the semiconductor circuit board 100 of the display device 1 illustrated in FIG. 4 may include a light transmitting part capable of transmitting light or may be made of a suitable material capable of transmitting light.

In a display device according to embodiments, a capping layer is formed in an active layer of each of a second light emitting element and a third light emitting element whose driving voltages are relatively lower than the driving voltage of a first light emitting element. Therefore, the driving voltages of the second light emitting element and the third light emitting element may be increased to be similar to the driving voltage of the first light emitting element. Accordingly, the circuit configuration for driving each light emitting element can be simplified.

In addition, in the display device according to the embodiments, each capping layer may be provided on a well layer to prevent or reduce the diffusion of indium of the well layer out of the well layer in a high-temperature process for growing a barrier layer, thereby preventing or reducing a decrease in luminous efficiency of the light emitting elements. In addition, because each capping layer preventing or reducing the diffusion of indium of the well layer enables the barrier layer to grow at a high temperature, film formation characteristics of the barrier layer can be improved.

In addition, in the display device according to the embodiments, each capping layer may compensate compressive stress applied to the well layer with its tensile stress to compensate for deformation of the light emitting elements.

However, the effects of the present disclosure are not restricted to the one set forth herein. The above and other effects of the present disclosure will become more apparent to one of daily skill in the art to which the present disclosure pertains by referencing the claims.

In concluding the detailed description, those skilled in the art will appreciate that many variations and modifications can be made to the embodiments disclosed herein without substantially departing from the principles of the present disclosure as set forth in the following claims and their equivalents. Therefore, the disclosed embodiments of the disclosure are used in a generic and descriptive sense only and not for purposes of limitation.

What is claimed is:

1. A display device comprising:
    a plurality of pixel electrodes on a substrate; and
    a plurality of light emitting elements on the plurality of pixel electrodes,
    wherein each of the plurality of light emitting elements comprises a first semiconductor layer, a second semiconductor layer, and an active layer between the first semiconductor layer and the second semiconductor layer,
    wherein one or more of the plurality of light emitting elements comprise a capping layer in the active layer, and another one of the plurality of light emitting elements does not comprise the capping layer in the active layer, and
    wherein the capping layer comprises AlGaN.

2. The display device of claim 1, wherein the active layer comprises a well layer and a barrier layer stacked alternately with each other, and the capping layer is between the well layer and the barrier layer.

3. The display device of claim 2, wherein the capping layer contacts an upper surface of the well layer and a lower surface of the barrier layer.

4. The display device of claim 2, wherein the capping layer contacts a lower surface of the well layer and an upper surface of the barrier layer.

5. The display device of claim 2, wherein the capping layer comprises a plurality of capping layers, and the plurality of capping layers are spaced apart from each other with the well layer between adjacent ones of the plurality of capping layers, and each of the adjacent ones of the plurality of capping layers contacts the well layer.

6. The display device of claim 1, wherein the plurality of light emitting elements comprise a first light emitting element not comprising the capping layer and a second light emitting element and a third light emitting element, each comprising the capping layer, and
    wherein the first light emitting element is configured to emit blue light, the second light emitting element is configured to emit green light, and the third light emitting element is configured to emit red light.

7. The display device of claim 6, wherein an aluminum content of the capping layer in the second light emitting element is smaller than the aluminum content of the capping layer in the third light emitting element.

8. The display device of claim 6, wherein a number of the capping layers in the second light emitting element is smaller than a number of the capping layers in the third light emitting element.

9. The display device of claim 6, wherein a thickness of the capping layer in the second light emitting element is smaller than a thickness of the capping layer in the third light emitting element.

10. The display device of claim 1, wherein each of the plurality of light emitting elements further comprises:
    an electron blocking layer between the first semiconductor layer and the active layer, and
    a superlattice layer between the active layer and the second semiconductor layer.

11. The display device of claim 1, wherein the second semiconductor layer is a common layer continuously connected to the light emitting elements.

12. The display device of claim 1, wherein each of the plurality of light emitting elements comprises a connection electrode connected to the first semiconductor layer, and
    wherein the connection electrode is further connected to each of the plurality of pixel electrodes.

13. A display device comprising:
    a plurality of pixel electrodes on a substrate; and
    a first light emitting element, a second light emitting element, and a third light emitting element on the plurality of pixel electrodes and configured to emit light of different colors,
    wherein each of the first light emitting element, the second light emitting element, and the third light emitting element comprises a first semiconductor layer, a second semiconductor layer, and an active layer between the first semiconductor layer and the second semiconductor layer, and each of the active layer of the second light emitting element and the active layer of the third light emitting element comprises a capping layer, and
    wherein the capping layer of the second light emitting element and the capping layer of the third light emitting element have different compositions.

14. The display device of claim 13, wherein the capping layer comprises AlGaN, and an aluminum content of the capping layer of the second light emitting element is smaller than the aluminum content of the capping layer of the third light emitting element.

15. The display device of claim 13, wherein the first light emitting element is configured to emit blue light, the second light emitting element is configured to emit green light, and the third light emitting element is configured to emit red light, and
    wherein the active layer of the first light emitting element does not comprise the capping layer.

16. The display device of claim 13, wherein a number of the capping layers in the second light emitting element is smaller than a number of the capping layers in the third light emitting element.

17. A display device comprising:
    a plurality of pixel electrodes on a substrate; and
    a first light emitting element, a second light emitting element, and a third light emitting element on the plurality of pixel electrodes and configured to emit light of different colors,
    wherein each of the first light emitting element, the second light emitting element, and the third light emitting element comprises a first semiconductor layer, a second semiconductor layer, and an active layer between the first semiconductor layer and the second semiconductor layer, and each of the active layer of the second light emitting element and the active layer of the third light emitting element comprises a capping layer, and wherein a thickness of the capping layer of the second light emitting element is different from a thickness of the capping layer of the third light emitting element.

18. The display device of claim 17, wherein the capping layer comprises a semiconductor material having a chemical formula of $Al_xGa_yIn_{1-x-y}N$, wherein $0 \leq x \leq 1$, $0 \leq y \leq 1$, and $0 \leq x+y \leq 1$.

19. The display device of claim 18, wherein the capping layer comprises AlGaN, and the capping layer of the second light emitting element and the capping layer of the third light emitting element have the same composition.

20. The display device of claim 17, wherein a number of the capping layers in the second light emitting element is equal to a number of the capping layers in the third light emitting element.

* * * * *